(12) United States Patent
Nishijima et al.

(10) Patent No.: US 6,313,700 B1
(45) Date of Patent: Nov. 6, 2001

(54) POWER AMPLIFIER AND COMMUNICATION UNIT

(75) Inventors: Masaaki Nishijima, Osaka; Taketo Kunihisa, Neyagawa; Osamu Ishikawa, Kyoto, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/607,424

(22) Filed: Jun. 29, 2000

Related U.S. Application Data

(62) Division of application No. 08/849,355, filed as application No. PCT/JP96/02770 on Sep. 25, 1996, now Pat. No. 6,111,459.

(30) Foreign Application Priority Data

Sep. 29, 1995 (JP) .................................... 7-253204
Jan. 16, 1996 (JP) .................................... 8-004548

(51) Int. Cl.[7] .................................................. H03G 3/30
(52) U.S. Cl. .................. 330/51; 455/126; 330/124 D; 330/124 R; 330/295; 330/302; 330/129
(58) Field of Search ........................... 455/126; 330/51, 330/129, 295, 302, 124 D, 124 R

(56) References Cited

U.S. PATENT DOCUMENTS

| | | | |
|---|---|---|---|
| 3,304,507 | 2/1967 | Weeks et al. | 328/151 |
| 4,494,077 | 1/1985 | Fukaya et al. | 330/295 |
| 4,598,252 | * | 7/1986 | Andricos | 330/51 |
| 4,794,347 | 12/1988 | Muramoto | 330/51 |
| 5,592,122 | * | 1/1997 | Masahiro et al. | 330/286 |

FOREIGN PATENT DOCUMENTS

| | | |
|---|---|---|
| 0481825 | 4/1992 | (EP) . |
| 0136157 | 10/1979 | (JP) . |
| 2105636 | 4/1990 | (JP) . |
| 5-48493 | 2/1993 | (JP) . |
| 6350484 | 12/1994 | (JP) . |
| 7162252 | 6/1995 | (JP) . |
| 8-88524 | 4/1996 | (JP) . |

OTHER PUBLICATIONS

International Search Report for Application No. PCT/JP96/02770; Mailed Jan. 28, 1997.
Search Report for Application No. 96931987.0–2214–JP9602270; Dated Oct. 22, 1998.

* cited by examiner

*Primary Examiner*—Michael B Shingleton
(74) *Attorney, Agent, or Firm*—Renner, Otto, Boisselle & Sklar, LLP

(57) ABSTRACT

A power amplifier including: a first amplifier PA2 having an input terminal and an output terminal; a passive circuit PC3 having an input terminal and an output terminal; and a first switch SW2 having a single-pole terminal and two multi-throw terminals, one of the multi-throw terminals of the first switch SW2 being connected to the input terminal of the first amplifier PA2 and the other of the multi-throw terminals of the first switch SW2 being connected to the input terminal of the passive circuit PC3. This makes it possible to provide a power amplifier and a communication unit which can be operated with different frequencies, output powers or modulation types.

44 Claims, 25 Drawing Sheets (a)

(b)

(a)

(b)

(a)

(b)

(c)

(d)

(a)

(b)

(c)

(d)

(a)

(b)

(c)

(a)

(b)

POWER AMPLIFIER AND COMMUNICATION UNIT

This is a division of application Ser. No. 08/849,355, filed Oct. 8, 1997 now U.S. Pat. No. 6,111,459, which is a 371 PCT/JP96/02770 filed Sep. 25, 1996.

TECHNICAL FIELD

The present invention relates to a power amplifier and a communication unit which process signals; at least one of the frequencies, the output powers and the modulation types of which are different from each other; and more particularly relates to a power amplifier and a communication unit having at least one switch.

BACKGROUND ART

In recent years, various kinds of information communication units, such as cellular phone units and portable information terminals, have been developed or have just started to be commercialized all over the world. Each of these information communication units operates based on its unique system. Thus, the frequency bands, the output powers and the modulation types are different from each other among these systems. Consequently, transmission power amplifiers adapted for the respective systems have been developed and integrated into the terminals.

In Japan, two types of communication methods are utilized for automobile radiotelephone units and cellular phone units, i.e., an analog type FM (frequency modulation) type and a digital type π/4 shift DQPSK (differential quadrature phase shift keying) type. Both of the analog and the digital types are assigned to the frequency band of 800 MHz, while only the digital type is assigned to the 1.5 GHz band. Furthermore, a cellular phone called "PHS" (personal handy-phone system) is for a digital type π/4 shift DQPSK type and the 1.9 GHz band. The output power of automobile radiotelephone units and cellular phone units is on the order of 1 W. whereas that of cellular phones is on the order of 10 mW. Since the former phone units have a cell radius of several kilometers and a hand-over function, the phone units of the former type can be used for communication even during travel in an automobile or the like. On the other hand, the phone units of the latter type have a cell radius of several hundreds of meters and have been developed by such an approach as to utilize conventional indoor-use cordless phone units for outdoor use. Furthermore, though the 2.4 GHz band, i.e., the ISM (Industrial Scientific Medical) band, has been globally assigned to industrial, scientific and medical applications, it is also under consideration to apply the ISM band to wireless LANs (local area networks) within offices, factories or various kinds of sites in accordance with the spread spectrum (SS) type so as to comply with the standard in which the output power is 10 mW/MHz (frequency band: 26 MHz). As can be seen from these tendencies, information communication units, which can be used anywhere at any time, will surely be popular for use in daily life in the near future.

Conventionally, a transmission power amplifier satisfying the desired frequency band and the desired output power is integrated into the corresponding terminal depending upon which of these types the terminal is based on. Thus, a user has been required either to have terminals of different types corresponding to the domestic service areas and applications, or to buy an expensive, large-sized terminal compatible with several different types for itself.

FIG. 35 is a block diagram of a conventional example. This conventional example is a multi-stage power amplifier for transmitting two different radio frequency (RF) signals having different frequency bands and output powers, in which two banks of power amplifiers corresponding to the respective frequency bands are used.

A first power amplifier PA1 includes: a first input matching circuit PA104; a first GaAs MESFET PA101; a first inter-stage matching circuit PA105; a second GaAs MESFET PA102; a second inter-stage matching circuit PA106; a third GaAs MESFET PA103; and a first output matching circuit PA107.

A second power amplifier PA2 includes: a second input matching circuit PA204; a fourth GaAs MESFET PA201; a third inter-stage matching circuit PA205; a fifth GaAs MESFET PA202; a fourth inter-stage matching circuit PA206; a sixth GaAs MESFET PA203; and a second output matching circuit PA207.

The power amplifier of this conventional example is surely compatible with different output powers, modulation types and frequency bands, but requires a larger number of components for a single configuration. Thus, such a power amplifier is contrary to the recent requirement of downsizing a terminal and adversely increases the costs thereof.

FIG. 36 is a simplified circuit diagram of a radio frequency (RF) integrated circuit described in Japanese Laid-Open Patent Publication No. 8-88524 which was laid open (laid-open publication date: Apr. 2, 1996) posterior to the priority date of the present application. This patent publication relates to an RF integrated circuit including an amplifier operating in both of analog and digital types. As shown in FIG. 36, the drain 3604 of an FET 3601 on the last stage of the amplifier is connected to the input terminal of an analog type output matching circuit PC1 and the input terminal of a digital type output matching circuit PC2 via a switch SW1. The output terminal of the analog type output matching circuit PC1 and the output terminal of the digital type output matching circuit PC2 are connected to an output terminal 3605 via a switch SW2. By switching the output matching circuits PC1 and PC2 and selecting one of them via the switches, the operation corresponding to each type can be performed.

FIG. 37 shows a graph (a) showing the variations in distortion D and power added efficiency q (i.e., the ratio of the difference between the input RF power and the output RF power with respect to the DC power supplied to an amplifier) with respect to an input power Pin and a graph (b) showing the variation in output power Pout with respect to the input power Pin.

FIG. 38 is a graph showing the input power dependences of the output matching circuits PC1 and PC2. The axis of the abscissas indicates the input power Pin, while the axis of the ordinates indicates the output power Pout. Moreover, Pn denotes a nominal output power. In the region where the output power varies linearly with respect to the input power, the distortion and the power added efficiency are low. On the other hand, in the region where the output power varies non-linearly with respect to a higher input power, the distortion and the power added efficiency become high. In view of these characteristics, PC1 for the analog type and PC2 for the digital type of the power amplifier are configured so as to have the RF power input/output characteristics shown in FIG. 38. More specifically, in operation, PC1 for the analog type does not require the linearity of the output power with respect to the input power and is configured so as to have a high power added efficiency (i.e., subjected to an efficiency matching). On the other hand, PC2 for the digital type is configured so as to ensure the linearity of the output power with respect to the input power (i.e., subjected to a distortion matching) such that a distortion is not generated in an RF signal passing through the amplifier during the operation. Then, the power added efficiency thereof becomes lower than that of the analog type.

Examining the disclosure of Japanese Laid-Open Patent Publication No. 8-88524, the integrated circuit described therein can be regarded as being compatible with the analog and the digital signals in the same frequency band (900 MHz) and with the same output power. Thus, in the above-described integrated circuit, the output matching circuits PC1 and PC2 thereof are subjected to an impedance matching such that the loss of a transmitted signal is minimized with respect to the same frequency band. Therefore, in the case of transmitting RF signals in different frequency bands, the impedances cannot be matched with each other, thereby increasing the loss. As a result, the integrated circuit has a problem in that a desired output power and a desired distortion cannot be obtained in such a case. Furthermore, assume that the output powers are different from each other (e.g., a power on the order of 1 W and a power on the order of 100 mW are processed by PC1 and PC2, respectively). Then, in order to output a power on the order of 100 mW by using an active element capable of outputting a power on the order of 1 W, a mechanism for controlling the input power of the FET is indispensable. If the active element is operated on the order of 100 mW by reducing the input power under such a control mechanism, then the power added efficiency is extremely decreased as compared with the operation on the order of 1 W, thereby adversely increasing the power consumption. As a result, when an information communication unit is driven by a battery, the longevity of the battery is disadvantageously shortened. In addition, such a power amplifier is not compatible with RF signals, the frequencies and the output powers of which are both different from each other. Furthermore, in case where such a power amplifier is used as an integrated part of an information communication unit having transmission and reception functions, some selection means for switching a signal to be transmitted by the power amplifier and a signal received via an antenna is required to be provided. Nevertheless, this point is not referred to in the above-cited patent publication. In other words, the correlation between the transmission function of a power amplifier for switching the output matching circuits in accordance with the analog and the digital types and the transmission/reception functions of an information communication unit is not mentioned in the above-cited patent publication.

In view of these problems, the present invention has objectives of providing a power amplifier which is commonly applicable to different systems used for various kinds of information communication units (i.e., the systems having different frequency bands, output powers to be transmitted and modulation types) and can be formed in a reduced size at lower costs, and providing a highly value-added communication unit by using such a power amplifier.

DISCLOSURE OF THE INVENTION

According to the present invention, a power amplifier is provided. The power amplifier includes: a first amplifier having an input terminal and an output terminal; a passive circuit having an input terminal and an output terminal; and a first switch having a single-pole terminal and two multi-throw terminals. In the power amplifier, one of the multi-throw terminals of the first switch is connected to the input terminal of the first amplifier and the other of the multi-throw terminals of the first switch is connected to the input terminal of the passive circuit.

In one embodiment, the power amplifier further includes a second switch having a single-pole terminal and two multi-throw terminals. One of the multi-throw terminals of the second switch is connected to the output terminal of the first amplifier and the other of the multi-throw terminals of the second switch is connected to the output terminal of the passive circuit.

In another embodiment, the first amplifier includes discrete components.

In still another embodiment, the power amplifier further includes a second amplifier having an input terminal and an output terminal. The single-pole terminal of the first switch is connected to the output terminal of the second amplifier.

In still another embodiment, a 3 dB band width of the second amplifier includes a range from about 800 MHz to about 2.5 GHz.

In still another embodiment, gain characteristics of the second amplifier include at least two peaks.

In still another embodiment, a first band which is a frequency range corresponding to a range from a first gain at a first peak of the gain characteristics of the second amplifier to −3 dB of the first gain, includes 1.5 GHz and, a second band which is a frequency range corresponding to a range from a second gain at a second peak of the gain characteristics of the second amplifier to −3 dB of the second gain, includes 1.9 GHz.

In still another embodiment, a first band which is a frequency range corresponding to a range from a first gain at a first peak of the gain characteristics of the second amplifier to −3 dB of the first gain, includes 900 MHz and, a second band which is a frequency range corresponding to a range from a second gain at a second peak of the gain characteristics of the second amplifier to −3 dB of the second gain, includes 1.9 GHz.

In still another embodiment, the first switch and the second amplifier are formed on one and the same semiconductor substrate.

In still another embodiment, the passive circuit is formed on the semiconductor substrate.

In still another embodiment, the power amplifier further includes a power supply controller for controlling a power to be supplied to the first amplifier in response to switching of the first switch.

In still another embodiment, the first amplifier receives, amplifies and then outputs an analog signal and the passive circuit receives and outputs a digital signal.

In still another embodiment, the first amplifier receives and outputs a first digital signal and the passive circuit receives and outputs a second digital signal.

In still another embodiment, the first amplifier receives and outputs a signal having a first frequency and the passive circuit receives and outputs a signal having a second frequency, the first frequency and the second frequency being different from each other.

In still another embodiment, the first amplifier outputs a signal having a first output power, the passive circuit outputs a signal having a second output power and a ratio of the first output power to the second output power is equal to larger than 5.

According to another aspect of the present invention, a communication unit is provided. The communication unit includes: a first amplifier having an input terminal and an output terminal; a passive circuit having an input terminal and an output terminal; a first switch having a single-pole terminal and two multi-throw terminals; a second switch having a single-pole terminal and two multi-throw terminals; a third switch having a single-pole terminal and two multi-throw terminals; a front end circuit; and an antenna. In the communication unit, one of the multi-throw terminals of the first switch is connected to the input terminal of the first amplifier and the other of the multi-throw terminals of the first switch is connected to the input terminal of the passive circuit. One of the multi-throw terminals of the second switch is connected to the output terminal of the first amplifier and the other of the multi-throw terminals of the second switch is connected to the output terminal of the passive circuit. One of the multi-throw terminals of the third switch is connected to the single-pole terminal of the second switch, the other of the multi-throw terminals of the third switch is connected to the front end circuit and the single-pole terminal of the third switch is connected to the antenna.

According to still another aspect of the present invention, a communication unit is provided. The communication unit includes: a first amplifier having an input terminal and an output terminal; a passive circuit having an input terminal and an output terminal; a first switch having a single-pole terminal and two multi-throw terminals; a first antenna; and a second antenna. One of the multi-throw terminals of the first switch is connected to the input terminal of the first amplifier and the other of the multi-throw terminals of the first switch is connected to the input terminal of the passive circuit. The output terminal of the first amplifier is connected to the first antenna and the output terminal of the second amplifier is connected to the second antenna.

According to still another aspect of the present invention, a power amplifier is provided. The power amplifier includes: a first amplifier having an input terminal and an output terminal; a second amplifier having an input terminal and an output terminal; and a first switch having a single-pole terminal and two multi-throw terminals. One of the multi-throw terminals of the first switch is connected to the input terminal of the first amplifier and the other of the multi-throw terminals of the first switch is connected to the input terminal of the second amplifier.

In one embodiment, the power amplifier further includes a second switch having a single-pole terminal and two multi-throw terminals. One of the multi-throw terminals of the second switch is connected to the output terminal of the first amplifier and the other of the multi-throw terminals of the second switch is connected to the output terminal of the second amplifier.

In another embodiment, the first amplifier and the second amplifier include discrete components.

In still another embodiment, the single-pole terminal of the first switch is connected to an output terminal of a third amplifier.

In still another embodiment, a 3 dB band width of the third amplifier includes a range from about 800 MHz to about 2.5 GHz.

In still another embodiment, gain characteristics of the third amplifier include at least two peaks.

In still another embodiment, a first band which is a frequency range corresponding to a range from a first gain at a first peak of the gain characteristics of the third amplifier to −3 dB of the first gain, includes 1.5 GHz and, a second band which is a frequency range corresponding to a range from a second gain at a second peak of the gain characteristics of the third amplifier to −3 dB of the second gain, includes 1.9 GHz.

In still another embodiment, a first band which is a frequency range corresponding to a range from a first gain at a first peak of the gain characteristics of the third amplifier to −3 dB of the first gain, includes 900 MHz and, a second band which is a frequency range corresponding to a range from a second gain at a second peak of the gain characteristics of the third amplifier to −3 dB of the second gain, includes 1.9 GHz.

In still another embodiment, at least two of the first switch, the second switch, the first amplifier, the second amplifier and the third amplifier are formed on one and the same semiconductor substrate.

In still another embodiment, the second amplifier is formed on the semiconductor substrate.

In still another embodiment, the power amplifier further includes a power supply controller for controlling a power to be supplied to at least one of the first amplifier and the second amplifier in response to switching of the first switch.

In still another embodiment, the first amplifier receives, amplifies and then outputs an analog signal and the second amplifier receives, amplifies and then outputs a digital signal.

In still another embodiment, the first amplifier receives and outputs a first digital signal and the second amplifier receives and outputs a second digital signal.

In still another embodiment, the first amplifier receives and outputs a signal having a first frequency and the second amplifier receives and outputs a signal having a second frequency, the first frequency and the second frequency being different from each other.

In still another embodiment, the first amplifier outputs a signal having a first output power, the second amplifier outputs a signal having a second output power and a ratio of the first output power to the second output power is equal to larger than 5.

According to still another aspect of the present invention, a communication unit is provided. The communication unit includes: a first amplifier having an input terminal and an output terminal; a second amplifier having an input terminal and an output terminal; a first switch having a single-pole terminal and two multi-throw terminals; a second switch having a single-pole terminal and two multi-throw terminals; a third switch having a single-pole terminal and two multi-throw terminals; a front end circuit; and an antenna. One of the multi-throw terminals of the first switch is connected to the input terminal of the first amplifier and the other of the multi-throw terminals of the first switch is connected to the input terminal of the second amplifier. One of the multi-throw terminals of the second switch is connected to the output terminal of the first amplifier and the other of the multi-throw terminals of the second switch is connected to the output terminal of the second amplifier. One of the multi-throw terminals of the third switch is connected to the single-pole terminal of the second switch, the other of the multi-throw terminals of the third switch is connected to the front end circuit and the single-pole terminal of the third switch is connected to the antenna.

According to still another aspect of the present invention, a communication unit is provided. The communication unit includes: a first amplifier having an input terminal and an output terminal; a second amplifier having an input terminal and an output terminal; a first switch having a single-pole terminal and two multi-throw terminals; a first antenna; and a second antenna. One of the multi-throw terminals of the first switch is connected to the input terminal of the first amplifier and the other of the multi-throw terminals of the first switch is connected to the input terminal of the second amplifier. The output terminal of the first amplifier is connected to the first antenna and the output terminal of the second amplifier is connected to the second antenna.

According to still another aspect of the present invention, a power amplifier is provided. The power amplifier includes: a first passive circuit having an input terminal and an output terminal; a second passive circuit having an input terminal and an output terminal; a first switch having a single-pole terminal and two multi-throw terminals; and an amplifier having an input terminal and an output terminal. One of the multi-throw terminals of the first switch is connected to the input terminal of the first passive circuit, the other of the multi-throw terminals of the first switch is connected to the input terminal of the second passive circuit and the output terminal of the amplifier is connected to the single-pole terminal of the first switch.

In one embodiment, the power amplifier further includes a second switch having a single-pole terminal and two multi-throw terminals. One of the multi-throw terminals of the second switch is connected to the output terminal of the first passive circuit and the other of the multi-throw terminals of the second switch is connected to the output terminal of the second passive circuit.

In another embodiment, the amplifier includes discrete components.

In still another embodiment, a 3 dB band width of the amplifier includes a range from about 800 MHz to about 2.5 GHz.

In still another embodiment, gain characteristics of the amplifier include at least two peaks.

In still another embodiment, a first band which is a frequency range corresponding to a range from a first gain at a first peak of the gain characteristics of the amplifier to −3 dB of the first gain, includes 1.5 GHz and, a second band which is a frequency range corresponding to a range from a second gain at a second peak of the gain characteristics of the amplifier to −3 dB of the second gain, includes 1.9 GHz.

In still another embodiment, a first band which is a frequency range corresponding to a range from a first gain at a first peak of the gain characteristics of the amplifier to −3 dB of the first gain, includes 900 MHz and, a second band which is a frequency range corresponding to a range from a second gain at a second peak of the gain characteristics of the amplifier to −3 dB of the second gain, includes 1.9 GHz.

In still another embodiment, the first switch and the amplifier are formed on one and the same semiconductor substrate.

In still another embodiment, at least one of the first passive circuit and the second passive circuit is formed on the semiconductor substrate.

In still another embodiment, the first passive circuit receives and outputs an analog signal and the second passive circuit receives and outputs a digital signal.

In still another embodiment, the first passive circuit receives and outputs a first digital signal and the second passive circuit receives and outputs a second digital signal.

In still another embodiment, the first passive circuit receives and outputs a signal having a first frequency and the second passive circuit receives and outputs a signal having a second frequency, the first frequency and the second frequency being different from each other.

In still another embodiment, the first frequency is higher than the second frequency.

According to still another aspect of the present invention, a communication unit is provided. The communication unit includes: a first passive circuit having an input terminal and an output terminal; a second passive circuit having an input terminal and an output terminal; a first switch having a single-pole terminal and two multi-throw terminals; a second switch having a single-pole terminal and two multi-throw terminals; a third switch having a single-pole terminal and two multi-throw terminals; a front end circuit; and an antenna. One of the multi-throw terminals of the first switch is connected to the input terminal of the first passive circuit and the other of the multi-throw terminals of the first switch is connected to the input terminal of the second passive circuit. One of the multi-throw terminals of the second switch is connected to the output terminal of the first passive circuit and the other of the multi-throw terminals of the second switch is connected to the output terminal of the second passive circuit. One of the multi-throw terminals of the third switch is connected to the single-pole terminal of the second switch, the other of the multi-throw terminals of the third switch is connected to the front end circuit and the single-pole terminal of the third switch is connected to the antenna.

According to still another aspect of the present invention, a communication unit is provided. The communication unit includes: a first passive circuit having an input terminal and an output terminal; a second passive circuit having an input terminal and an output terminal; a first switch having a single-pole terminal and two multi-throw terminals; a first antenna; and a second antenna. One of the multi-throw terminals of the first switch is connected to the input terminal of the first passive circuit and the other of the multi-throw terminals of the first switch is connected to the input terminal of the second passive circuit. The output terminal of the first passive circuit is connected to the first antenna and the output terminal of the second passive circuit is connected to the second antenna.

In one embodiment, the power amplifier further includes: a third passive circuit having an input terminal and an output terminal; a fourth passive circuit having an input terminal and an output terminal; a second switch having a single-pole terminal and two multi-throw terminals; and a third switch having a single-pole terminal and two multi-throw terminals. One of the multi-throw terminals of the second switch is connected to the input terminal of the third passive circuit and the other of the multi-throw terminals of the second switch is connected to the input terminal of the fourth passive circuit. One of the multi-throw terminals of the third switch is connected to the output terminal of the third passive circuit and the other of the multi-throw terminals of the third switch is connected to the output terminal of the fourth passive circuit.

In another embodiment, the power amplifier further includes a fourth switch having a single-pole terminal and two multi-throw terminals. One of the multi-throw terminals of the fourth switch is connected to the output terminal of the first passive circuit and the other of the multi-throw terminals of the fourth switch is connected to the output terminal of the second passive circuit.

According to still another aspect of the present invention, a communication unit is provided. The communication unit includes: a first passive circuit having an input terminal and an output terminal; a second passive circuit having an input terminal and an output terminal; a third passive circuit having an input terminal and an output terminal; a fourth passive circuit having an input terminal and an output terminal; a first switch having a single-pole terminal and two multi-throw terminals; a second switch having a single-pole terminal and two multi-throw terminals; a third switch having a single-pole terminal and two multi-throw terminals; a fourth switch having a single-pole terminal and two multi-throw terminals; a fifth switch having a single-pole terminal and two multi-throw terminals; an amplifier having an input terminal and an output terminal; a front end circuit; and an antenna. One of the multi-throw terminals of the first switch is connected to the input terminal of the first passive circuit, the other of the multi-throw terminals of the first switch is connected to the input terminal of the second passive circuit and the output terminal of the amplifier is connected to the single-pole terminal of the first switch. One of the multi-throw terminals of the second switch is connected to the input terminal of the third passive circuit and the other of the multi-throw terminals of the second switch is connected to the input terminal of the fourth passive circuit. One of the multi-throw terminals of the third switch is connected to the output terminal of the third passive circuit and the other of the multi-throw terminals of the third switch is connected to the output terminal of the fourth passive circuit. One of the multi-throw terminals of the fourth switch is connected to the output terminal of the first passive circuit and the other of the multi-throw terminals of the fourth switch is connected to the output terminal of the second passive circuit. One of the multi-throw terminals of the fifth switch is connected to the single-pole terminal of the fourth switch, the other of the multi-throw terminals of the fifth switch is connected to the front end circuit and the single-pole terminal of the fifth switch is connected to the antenna.

According to still another aspect of the present invention, a communication unit is provided. The communication unit includes: a first passive circuit having an input terminal and an output terminal; a second passive circuit having an input terminal and an output terminal; a third passive circuit having an input terminal and an output terminal; a fourth passive circuit having an input terminal and an output terminal; a first switch having a single-pole terminal and two multi-throw terminals; a second switch having a single-pole terminal and two multi-throw terminals; a third switch having a single-pole terminal and two multi-throw terminals; an amplifier having an input terminal and an output terminal; a first antenna; and a second antenna. One of the multi-throw terminals of the first switch is connected to the input terminal of the first passive circuit, the other of the multi-throw terminals of the first switch is connected to the input terminal of the second passive circuit and the output terminal of the amplifier is connected to the single-pole terminal of the first switch. One of the multi-throw terminals of the second switch is connected to the input terminal of the third passive circuit and the other of the multi-throw terminals of the second switch is connected to the input terminal of the fourth passive circuit. One of the multi-throw terminals of the third switch is connected to the output terminal of the third passive circuit and the other of the multi-throw terminals of the third switch is connected to the output terminal of the fourth passive circuit. The output terminal of the first passive circuit is connected to the first antenna and the output terminal of the second passive circuit is connected to the second antenna.

Thus, the invention described herein makes possible the advantages of providing a power amplifier which is commonly applicable to different systems (i.e., the systems having different frequency bands, output powers to be transmitted and modulation types) and can be formed in a reduced size at lower costs, and providing a highly value-added communication unit by using such a power amplifier.

BRIEF DESCRIPTION OF THE DRAWINGS

This invention may be better understood and its numerous objects and advantages will become apparent to those skilled in the art by reference to the accompanying drawings as follows.

BEST MODE FOR CARRYING OUT THE INVENTION

Figure 1:
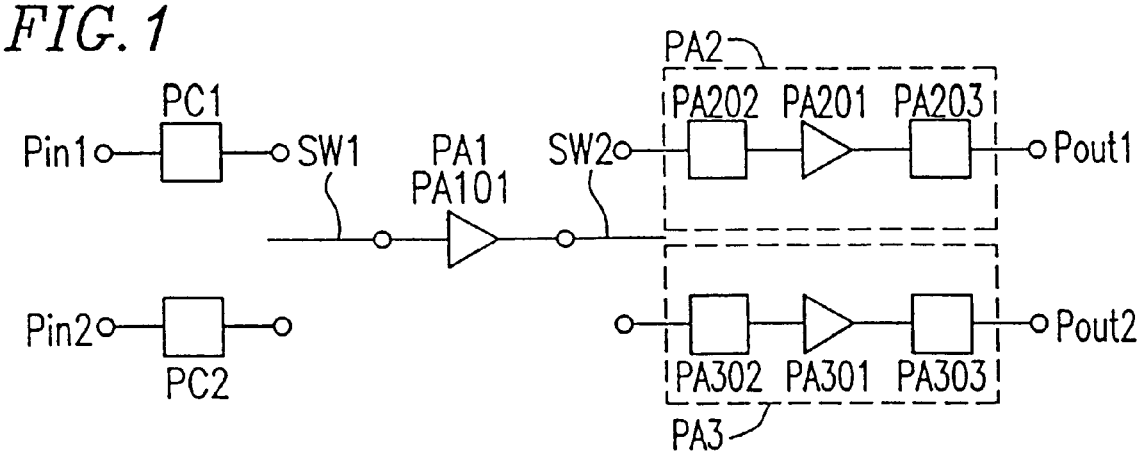
FIG. 1 is a configuration diagram illustrating the first example of the switchable power amplifier according to the present invention.

Hereinafter, the examples of the present invention will be described with reference to the accompanying drawings, in which the same reference numerals denote the same components.

In this specification, a "switch" without any modifier means a "single-pole-multi-throw switch" unless specifically stated otherwise. A switch in the present specification includes a single-pole terminal and two multi-throw terminals. On the other hand, a "power amplifier" and a "communication unit" in this specification respectively include a switchable power amplifier and a switching information communication unit, as will be described later.

EXAMPLE 1

The switchable power amplifier according to the present invention has a function of transmitting RF signals having two different frequencies and two different output powers by temporally synchronizing the switching of two switches.

The switchable power amplifier of this example can output the RF signals for Modes 1 and 2 shown in the following table. In Mode 1, the transmission frequency f=f1 and the output power Pout=Pout1. On the other hand, in Mode 2, the transmission frequency f=f2 and the output power Pout=Pout2. The communication types and the modulation types in Modes 1 and 2 are as shown in the following table.

| | f | Pout | Communication type |
|---|---|---|---|
| Mode 1 | f1 | 1.9 GHz | Pout1 | 22 dBm | Digital Modulation |
| Mode 2 | f2 | 2.4 GHz | Pout2 | 26 dBm | Digital Modulation |

Mode 1: π/4 shift DQPSK modulation type
Mode 2: spread spectrum (SS) QPSK modulation type FIG. 1 is a configuration diagram showing the first example of the switchable power amplifier according to the present invention.

A first single-pole-dual-throw switch SW1, a first input matching circuit PC1 for Mode 1 and a second input matching circuit PC2 for Mode 2 are connected to the input side of a first power amplifier PA1. On the other hand, a second single-pole-dual-throw switch SW2, a second power amplifier PA2 for Mode 1 and a third power amplifier PA3 for Mode 2 are connected to the output side of the first power amplifier PA1.

In Mode 1, the switch SW1 connects the output terminal of the input matching circuit PC1 to the input terminal of the power amplifier PA1 and the switch SW2 connects the output terminal of the power amplifier PA1 to the input terminal of the power amplifier PA2. On the other hand, in Mode 2, the switch SW1 connects the output terminal of the input matching circuit PC2 to the input terminal of the power amplifier PA1 and the switch SW2 connects the output terminal of the power amplifier PA1 to the input terminal of the power amplifier PA3. As a result, an RF signal in Mode 1 is received at an input terminal Pin1 and output through an output terminal Pout1. On the other hand, an RF signal in Mode 2 is received at an input terminal Pin2 and output through an output terminal Pout2.

The first power amplifier PA1 includes a first GaAs MESFET (GaAs metal-semiconductor FET) PA101. The second power amplifier PA2 includes: a second GaAs MESFET PA201; a first inter-stage matching circuit PA202; and a first output matching circuit PA203. The third power amplifier PA3 includes: a third GaAs MESFET PA301; a second inter-stage matching circuit PA302; and a second output matching circuit PA303.

The first, second and third GaAs MESFETs PA101, PA201 and PA301 included in the first, second and third power amplifiers PA1, PA2 and PA3 are of a depletion type and have gate widths (Wg) of 1 mm, 4 mm and 8 mm, respectively.

The first and the second GaAs MESFETs PA101 and PA201 having Wg of 1 mm and 4 mm, respectively, are mounted in resin-molded packages, while the third GaAs MESFET PA301 having Wg of 8 mm is mounted in a ceramic package (i.e., mounted on a ceramic carrier and then sealed with a resin).

Each of the first and the second single-pole-dual-throw switches SW1 and SW2 may be implemented as a circuit using a PIN diode (i.e., a circuit including a resin-molded PIN diode and peripheral circuits of the PIN diode such as a capacitor for cutting DC and a choke coil having a resistance component and an inductance component) or as an integrated circuit using a GaAs MESFET (i.e., a circuit formed by integrating a GaAs MESFET with peripheral components thereof and molding them with a resin).

The operating power supply voltages of the first, second and third GaAs MESFETs PA101, PA201 and PA301 are as follows. Specifically, the drain voltages thereof are about 3.5 V and the gate voltages thereof are negative voltages in the range from about −2.0 V to about −3.0 V. The first GaAs MESFET PA101 is operated while paying much respect to the gain thereof and the second and the third GaAs MESFETs PA201 and PA301 are operated in a class AB (with an idle current corresponding to about 10% of Idss) while paying much respect to the linearity of the input/output characteristics and the digital distortion characteristics thereof. "Idss" herein refers to a drain-source current in the state where the gate and the source are short-circuited (i.e., at the time of zero bias). The first, second and third GaAs MESFETs have Idss of about 250 mA, 900 mA and 1.7 A, respectively.

In this example, the control voltages for the first and the second single-pole-dual-throw switches SW1 and SW2 are set at the two levels of 0 V/12 V in the case of a circuit using a PIN diode or at the two levels of 0 V/−4.7 V in the case of an integrated circuit using a GaAs MESFET.

The input matching circuits, the inter-stage matching circuits and the output matching circuits included in the first, second and third power amplifiers PA1, PA2 and PA3 have such functions and configurations as to satisfy the desired characteristics in accordance with frequencies, output powers and modulation types.

Figure 2:
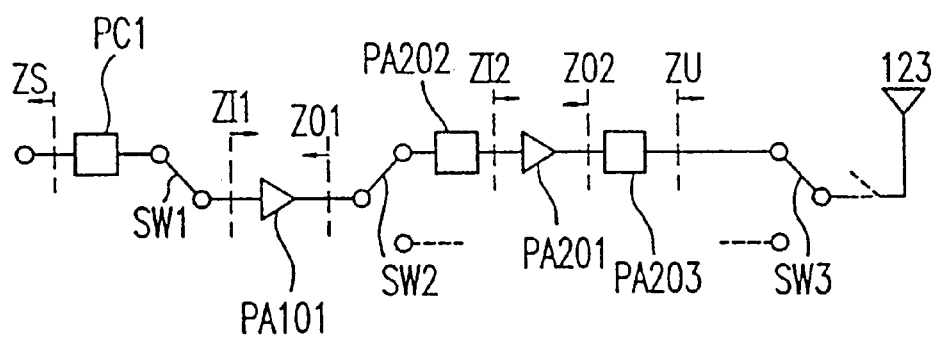
FIG. 2 is a diagram illustrating the impedances of matching circuits.

FIG. 2 is a diagram illustrating the impedances of matching circuits. The input impedances of a GaAs MESFET are different from each other at frequencies f1 and f2. Thus, the first and the second input matching circuits PC1 and PC2 equalize the impedance of a signal source Zs (in this case, a transmission RF section such as a transmission mixer section connected to an external circuit is assumed to be an impedance viewed from the switchable power amplifier) with the input impedance ZI1 of the first GaAs MESFET PA101 (i.e., performs an impedance matching therebetween) at the frequency f1 (1.9 GHz) and at the frequency f2 (2.4 GHz), respectively. As a result, an input return loss is optimized. The return loss is preferably 6 dB or more.

The first inter-stage matching circuit PA202 performs a matching such that the output impedance ZO1 of the first GaAs MESFET PA101 is equal to the input impedance ZI2 of the second GaAs MESFET PA201 at the frequency f1. The first output matching circuit PA203 performs a matching such that the output impedance ZO2 of the second GaAs MESFET PA201 is equal to a load impedance ZU on an antenna side at the frequency f1.

The second inter-stage matching circuit PA302 and the second output matching circuit PA303 also perform similar matchings at the frequency f2. The first interstage matching circuit PA202 and the first output matching circuit PA203 are loads of the first and the second GaAs MESFETs PA101 and PA201, respectively, at the frequency f1. On the other hand, the second inter-stage matching circuit PA302 and the second output matching circuit PA303 are loads of the first and the third GaAs MESFETs PA101 and PA301, respectively, at the frequency f2. These loads are important parameters determining the output characteristics (i.e., the output powers, the saturation output powers, the 1 dB compression point output powers, the linear gains, the power added efficiencies, the operational currents and the distortions (specifically, intermodulation distortions and adjacent channel leakage powers)) of the first, second and third GaAs MESFETs PA101, PA201 and PA301.

In the π/4 shift DQPSK modulation type and the spread spectrum (SS) QPSK modulation type in this example, it is important that the distortion characteristics are satisfactory.

Thus, a linear amplifier is required to be used as a power amplifier. From this point of view, in Mode 1 (1.9 GHz, 22 dBm, π/4 shift DQPSK modulated signal), the inter-stage matching circuit PA202 performs a matching such that the GaAs MESFET PA101 can secure an output power (i.e., a gain) high enough to drive the GaAs MESFET PA201. When the output power Pout1 is equal to 22 dBm, the output matching circuit PA203 suppresses a ratio of an adjacent channel leakage power to a carrier output (i.e., the ratio of a leak power at an adjacent channel frequency with respect to an output power at a carrier frequency) to a minimal level and then performs a matching so as to attain a high power added efficiency (i.e., the ratio of an input DC power to a consumed RF power).

In Mode 2 (2.4 GHz, 26 dBm, spread spectrum (SS) QPSK modulated signal), the inter-stage matching circuit PA302 performs a matching such that the GaAs MESFET PA101 can secure an output power (i.e., a gain) high enough to drive the GaAs MESFET PA301. When the output power Pout2 is equal to 26 dBm, the output matching circuit PA303 suppresses an adjacent channel leakage power and an intermodulation distortion (IMD: frequency components represented by "mfa±nfb"[where n and m are integers] caused when a plurality of different signals are amplified) to minimal levels and then performs a matching so as to attain a high power added efficiency.

In this way, the inter-stage matching circuits and the output matching circuits of the power amplifier according to the present invention can be configured so as to satisfy the desired characteristics in accordance with the frequencies, the output powers and the modulation types of RF signals.

Figure 3:
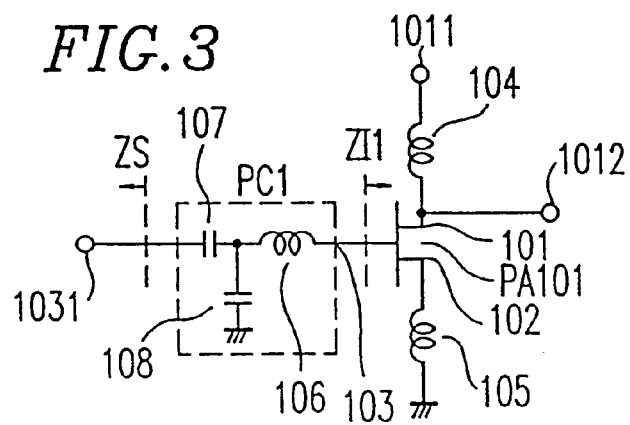
FIG. 3 is a diagram showing the equivalent circuits of an input matching circuit PC1 or PC2 and a first GaAs MESFET PA101.

FIG. 3 is a diagram showing the equivalent circuits of one of the input matching circuits PC1 or PC2 and the first GaAs MESFET PA101. The first GaAs MESFET PA101 includes a drain 101, a source 102 and a gate 103. The drain 101 is connected to a power supply terminal 1011 via a choke inductor 104. The source 102 is connected to a ground via a source inductor 105. An RF signal is input to a terminal 1031 and output through a terminal 1012. The input matching circuit PC1 can be represented by a serial inductance 106, a serial capacitance 107 and a parallel capacitance 108 which are lumped constant element components. It is noted that the equivalent circuits of each of an inter-stage matching circuit and an output matching circuit can also be represented by lumped constant element components in a similar manner. Thus, an input matching circuit, an inter-stage matching circuit or an output matching circuit can be configured as a combination of lumped constant elements other than that of the circuit shown in FIG. 3. For example, in this example, the lumped constant elements forming the matching circuit are implemented by using various chip components such as a chip inductor, a chip capacitor and a chip resistor.

Figure 4:
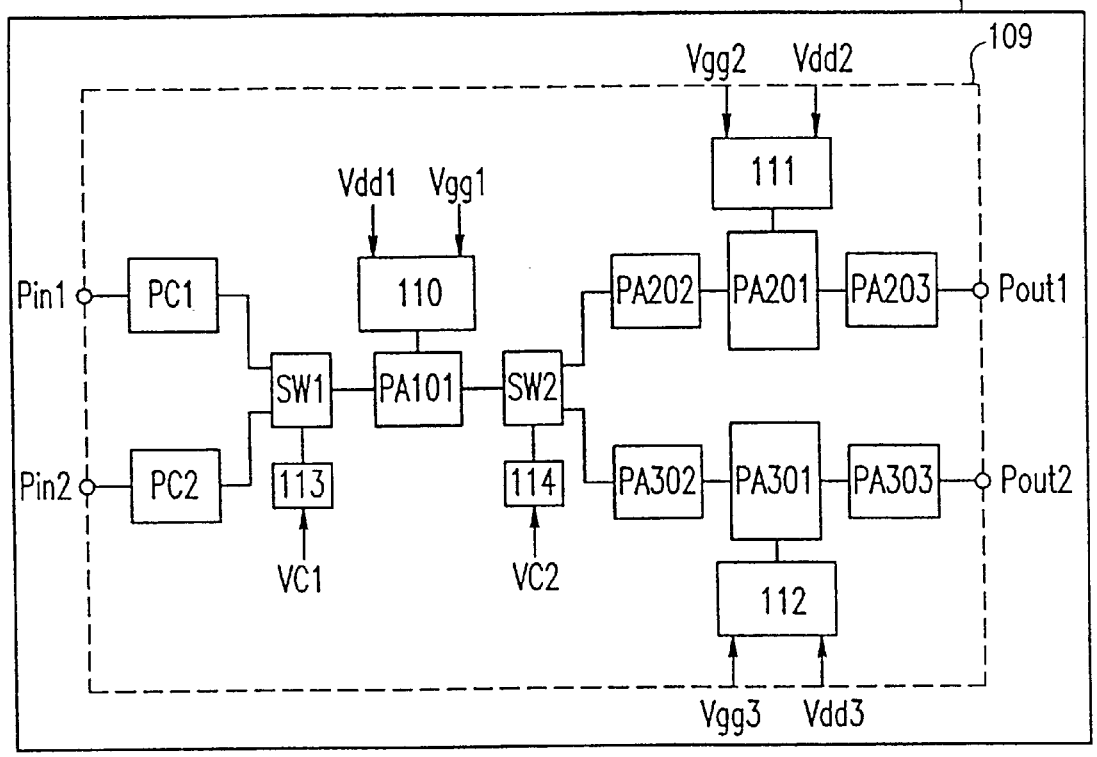
FIG. 4 is a diagram showing a specific implementation of the switchable power amplifier in this example.

FIG. 4 is a diagram showing a specific implementation of the switchable power amplifier in this example. The components of the switchable power amplifier 109, as well as drain voltage/gate voltage supply sections 110, 111 and 112 (respectively for the first, second and third GaAs MESFETs PA101, PA201 and PA301), and control voltage supply sections 113 and 114 (respectively for the first and the second single-pole-dual-throw switches SW1 and SW2), are mounted on a printed circuit board 115. Vdd1/Vgg1, Vdd2/Vgg2 and Vdd3/Vgg3 denote the drain voltages/gate voltages to be supplied to the first, second and third GaAs MESFETs PA101, PA201 and PA301, respectively. VC1 and VC2 denote the control voltages to be supplied to the first and the second single-pole-dual-throw switches SW1 and SW2, respectively.

The drain voltage/gate voltage supply section 110 controls at least one of the drain voltage and the gate voltage for the first GaAs MESFET PA101, thereby reducing the power consumption of PA101 when the operation of PA101 is unnecessary. In the same way, the drain voltage/gate voltage supply sections 111 and 112 control at least one of the drain voltage and the gate voltage for the second and the third GaAs MESFETs PA201 and PA301, respectively, thereby reducing the power consumption thereof.

As a method for reducing the power consumption of a GaAs MESFET, a method for reducing the drain current Id of the FET by controlling the drain voltage or the gate voltage can be used. For example, in the case of a GaAs MESFET of a depletion type, the drain current Id can be reduced by lowering the drain voltage from about 3.5 V during the normal operation to about 0.0 V during the non-operation. Alternatively, the drain current Id may be reduced by lowering the gate voltage from about −2.5 V during normal operation to about −5.0 V during non-operation. The drain voltage/gate voltage supply section 110 receives at least one of the drain voltage Vdd1 (e.g., 3.5 V) for normal operation and the gate voltage Vgg1 (e.g., −2.5 V) for normal operation from an external power supply, varies Vdd1 or Vgg1 depending upon whether the first GaAs MESFET PA101 is activated or deactivated and then outputs varied Vdd1 or Vgg1 to PA101. The drain voltage/gate voltage supply sections 111 and 112 function similarly to the drain voltage/gate voltage supply section 110.

The power supply controls of the drain voltage/gate voltage supply sections 110, 111 and 112 are performed in association with those of the control voltage supply sections 113 and 114 for the first and the second single-pole-dual-throw switches SW1 and SW2. More specifically, in Mode 1, i.e., in a mode in which RF signals are received through the input terminal Pin1 and output through the output terminal Pout1, the control voltage supply sections 113 and 114 receive the control voltages VC1 and VC2, respectively, thereby controlling SW1 and SW2 such that SW1 and SW2 select Pin1 and Pout1, respectively. In addition, in this Mode 1, since PA301 is not required to be operated, the drain current Id is reduced, thereby realizing a low power consumption.

The drain voltage/gate voltage supply section is implemented by a chip inductor as a choke and a bypass capacitor or by a microstrip line for mounting a switchable power amplifier on a printed circuit board and a bypass capacitor.

It is noted that, when the output powers defined in Modes 1 and 2 are different as in this example or when the transmission/reception conditions of the RF signals are variable, it is necessary to vary or stabilize the output powers. Thus, since a gain control function for stabilizing an output power and holding a constant power is indispensable as a function of a transmission power amplifier, an attenuator or a power amplifier having an auto gain control (AGC) or an auto level control (ALC) is integrated into the power amplifier, thereby feedbacking and controlling the monitored output power. The output power can be monitored by a capacitance coupling or a directional coupler.

Figure 5:
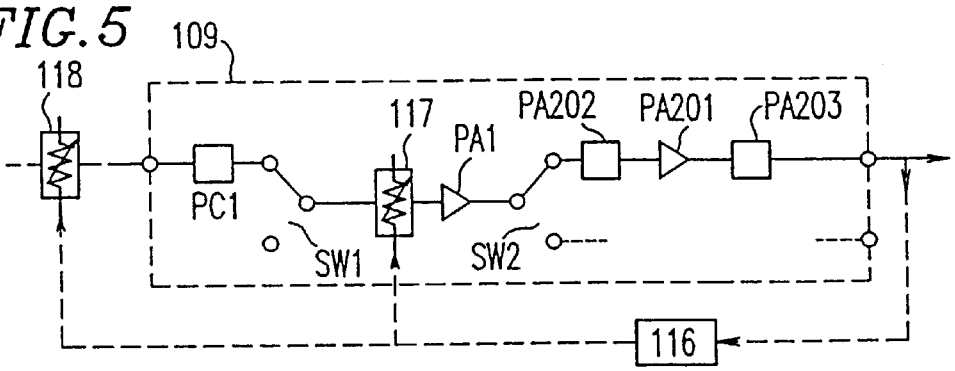
FIG. 5 is a diagram showing an exemplary configuration of a switchable power amplifier having a feedback control section.

FIG. 5 is a diagram showing an exemplary implementation of a switchable power amplifier having a feedback control section. As shown in FIG. 5, a first attenuator 117 is provided on the input side of the first power amplifier PA1 of this example and/or a second attenuator 118 is provided on the external input side of the switchable power amplifier 109 of this example. These attenuators are controlled by a feedback control section 116 for monitoring the output power and supplying a control signal.

As an attenuator, a fixed type attenuator (π-type, T-type attenuator) using a chip resistor or an electronic attenuator such as an IC using an analog type PIN diode, GaAs MESFET or the like and an IC formed by serially connecting digital type unit attenuators (ICs using GaAs MESFETs or the like) to be electronically controlled individually can be used. A "unit attenuator" is an element using an impedance between the drain and the source of a single GaAs MESFET for attenuating a signal. When the gate voltage of a unit attenuator is controlled, the attenuation amount is also varied. Since a unit attenuator has an attenuation amount of about 0.5 dB to about 5.0 dB, for example, if a further attenuation is desired, a plurality of unit attenuators are required to be serially connected.

Figure 6:
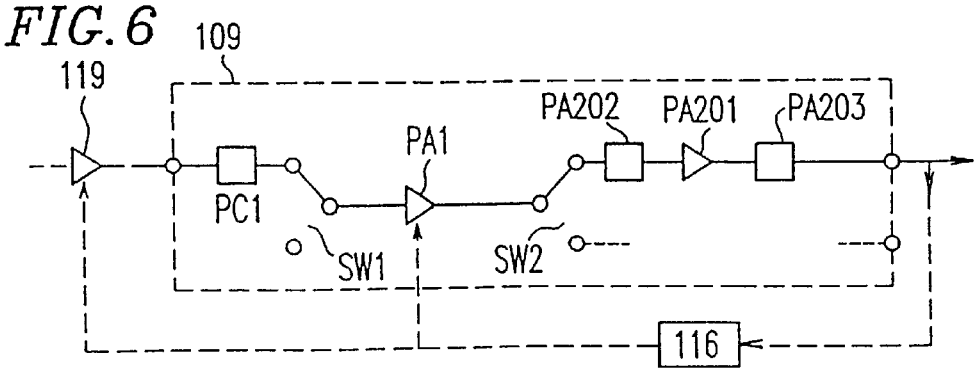
FIG. 6 is a diagram showing another exemplary configuration of a switchable power amplifier having a feedback control section.

FIG. 6 is a diagram showing another exemplary implementation of a switchable power amplifier having a feedback control section. As shown in FIG. 6, by varying the power supply voltage (e.g., lowering the drain voltage or reducing the gate voltage) of the auto gain control power amplifier 119 provided on the external input side of the first power amplifier PA1 of this example or the switchable power amplifier 109 of this example in accordance with the monitored output power, the gain and the output power are adjusted.

Figure 7:
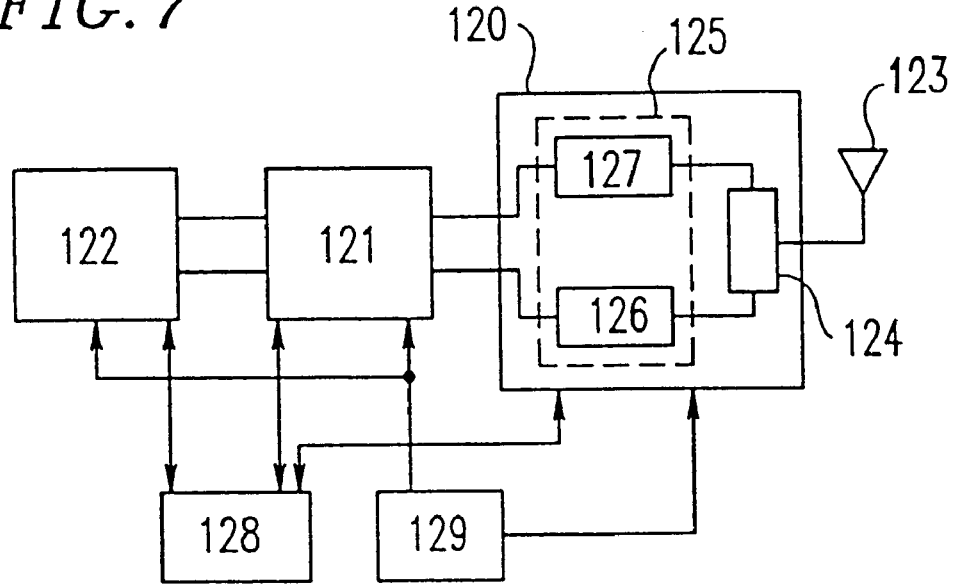
FIG. 7 is a block diagram of a generally used information communication unit.

FIG. 7 is a block diagram of a generally used information communication unit. The sections related to the transmission/reception and the signal processing of an RF signal are divided into a radio frequency (RF) section 120, an intermediate frequency (IF) signal processing section 121 and a base band section 122.

The RF section 120 includes: an antenna 123 used for transmission and reception; an antenna duplexer or a switch 124; and a front-end section 125. The front-end section 125 further includes a transmission section 126 and a reception section 127. Though, in general, a "front-end section" sometimes refers to a reception section only, a "front-end section" is herein assumed to include a transmission section.

The transmission section 126 is mainly composed of: a transmission mixer (up-converter) for converting an intermediate frequency (IF) signal supplied from a modulator to an RF signal; a voltage control oscillator (VCO) thereof; and a power amplifier for amplifying the RF signal (herein including an RF amplifier for a small signal). The switchable power amplifier 109 of this example belongs to this section.

The reception section 127 is mainly composed of a low noise amplifier (LNA) for amplifying the RF signal transmitted from the antenna 123 and a reception mixer (down-converter) for converting an RF signal into a low-frequency IF signal such that the signal can be processed by an IC.

The IF signal processing section 121 is mainly composed of a section (a mixer and an IF amplifier) for further converting and amplifying an IF signal supplied from a modulation section of a base band signal to be supplied to the transmission section and from the frontend section of the reception section.

In a digital system, the base band section is mainly composed of: a CODEC for performing encoding and decoding processing on an audio, data or video signal; a CODEC for performing a channel selection and the like in accordance with the transmission multiplexing type (time division, frequency division or code division); a base band signal (audio, data or video signal) modulation section (for modulating the base band signal into an IF signal for the transmission side); and an IF signal demodulation section (for demodulating the IF signal into a base band signal for the reception side). In an analog system, the base band section 122 is mainly composed of: a demodulation section (frequency discriminator); a modulation section; and an audio/data signal processing section. Depending upon the communication type, the base band section processes either an analog signal or a digital signal. Thus, an IC dedicated for processing an analog signal and an IC dedicated for processing a digital signal are separately used for these two types. Alternatively, an integrated IC commonly used for processing both an analog signal and a digital signal may be used.

Additionally, a CPU/memory section 128 and a power supply section 129 are also provided for controlling the respective sections. The CPU/memory section 128 controls the RF section 120, the IF signal processing section 121 and the base band section 122 in accordance with the desired communication type. The power supply section 129 generates a positive power or a negative power from a battery or a commercial power supply in accordance with the operating voltages of the respective circuits by using a DC/DC converter, a regulator or the like.

By integrating the RF section 120, the IF signal processing section 121 and the base band section 122 on at least one printed circuit board (e.g., a dielectric substrate or the like) and collectively mounting them into the case of an information communication unit, the unit can be downsized at lower cost as compared with a conventional example. As a result, a highly value-added information communication terminal unit commonly applicable to systems having different frequency bands, transmission output powers and modulation types can be obtained.

Figure 8:
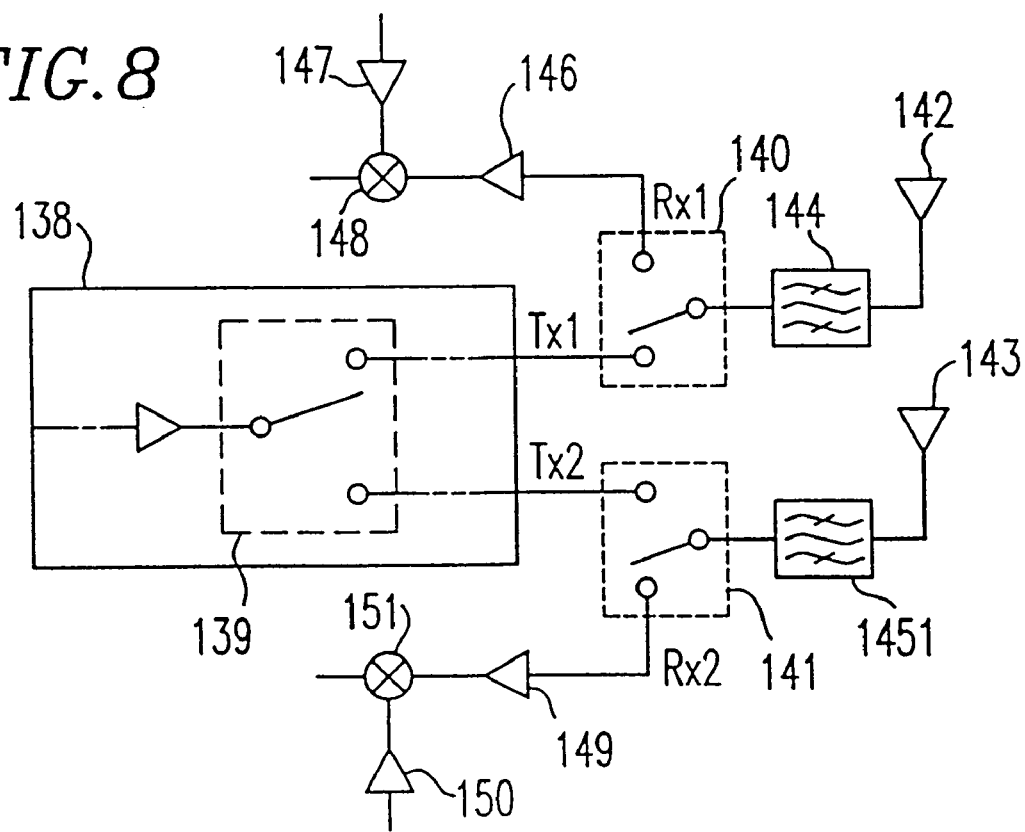
FIG. 8 is a configuration diagram of an information communication unit using the switchable power amplifier according to the present invention.

FIG. 8 is a configuration diagram using the switchable power amplifier according to the present invention. The information communication unit shown in FIG. 8 includes switches for switching transmission and reception corresponding to Modes 1 and 2, respectively. A second single-pole-dual-throw switch 140 and a third single-pole-dual-throw switch 141 corresponding to Modes 1 and 2, respectively, are connected to the output side of the switchable power amplifier 138 of the present invention. The switches 140 and 141 play a role of switching transmission and reception (Mode 1: switching between TX1 and RX1 and Mode 2: switching between TX2 and RX2).

A first antenna 142 (for Mode 1 ) and a first filter 144 are connected to the single-pole side of the second single-pole-dual-throw switch 140, while a second antenna 143 (for Mode 2 ) and a second filter 1451 are connected to the single-pole side of the third single-pole-dual-throw switch 141. A first low-noise amplifier 146, a first local amplifier 147 and a first mixer 148 are connected to the side of a reception terminal RX1 for Mode 1, while a second low-noise amplifier 149, a second local amplifier 150 and a second mixer 151 are connected to the side of a reception terminal RX2 for Mode 2.

FIGS. 9(a) and 9(b) are diagrams showing a specific exemplary implementation of a first DPDT (dual-pole-dual-throw) switch 152 in which the two single-pole-dual-throw switches shown in FIG. 8, i.e., the first single-pole-dual-throw switch 139 and the second single-pole-dual-throw switch 140, have been combined. The single-pole terminal P1 of the first single-pole-dual-throw switch 139, the single-pole terminal P2 of the second single-pole-dual-throw switch 140, a throw terminal T1 (on the side of transmission for Mode 2 ) of the first single-pole-dual-throw switch 139 and a throw terminal T2 (on the side of reception for Mode 1 ) of the second single-pole-dual-throw switch 140 correspond to the respective ports of the first DPDT switch 152.

The first, second, third and fourth switching transistors TSW1, TSW2, TSW3 and TSW4 are connected between adjacent ports P1 & P2, P2 & T2, T2 & T1 and T1 & P1, respectively. The fifth, sixth, seventh and eighth switching transistors TSW5, TSW6, TSW7 and TSW8 are connected in parallel to the port terminals P1, P2, T2 and T1, respectively. It is noted that TSW5 to TSW8 are sometimes connected and sometimes disconnected depending upon the desired isolation between adjacent ports. Thus, the adjacent ports are connected to each other via an SPST (single-pole-single-throw) switch. As a result, the first DPDT switch 152 can play a role of switching a signal received at P1 to P2 or to T1 and switching a signal received at P2 to T2.

FIGS. 10(a) and 10(b) are diagrams showing a specific exemplary implementation of a transmission/reception selecting switch for performing a diversity transmission/reception by using two antennas for Mode 2 (a second antenna 143 and a third antenna 154) and two filters (a second filter 1451 and a third filter 1452) in place of those shown in FIG. 8. In this diversity system, an antenna having satisfactory transmission/reception characteristics is selected depending upon the variable transmission/reception conditions affected by the reflection and the scattering of radio waves. A transmission/reception selecting switch is implemented by a second DPDT switch 153. P1' (on the side of the second antenna; for Mode 2), P2' (on the side of the third antenna; for Mode 2), T1' (on the side of transmission for Mode 2) and T2' (on the side of reception for Mode 2) correspond to the respective ports of the second DPDT switch 153. The ninth, tenth, eleventh and twelfth switching transistors TSW9, TSW10, TSW11 and TSW12 are connected between adjacent ports P2' & T1', T1' & P1', P1' & T2' and T2' & P2', respectively. The thirteenth, fourteenth, fifteenth and sixteenth switching transistors TSW13, TSW14, TSW15 and TSW16 are connected in parallel to the port terminals P2', T1', P1' and T2', respectively. It is noted that TSW13 to TSW16 are sometimes connected and sometimes disconnected depending upon the desired isolation between adjacent ports. Thus, the adjacent ports are connected to each other via an SPST (single-pole-single-throw) switch. As a result, by selecting either one of the ports P1' and P2' on the antenna side, the port T1' on the transmission side and T2' on the reception side can be switched.

Figure 11:
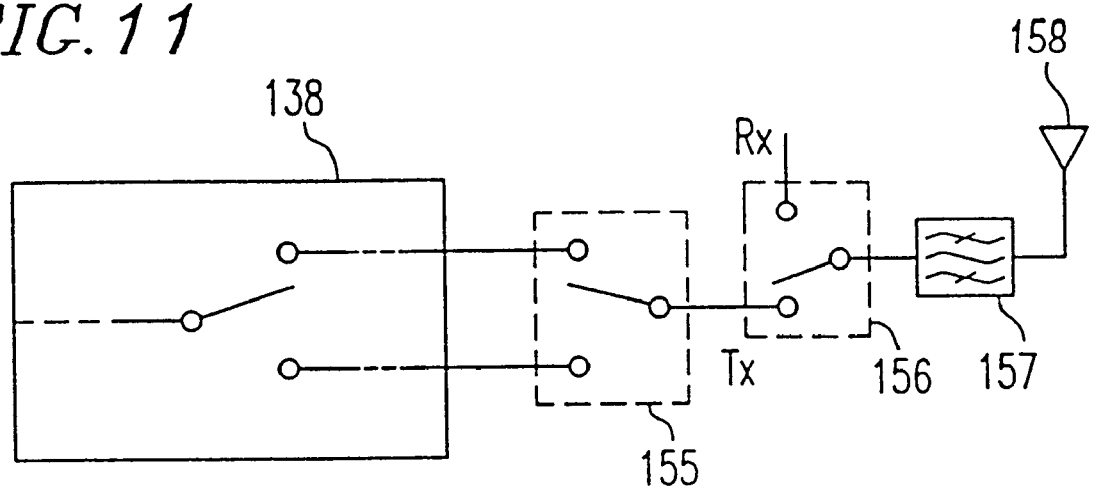
FIG. 11 is a configuration diagram of a communication unit using the switchable power amplifiers according to the present invention.

FIG. 11 is a configuration diagram of a communication unit using the switchable power amplifiers of the present invention. Unlike in FIG. 8, a single antenna section is commonly used in both Modes 1 and 2. A switch 155 for switching the outputs for Modes 1 and 2 and a switch 156 for switching transmission and reception of the switchable power amplifier are used.

A first single-pole-dual-throw switch 155 for switching Modes 1 and 2 is connected to the output side of the switchable power amplifier 138 of the present invention and a second single-pole-dual-throw switch 156 playing a role of switching transmission and reception (Mode 1: switching between TX1 and RX1 and Mode 2: switching between TX2 and RX2) is subsequently connected thereto. A filter 157 (commonly used for Modes 1 and 2) and an antenna 158 (commonly used for Modes 1 and 2) are connected to the side of the single pole of the second single-pole-dual-throw switch 156.

It is noted that a GaAs MESFET, a single-pole-dual-throw switch, an input matching circuit, an interstage matching circuit or an output matching circuit may be implemented by a configuration using a hybrid IC or an MMIC by methods other than that described above. Hereinafter, the configuration and mounting methods of (1) a hybrid IC and (2) an MMIC will be described so as to include the above-described method.

It is noted that, in this specification, "discrete components" mean the components of the hybrid IC as will be described in the following item (1). More specifically, the discrete components include various chip components such as a chip capacitor, a chip inductor, a chip resistor and a chip FET and components packaged within an MMIC. This definition is also applicable to the examples to be described later.

(1) Hybrid IC (HIC)

The above-described components are individually mounted on a printed circuit board. A "printed circuit board" herein means a substrate on which an RF section, an IF signal processing section or a base band section is mounted (hereinafter, such a substrate will also be referred to as a "mother substrate"). Hereinafter, the exemplary implementations of a hybrid IC will be separately described with respect to (1.1) a GaAs MESFET, (1.2) a single-pole-dual-throw switch, (1.3) a passive circuit and (1.4) the combination of (1.1) to (1.3).

(1.1) GaAs MESFET (a) Mount a GaAs MESFET in a resin-molded package or a ceramic package (mounted on a ceramic carrier and then sealed with a resin).

(b) Use a bare chip and mount a GaAs MESFET onto a printed circuit board in a "back-to-face" manner by using silver paste or the like (i.e., such that a surface of the chip on which active elements and the like are not formed faces the principal surface of the printed circuit board) or in a "face-to-face" manner (i.e., such that the principal surface of the chip on which micro bumps and the like are formed on the active elements and the pads faces the principal surface of the printed circuit board).

(1.2) Single-pole-dual-throw switch (a) Use a circuit including a PIN diode (a resin-molded PIN diode and peripheral circuits thereof).

(b) Use an integrated circuit including a GaAs MESFET (i.e., a circuit in which the GaAs MESFET and the peripheral circuits thereof are integrated and molded with a resin).

(1.3) Passive circuit (a passive circuit including an input matching circuit, an inter-stage matching circuit and an output matching circuit)

(a) Use chip components (such as a chip inductor, a chip capacitor and a chip resistor).

(b) Use a semiconductor substrate (forming an MMIC in the strict sense).

In general, various lumped constant elements are formed on a semiconductor substrate (made of a compound semiconductor such as Si, GaAs or the like). Among the lumped constant elements, the inductance components are implemented by forming microstrip lines (such as high-impedance lines), spiral inductors or the like. The capacitance components are implemented by forming MIM (metal-insulator-metal) capacitors, comb capacitors or the like. The resistance components are implemented by forming thin-film resistances (such as NiCr), ion implanted resistances, resistances using active elements or the like.

As the distributed constant elements, end-open stubs, end-short stubs or the like are formed by patterning for implementing the inductance components, the capacitance components and the like.

These elements may be mounted in a bare chip manner. Alternatively, these elements may be mounted on a printed circuit board by sealing multiple chips including a GaAs MESFET chip within a single package.

(c) Use a dielectric substrate, in which case strip lines, MIM capacitors and thin-film resistances are formed on a printed circuit board (made of glass epoxy: ∈r=4.9; glass fluoride or teflon: ∈r=2.6; glass thermosetting PPO resin: ∈r=3.5, 10.5; etc.), a ceramic substrate (made of alumina, etc.) or the like.

Among these printed circuit boards, the substrate made of glass epoxy is used as a mother substrate on which the RF section, the IF signal processing section and the base band section are mounted. The substrate made of glass thermosetting PPO resin may also be implemented as a multi-layer substrate including strip lines, thin-film resistances and the like formed between adjacent layers. The ceramic substrate may also be mounted so as to be one of the multiple chips including other components by forming the substrate as a pattern in the carrier section of a ceramic package.

(1.4) Combination of (1.1) to (1.3)

For example, as a passive circuit including matching circuits, a part to be fabricated on a semiconductor substrate, a part using chip components and a part to be formed by patterning on a printed circuit board are separately configured. The passive circuit fabricated on the semiconductor substrate may be one (such as a GaAs chip) of the multiple chips including other components or integrated as an MMIC to be described below.

(2) MMIC

Figure 12:
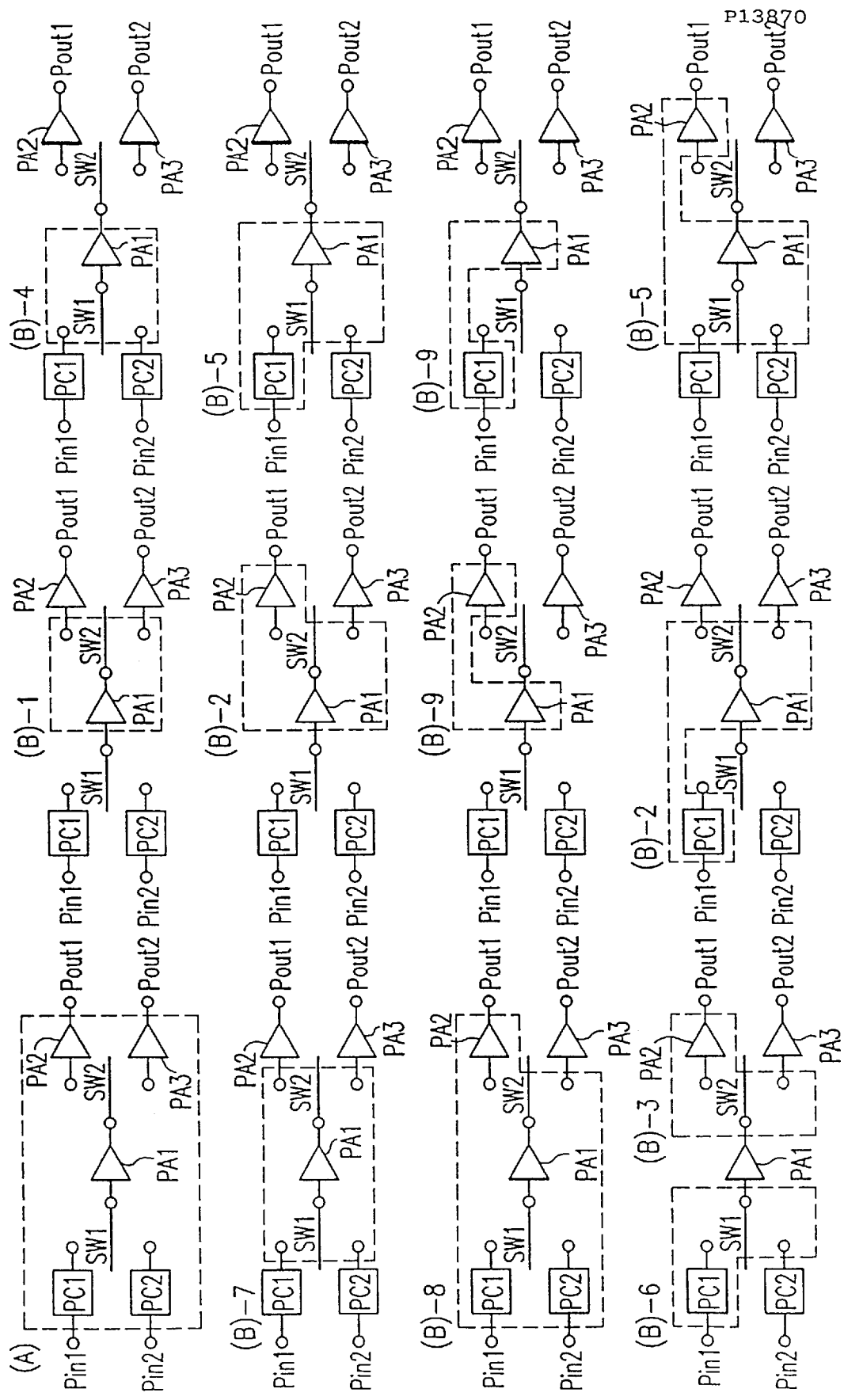
FIG. 12 is a diagram showing parts to be implemented as MMICs in the power amplifier of the present invention.

The above-described individual components are implemented as MMICs (monolithic microwave ICs). Hereinafter, the MMIC implementations will be described so as to correspond to the configurations employed in this example. FIG. 12 is a diagram showing parts to be implemented as MMICs in the power amplifier of the present invention. The following description corresponds to the numbered alphabets (A) and (B)-1 to (B)-9 used in FIG. 12. In FIG. 12, a portion surrounded by broken lines is a part to be implemented as an MMIC.

(A) All of the switchable power amplifier of this example is implemented as an MMIC. That is to say, all the components of the switchable power amplifier of this example including the first, second and third power amplifiers PA1, PA2 and PA3, the first and the second single-pole-dual-throw switches SW1 and SW2, the first and the second input matching circuits PC1 and PC2, the first and the second inter-stage matching circuits PA202 and PA302 and the first and the second output matching circuits PA203 and PA303 are implemented as an MMIC.

(B) An arbitrary part of the switchable power amplifier of this example is selectively implemented as an MMIC. More specifically, components to be implemented as an MMIC are selected from the second single-pole-multi-throw switch SW2, the power amplifier PA1 connected to the single-pole terminal of the second single-pole-multi-throw switch SW2 and the second and the third power amplifiers PA2 and PA3 connected to the multi-throw terminals of the second single-pole-multi-throw switch SW2 and then combined on the same semiconductor substrate. Main combinations thereof are as follows. However, the combinations are not limited thereto.

(B)-1: Combine the second single-pole-multi-throw switch SW2 with the first power amplifier PA1.

(B)-2: Combine the components of (B)-1 with at least one of the other components (the second and the third power amplifiers PA2 and PA3, the first and the second input matching circuits PC1 and PC2, etc.).

(B)-3: Combine the second single-pole-multi-throw switch SW2 with at least one of the components other than the first power amplifier PA1 (the second and the third power amplifiers PA2 and PA3, the first and the second input matching circuits PC1 and PC2, etc.).

(B)-4: Combine the first single-pole-multi-throw switch SW1 with the first power amplifier PA1.

(B)-5: Combine the components of (B)-4 with at least one of the other components (the second and the third power amplifiers PA2 and PA3, the first and the second input matching circuits PC1 and PC2, etc.).

(B)-6: Combine the first single-pole-multi-throw switch SW1 with at least one of the components other than the first power amplifier PA1 (the second and the third power amplifiers PA2 and PA3, the first and the second input matching circuits PC1 and PC2, etc. ) except for the portion overlapping with (B)-3.

(B)-7: Combine the first single-pole-multi-throw switch SW1, the second single-pole-multi-throw switch SW2 and the first power amplifier PA1.

(B)-8: Combine the components of (B)-7 with at least one of the other components (the second and the third power amplifiers PA2 and PA3, the first and the second input matching circuits PC1 and PC2, etc.).

(B)-9: Combine the first power amplifier PA1 with at least one of the components other than the first and the second single-pole-multi-throw switches SW1 and SW2 (the second and the third power amplifiers PA2 and PA3, the first and the second input matching circuits PC1 and PC2, etc.).

It is noted that an MMIC implementation includes implementing the second or the third power amplifier PA2 or PA3 as an MMIC and selectively implementing the components of each power amplifier (active elements, passive circuits and the like) as an MMIC (e.g., implementing all the components of the second or the third power amplifier PA2 or PA3 other than the output matching circuit thereof as an MMIC). The chip implemented as an MMIC by any of the combinations (B)-1 to (B)-9 is sealed within a resin-molded package or mounted in a bare chip manner.

In this case, the components which are not implemented as an integral part of the MMIC by any of (A) and (B) are individually mounted on a printed circuit board as described in the item (1). In order to reduce the costs and improve the performance during practical use, MMICs and hybrid ICs are simultaneously used. In other words, the merits and the demerits of an MMIC and a hybrid IC are in an inverse relationship to be mutually complemented. On the one hand, an MMIC implementation has a merit of obtaining a high added value by further improving the performance and reducing the size and the costs to be realized by the integration of the respective functional components. On the other hand, an MMIC implementation has several demerits including: the increase in costs because of the decrease in production yield during the anterior process (wafer process) and posterior process (assembly process) steps; the deterioration of performance because the components cannot be adjusted individually; and the degradation of characteristics (such as a decrease in gain) or reliability (the thermorunaway or the breakdown of the elements) caused by the limit of the heat dissipation of a semiconductor substrate when the output power to be processed becomes 1 W or higher. The merits and the demerits of a hybrid IC are inverse to those of an MMIC.

Figure 13:
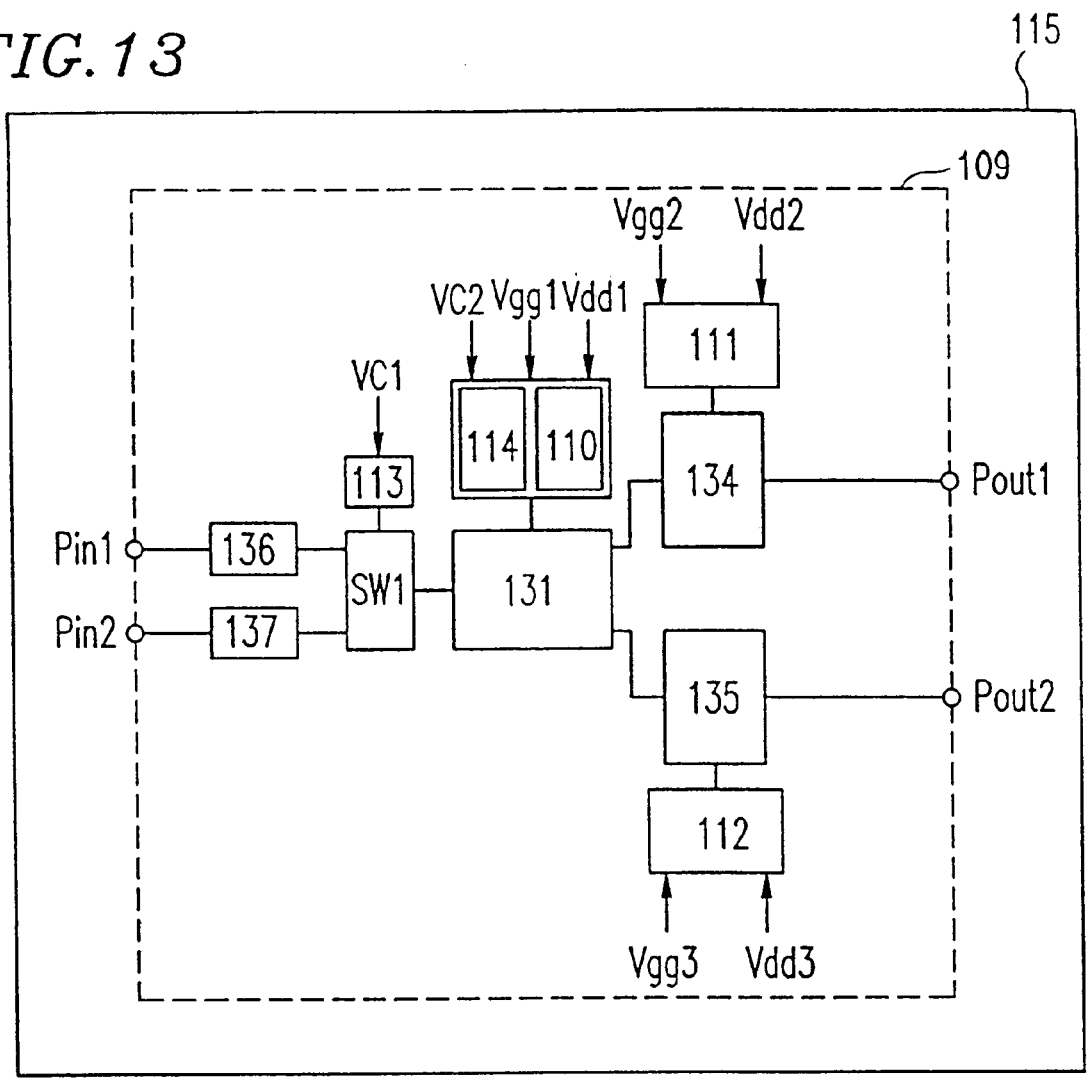
FIG. 13 is a configuration diagram in which the switchable power amplifier 109 of this example is implemented by MMICs and hybrid ICs.

FIG. 13 is a diagram showing a configuration in which the switchable power amplifier 109 of this example is implemented by MMICs and hybrid ICs. This switchable power amplifier 109 includes: a switch-integrated power amplifier 131 having the above-described implementation (B)-1 (i.e., an implementation including the second single-pole-multi-throw switch SW2 and the first power amplifier PA1 formed on the same semiconductor substrate); the second and the third power amplifiers 134 and 135 implemented as MMICs; the first single-pole-multi-throw switch SW1; and the first and the second input matching circuits 136 and 137 implemented as hybrid ICs. The power voltage and the control voltage are conformable to those described with reference to FIG. 4.

It is noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage of the GaAs MESFET of this example may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

The first, second and third power amplifiers PA1, PA2 and PA3 in this example are single-stage amplifiers. Alternatively, multi-stage amplifiers may also be used instead. For example, a driver power amplifier may be additionally provided on the input side of the first power amplifier.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using single-pole-dual-throw switches. However, a desired power amplifier and a desired information communication unit may be formed even by the use of single-pole-multi-throw switches having multiple (three or more) throw terminals, multi-pole-dual-throw switches having multiple (two or more) pole terminals or multi-pole-multi-throw switches collectively as the selecting switches.

Summing up the functions of the power amplifier of this example, RF signals having respectively different f1 and f2 and Pout1 and Pout2 can be transmitted by synchronously switching the first and the second single-pole-dual-throw switches SW1 and SW2 in accordance with the desired transmission frequencies f1 and f2 or by switching the first and the second input matching circuits PC1 and PC2 and the second and the third power amplifiers PA2 and PA3 in accordance with the respective frequencies.

There are other types of transmissible systems in which the frequencies f1 and f2 of the RF signals are in substantially the same band and Pout1 and Pout2 respectively corresponding to the frequencies f1 and f2 are different from each other. Such an example is shown in the following table.

|        | f  |         | Pout  |        | Communication type |
|--------|----|---------|-------|--------|--------------------|
| Mode 1 | f1 | 800 MHz | Pout1 | 26 dBm | Digital Modulation |
| Mode 2 | f2 | 800 MHz | Pout2 | 31 dBm | Analog Modulation  |

Mode 1: spread spectrum (SS) QPSK modulation type
Mode 2: FM modulation type

In this table, in the analog FM modulation type in Mode 2, a nonlinear saturation power amplifier may also be used as a power amplifier and the matching is performed with respect to the second output matching circuit PA303 such that a high power added efficiency and a high harmonics suppression ratio are obtained at the defined output power of 31 dBm. On the other hand, matching is performed with respect to the first output matching circuit PA203 such that an adjacent channel leakage power and an intermodulation distortion (IMD: frequency components represented by "mfa±nfb"[where n and m are integers] caused when a plurality of different signals are amplified) are suppressed to minimal levels and a high power added efficiency can be attained at the defined output power of 26 dBm.

Alternatively, RF signals having substantially equal Pout1 and Pout2 and different f1 and f2 may be transmitted. Such an example is shown in the following table.

|        | f  |         | Pout  |        | Communication type |
|--------|----|---------|-------|--------|--------------------|
| Mode 1 | f1 | 900 MHz | Pout1 | 31 dBm | Digital Modulation |
| Mode 2 | f2 | 1.5 GHz | Pout2 | 31 dBm | Digital Modulation |

Mode 1: π/4 shift DQPSK modulation type
Mode 2: π/4 shift DQPSK modulation type

EXAMPLE 2

FIGS. 14 to 18 are diagrams illustrating the second example of the switchable power amplifier according to the present invention. This switchable power amplifier has a function of transmitting RF signals having two different frequencies and two different output powers by temporally synchronizing the switching of the four switches. In this example, RF signals having the following exemplary frequencies f and the following exemplary output powers Pout may be transmitted, as shown in the following table.

|        | f  |         | Pout  |        | Communication type |
|--------|----|---------|-------|--------|--------------------|
| Mode 1 | f1 | 1.5 GHz | Pout1 | 31 dBm | Digital Modulation |
| Mode 2 | f2 | 1.9 GHz | Pout2 | 22 dBm | Digital Modulation |

Mode 1: π/4 shift DQPSK modulation type
Mode 2: π/4 shift DQPSK modulation type

Figure 14:
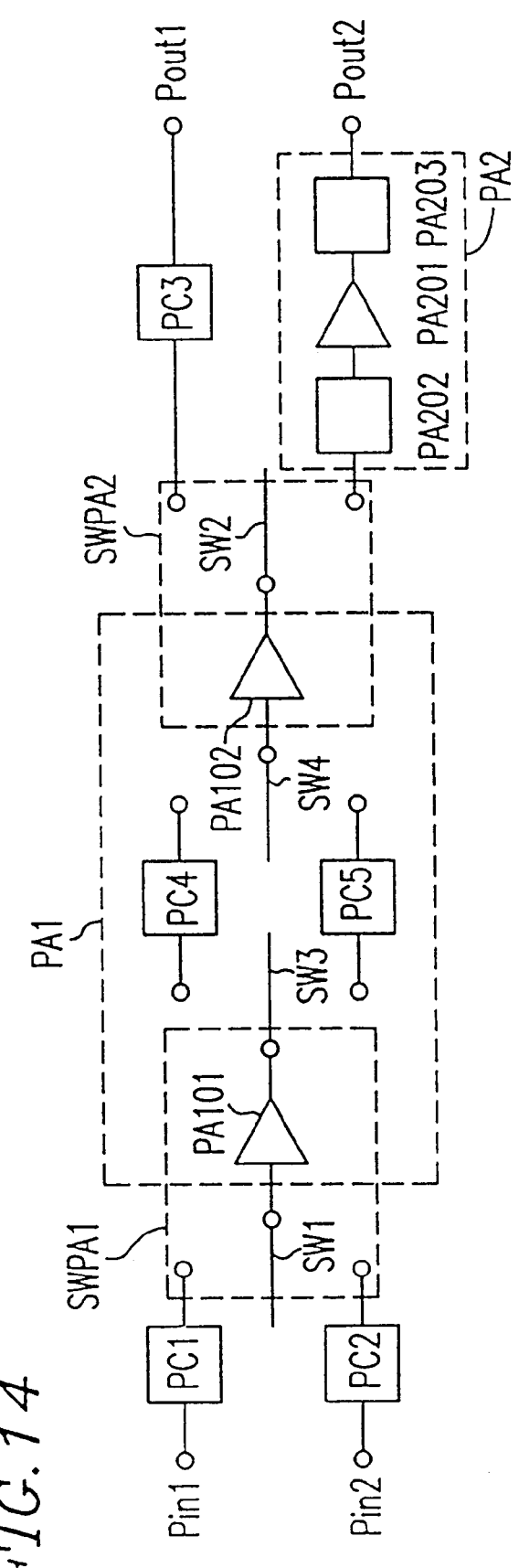
FIG. 14 is a configuration diagram of the second example of the switchable power amplifier according to the present invention.

FIG. 14 is a configuration diagram of the second example of the switchable power amplifier according to the present invention.

A first single-pole-dual-throw switch SW1, a first input matching circuit PC1 for Mode 1 and a second input matching circuit PC2 for Mode 2 are connected to the input side of a first power amplifier PA1. On the other hand, a second single-pole-dual-throw switch SW2, a first output matching circuit PC3 for Mode 1 and a second power amplifier PA2 for Mode 2 are connected to the output side of the first power amplifier PA1.

The first power amplifier PA1 includes: a first and a second GaAs MESFET PA101 and PA102; a first and a second inter-stage matching circuit PC4 and PC5; and a third and a fourth single-pole-dual-throw switch SW3 and SW4. The second power amplifier PA2 includes: a third GaAs MESFET PA201; a third inter-stage matching circuit PA202; and a second output matching circuit PA203.

The first, second and third GaAs MESFETs PA101, PA102 and PA201 included in the first and the second power amplifiers PA1 and PA2 are of a depletion type and have gate widths (Wg) of 1 mm, 4 mm and 30 mm, respectively. The first GaAs MESFETs PA101 having Wg of 1 mm and the first single-pole-dual-throw switch SW1 are integrated on a GaAs substrate (thereby forming a first switch-integrated power amplifier SWPA1), while the second GaAs MESFETs PA102 having Wg of 4 mm and the second single-pole-dual-throw switch SW2 are integrated on a GaAs substrate (thereby forming a second switch-integrated power amplifier SWPA2). Then, the first and the second switch-integrated power amplifiers SWPA1 and SWPA2 are sealed within resin-molded packages, respectively. On the other hand, the third GaAs MESFET PA201 having Wg of 30 mm is mounted in a ceramic package (mounted on a ceramic carrier and then sealed with a resin).

Figure 15:
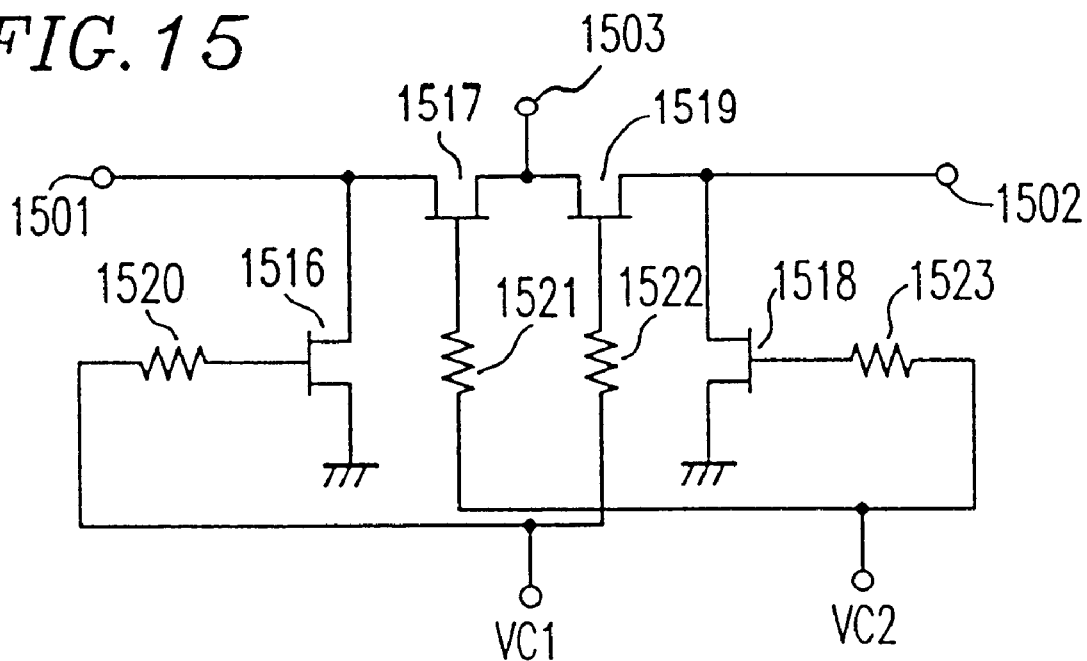
FIG. 15 is a circuit diagram of switches SW1 and SW2.

An integrated circuit including GaAs MESFETs is used as each of the first and the second single-pole-dual-throw switches SW1 and SW2. FIG. 15 is a circuit diagram of the switches SW1 and SW2. The integrated circuit using GaAs MESFETs includes: a first parallel GaAs MESFET 1516; a first serial GaAs MESFET 1517; a second parallel GaAs MESFET 1518; a second serial GaAs MESFET 1519; a first resistance 1520; a second resistance 1521; a third resistance 1522; and a fourth resistance 1523. By applying control voltages VC1 and VC2, switching is performed between a third terminal 1503 and a first and a second terminal 1501 and 1502. The GaAs MESFETs have Wg of 1.2 mm.

Each of the third and the fourth single-pole-dual-throw switches SW3 and SW4 may be implemented as a circuit using PIN diodes (i.e., a circuit including resin-molded PIN diodes and peripheral circuits thereof including C (capacitor) for cutting DC and a choke coil having R (resistance component) or I (inductance component)) or as an integrated circuit using GaAs MESFETs (i.e., a circuit formed by integrating GaAs MESFETs with peripheral components thereof and molding them with a resin).

Figure 16:
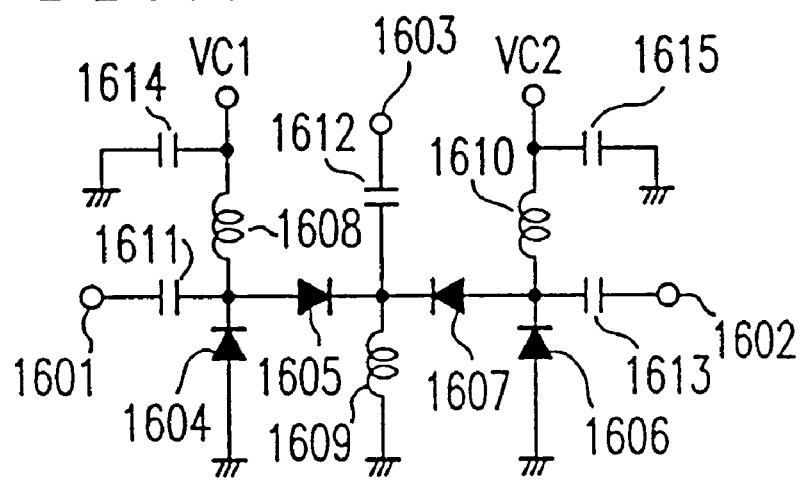
FIG. 16 is a circuit diagram of switches SW3 and SW4.

FIG. 16 is a circuit diagram of the switches SW3 and SW4. The circuit including PIN diodes includes: a first parallel PIN diode 1604; a first serial PIN diode 1605; a second parallel PIN diode 1606; a second serial PIN diode 1607; a first choke inductance 1608; a second choke inductance 1609; a third choke inductance 1610; a first DC blocking capacitor 1611; a second DC blocking capacitor 1612; a third DC blocking capacitor 1613; a first bypass capacitor 1614; and a second bypass capacitor 1615. By applying control voltages VC1 and VC2, switching is performed between a third terminal 1603 and a first and a second terminal 1601 and 1602.

The operating power supply voltages of the first, second and third GaAs MESFETs PA101, PA102 and PA201 are as follows. Specifically, the drain voltages thereof are about 3.5 V and the gate voltages thereof are negative voltages in the range from about −2.0 V to about −3.0 V. The first GaAs MESFET PA101 is operated while paying much respect to the gain thereof and the second and the third GaAs MESFETs PA102 and PA201 are operated in a class AB (with an idle current corresponding to about 10% of Idss) while paying much respect to the linearity of the input/output characteristics and the digital distortion characteristics thereof. The first, second and third GaAs MESFETs PA101, PA102 and PA201 have Idss of about 250 mA, 900 mA and 7.0 A, respectively.

The first and the second single-pole-dual-throw switches SW1 and SW2 are operated while applying control voltages of 0.0 V/−4.7 V thereto. When the third and the fourth switches SW3 and SW4 are circuits using PIN diodes, these switches are operated while applying control voltages of 0 V/12 V thereto. On the other hand, when these switches are circuits using GaAs MESFETs, these switches are operated while. applying control voltages of 0 V/−4.7 V thereto.

In conformity with the implementations described in the first example, the parameters of the first and the second input matching circuits PC1 and PC2, the first, second and third inter-stage matching circuits PC4, PC5 and PA202, and the first and the second output matching circuits PC3 and PA203 are determined. As a result, the distortion characteristics required for the π/4 shift DQPSK modulation type in this example are satisfied. The gain and loss levels on the respective stages are as follows: the output power of the first power amplifier PA1 is about 22.5 dBm with respect to an input power of about 0 dBm; a final output power in Mode 1 is 22 dBm because a power of about 0.5 dBm is lost by the first output matching circuit PC3; and a final output power in Mode 2 is 31 dBm because of the second power amplifier PA2.

In the above-described respective matching circuits, each of the equivalent circuits thereof can be represented by a combination of lumped constant element components. The first and the second input matching circuits PC1 and PC2, the third inter-stage matching circuit PA202 and the first and the second output matching circuits PC3 and PA203 are implemented by using various chip components such as a chip inductor, a chip capacitor and a chip resistor.

Figure 17:
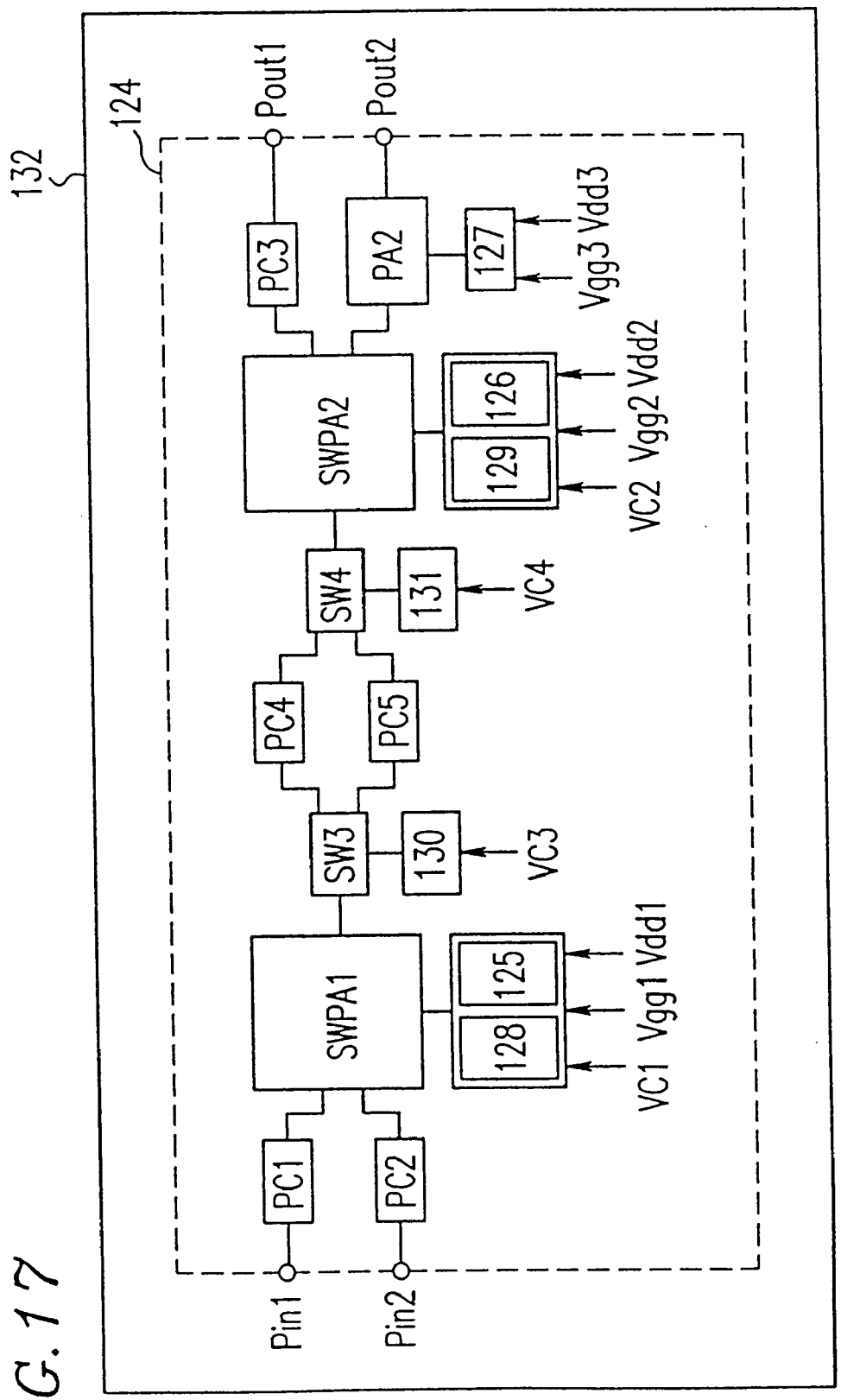
FIG. 17 is a configuration diagram of the switchable power amplifier in the second example.

FIG. 17 is a configuration diagram of the switchable power amplifier in the second example. The respective components of the above-described switchable power amplifier 124 of this example, the drain voltage/gate voltage supply sections 125, 126 and 127 for the first, second and third GaAs MESFETs PA101, PA102 and PA201 and control voltage supply sections 128, 129, 130 and 131 for the first, second, third and fourth single-pole-dual-throw switches SW1, SW2, SW3 and SW4 are mounted on a printed circuit board 132.

Vdd1/Vgg1, Vdd2/Vgg2 and Vdd3/Vgg3 denote the drain voltages/gate voltages to be supplied to the first, second and third GaAs MESFETs PA101, PA102 and PA201, respectively. VC1, VC2, VC3 and VC4 denote the control voltages to be supplied to the first, second, third and fourth single-pole-dual-throw switches SW1, SW2, SW3 and SW4, respectively.

The power supply controls of the drain voltage/gate voltage supply sections (or power supply controllers) 125, 126 and 127 are performed in association with those of the control voltage supply sections (or feeders) 128, 129, 130 and 131 for the first, second, third and fourth single-pole-dual-throw switches SW1, SW2, SW3 and SW4. For example, when Pout1 is selected as the output, the feeders are controlled such that SW1 selects Pin1, SW3 and SW4 select PC4 and SW2 select Pout1. The drain voltage/gate voltage supply section 127 is controlled such that the unused PA201 is deactivated for reducing the power consumption.

The drain voltage/gate voltage supply section is implemented by using a chip inductor as a choke and a bypass capacitor or by using a microstrip line for mounting a switchable power amplifier on a printed circuit board and a bypass capacitor.

It is noted that, when the output powers defined in Modes 1 and 2 are different as in this example or when the transmission/reception conditions of the RF signals are variable, it is necessary to vary or stabilize the output powers. Thus, since a gain control function for stabilizing an output power and holding a constant power is indispensable as a function of a transmission power amplifier, an attenuator or a power amplifier having an auto gain control (AGC) function or an auto level control (ALC) function is integrated into the power amplifier, thereby feedbacking and controlling the monitored output power. The output power can be monitored by a capacitance coupling or a directional coupler (as to exemplary configurations, see FIGS. 5 and 6 in the first example).

By integrating the RF section 120, the IF signal processing section 121 and the base band section 122, which are shown in the block diagram of an information communication unit in FIG. 7 in the first example, on at least one printed circuit board (e.g., a dielectric substrate or the like) so as to include the switchable power amplifier 124 of this example and collectively mounting them into the case of an information communication unit, the unit can be downsized at lower costs as compared with a conventional example. As a result, a highly value-added information communication terminal unit commonly applicable to systems having different frequency bands, transmission output powers and modulation types can be obtained.

Figure 9:
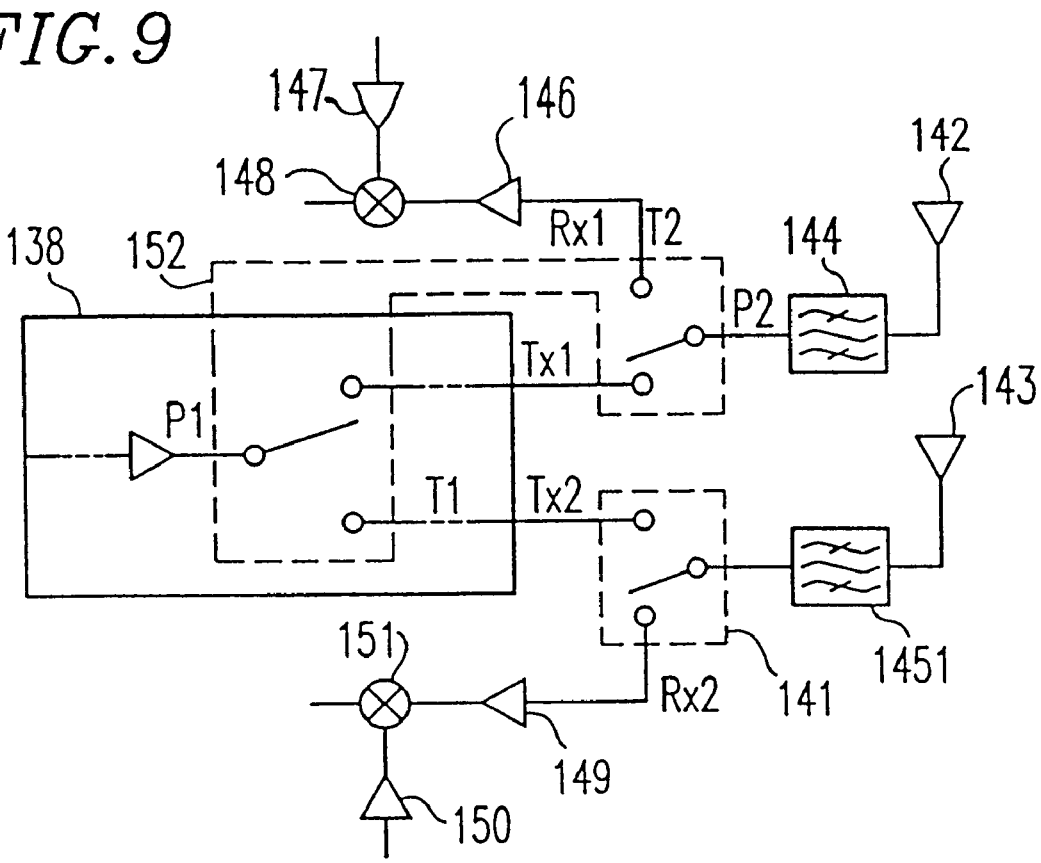
FIGS. 9a and 9b are a configuration diagram of a first DPDT switch 152 in which the first single-pole-dual-throw switch 139 and the second single-pole-dual-throw switch 140 in FIG. 8 have been combined.
Figure 9:
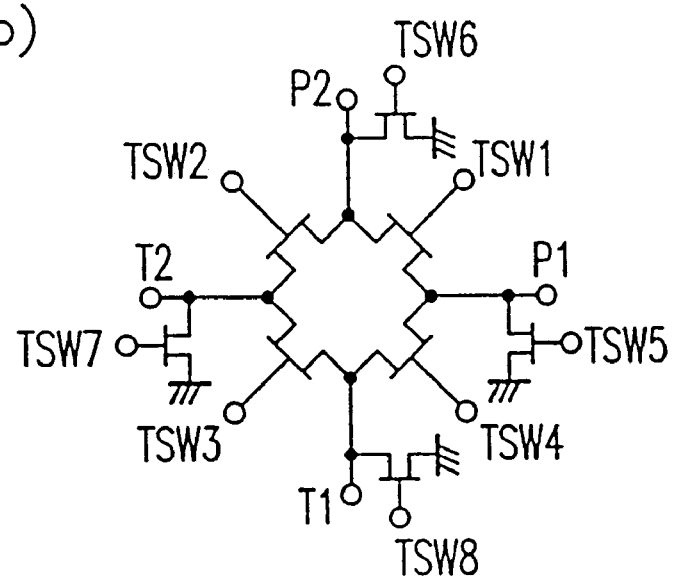
Figure 10:
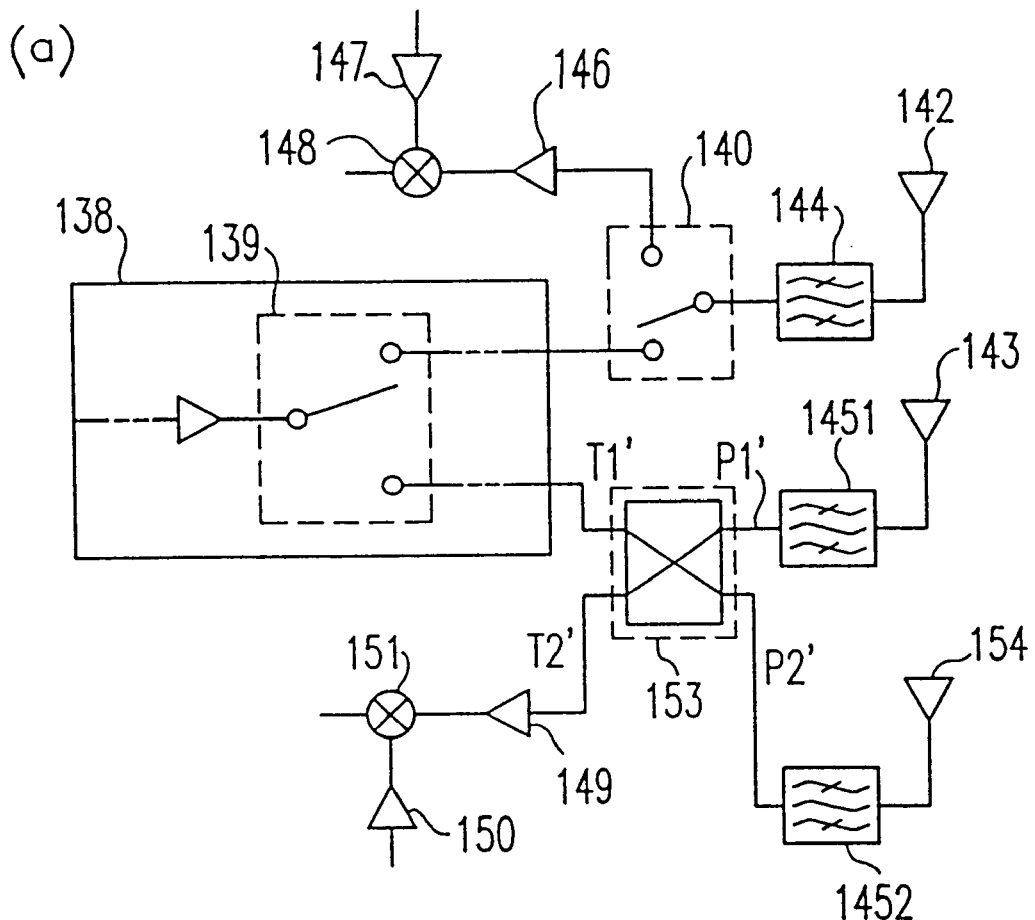
FIGS. 10a and 10b are a configuration diagram of a transmission/reception selecting switch for a diversity transmission/reception using the two antennas and the two filters for Mode 2 shown in FIG. 8.
Figure 10:
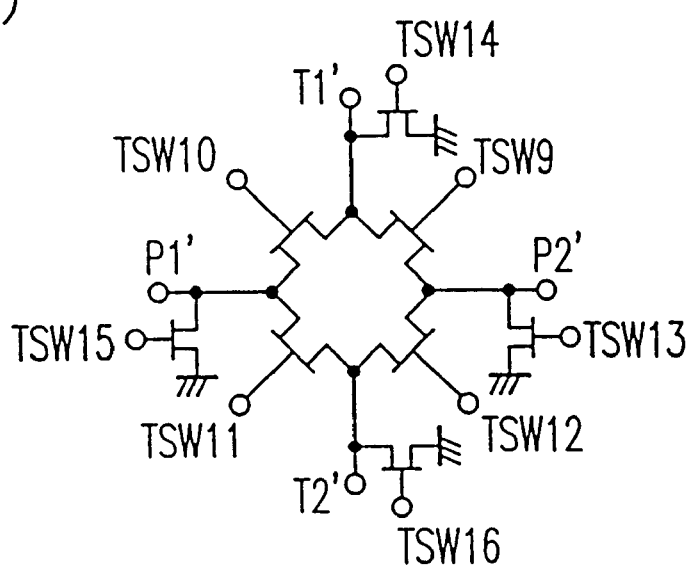

As specific exemplary implementations of the information communication unit, the implementations shown in FIGS. 8 to 10 in the first example (i.e, an implementation in which switches for switching transmission/reception for Modes 1 and 2 are connected to the switchable power amplifier and an implementation in which switches for performing diversity transmission/reception is connected thereto) are usable. By utilizing these implementations, the transmission and reception can be performed with respect to Modes 1 and 2.

Alternatively, as shown in FIG. 11 in the first example, by commonly using a single antenna section in Modes 1 and 2 and connecting the switch for switching the output powers of the switchable power amplifier for Modes 1 and 2 to the switch for switching transmission and reception, the transmission and reception can also be performed with respect to Modes 1 and 2.

Figure 18:
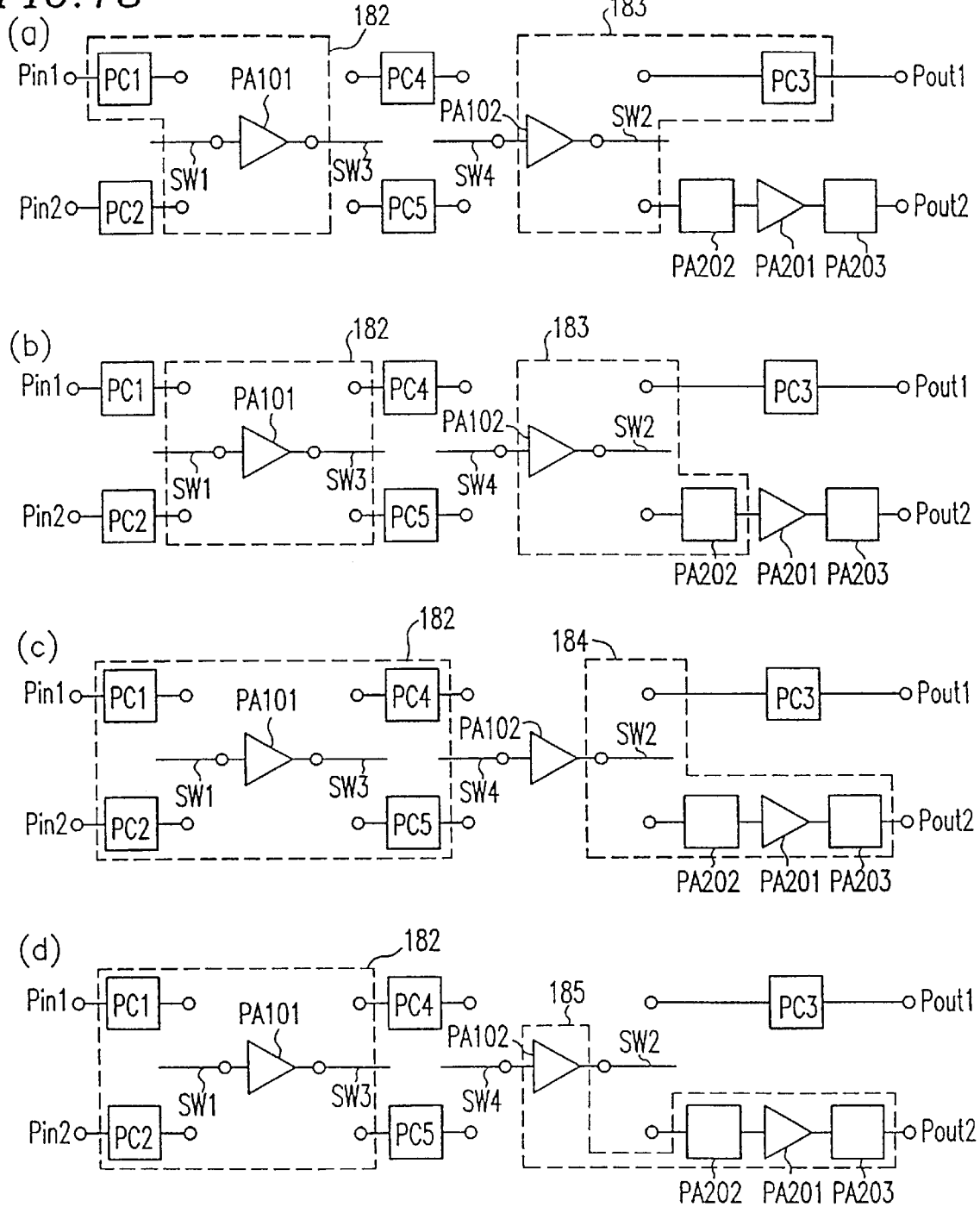
FIGS. 18a–d are a diagram showing ranges implemented as MMICs in this example.

It is noted that the switchable power amplifier of this example may also be implemented under the following configurations. FIG. 18 is a diagram showing ranges implemented as MMICs in this example. The following descriptions (182) to (185) correspond to the reference numerals attached to the broken line portions shown in FIG. 18. The following MMIC implementations described in (182) to (185) are representative practical ones in respect of the costs, the production yield of a chip and the like. However, the implementations are not limited thereto, but include the exemplary configurations and mounting methods of hybrid ICs and MMICs as described in the first example.

(181): Implement GaAs MESFETs, single-pole-dual-throw switches, matching circuits and other peripheral circuits as hybrid ICs. Seal the GaAs MESFETs having Wg of 1 mm and 4 mm within resin-molded packages.

(182): Integrate at least one of the third single-pole-dual-throw switch SW3, the first and the second input matching circuits PC1 and PC2 and the first and the second inter-stage matching circuits PC4 and PC5 into the first switch-integrated power amplifier SWPA1 and mold them with a resin.

(183): Integrate at least one of the fourth single-pole-dual-throw switch SW4, the first output matching circuit PC3 and the third inter-stage matching circuit PA202 into the second switch-integrated power amplifier SWPA2 and mold them with a resin.

(184): Integrate the second single-pole-dual-throw switch SW2 and the second power amplifier PA2 on a GaAs substrate and mold them with a resin.

(185): Integrate the second GaAs MESFET PA102 and the second power amplifier PA2 on a GaAs substrate and mold them with a resin.

In these implementations (182) to (185), a matching circuit implemented as an MMIC has a combination of microstrip lines, spiral inductors, MIM (metal-insulator-metal) capacitors, comb capacitors, thin-film resistances (such as NiCr) and the like on a GaAs substrate. On the other hand, the components not implemented within an MMIC are individually mounted on a printed circuit board.

It is noted that an MMIC implementation includes implementing the first or the second power amplifier PA1 and PA2 as an MMIC and selectively implementing the components of each power amplifier (active elements, passive circuits and the like) as an MMIC (e.g., implementing all the components of the second power amplifier PA2 other than the output matching circuit thereof as an MMIC).

It is also noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

The first and the second power amplifiers PA1 and PA2 in this example are single-stage amplifiers. Alternatively, multi-stage amplifiers may also be used instead. For example, a driver power amplifier may be additionally provided on the input side of the first power amplifier.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using single-pole-dual-throw switches. However, a desired power amplifier and a desired information communication unit may be formed even by the use of single-pole-multi-throw switches having multiple (three or more) throw terminals, multi-pole-dual-throw switches having multiple (two or more) pole terminals or multi-pole-multi-throw switches collectively as the selecting switches.

The switchable power amplifier may be implemented not only under the above-described specifications but also under the following specifications.

|  |  | f | Pout |  | Communication type |
|---|---|---|---|---|---|
| Mode 1 | f1 | 900 MHz | Pout1 | 31 dBm | Digital Modulation |
| Mode 2 | f2 | 1.9 GHz | Pout2 | 22 dBm | Digital Modulation |

Mode 1: π/4 shift DQPSK modulation type
Mode 2: π/4 shift DQPSK modulation type

|  |  | f | Pout |  | Communication type |
|---|---|---|---|---|---|
| Mode 1 | f1 | 1.9 GHz | Pout1 | 22 dBm | Digital Modulation |
| Mode 2 | f2 | 900 MHz | Pout2 | 31 dBm | Analog Modulation |

Mode 1: π/4 shift DQPSK modulation type
Mode 2: FM modulation type

In the latter specifications, in the analog FM modulation type in Mode 2, a nonlinear saturation power amplifier may also be used as a power amplifier and matching is performed with respect to the second output matching circuit PA203 such that a high power added efficiency and a high harmonics suppression ratio are obtained at the defined output power of 31 dBm. On the other hand, matching is performed with respect to the first output matching circuit PC3 such that an adjacent channel leakage power is suppressed to minimal levels and a high power added efficiency can be attained at the defined output power of 22 dBm.

EXAMPLE 3

FIGS. 21 to 24 are diagrams illustrating the third example of the switchable power amplifier according to the present invention. This switchable power amplifier has a function of transmitting RF signals having two different frequencies and two different output powers by using a wide-band power amplifier as a driver power amplifier (or driver amp) of the power amplifier on the final output stage and temporally synchronizing the switching of the switch.

Figure 19:
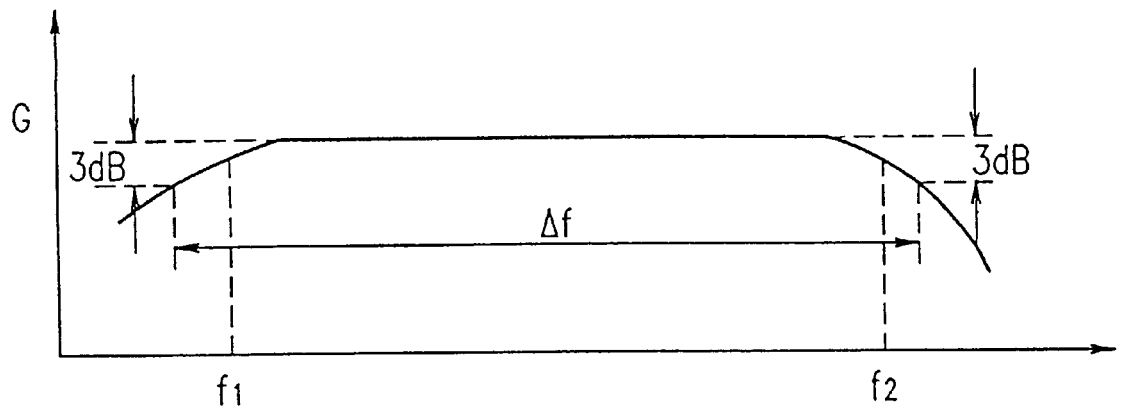
FIG. 19 is a graph illustrating a 3 dB band width.

Such a "wide-band power amplifier" generally refers to a power amplifier exhibiting flat characteristics over a frequency range covering two or more desired frequency bands and satisfying desired characteristics. FIG. 19 is a graph illustrating a 3 dB band width. As shown in FIG. 19, the 3 dB band width (Δf) of the gain is defined so as to include a desired frequency range (from a frequency f1 to a frequency f2). Hereinafter, the 3 dB band width (Δf) of the gain will be assumed to include a range from about 800 MHz to about 2.5 GHz. In the case where some variation is caused in the flat portion of the frequency characteristics shown in FIG. 19, an average value in the flat portion (such a value is generally referred to as a "Typ. value") is obtained and the range defined between the value to −3 dB of the value is assumed to be Δf.

Figure 20:
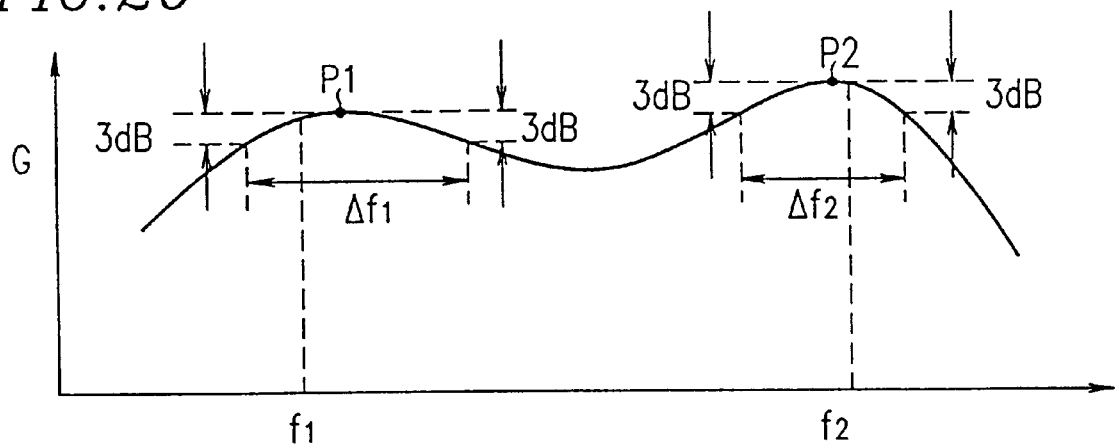
FIG. 20 is a graph illustrating a 3 dB band width of an amplifier having two peaks.

In addition, a power amplifier having gain characteristics having peaks in at least two desired frequency bands (i.e., a so-called "multi-frequency matching power amplifier") can be used as a power amplifier substantially equivalent to a wide-band power amplifier. FIG. 20 is a graph illustrating a 3 dB band width of an amplifier having two peaks. As shown in FIG. 20, in the case of a dual-frequency matching power amplifier, the two 3 dB bands (Δf1 and Δf2) corresponding to the gains at the two peaks (i.e., a first peak P1 and a second peak P2) of the gain characteristics thereof are defined so as to include the two desired frequencies f1 and f2, respectively.

By using such a wide-band power amplifier, the input matching circuits and redundant switches which are required in the first and the second examples can be eliminated, thereby obtaining a smaller-sized higher-performance switchable power amplifier.

Consider a case of transmitting RF signals having the following frequencies f and the following output powers Pout as shown in the following table.

|  |  | f |  | Pout | Communication type |
|---|---|---|---|---|---|
| Mode 1 | f1 | 1.9 GHz | Pout1 | 22 dBm | Digital Modulation |
| Mode 2 | f2 | 2.4 GHz | Pout2 | 26 dBm | Digital Modulation |

Figure 21:
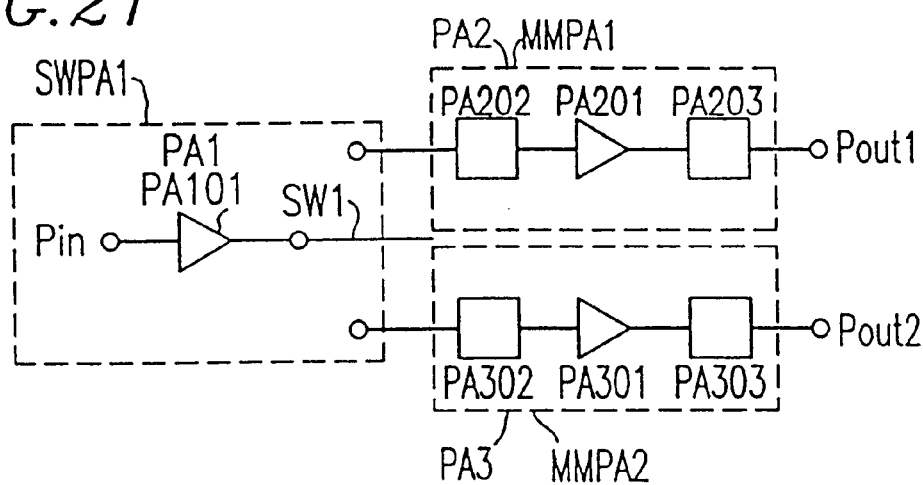
FIG. 21 is a configuration diagram of the third example of the switchable power amplifier according to the present invention.

Mode 1: π/4 shift DQPSK modulation type
Mode 2: spread spectrum (SS) QPSK modulation type FIG. 21 is a configuration diagram illustrating the third example of the switchable power amplifier according to the present invention.

A first single-pole-dual-throw switch SW1, a second power amplifier PA2 for Mode 1 and a third power amplifier PA3 for Mode 2 are connected to the output side of a first power amplifier PA1.

The first power amplifier PA1 includes a first and GaAs MESFET PA101. The second power amplifier PA2 includes: a second GaAs MESFET PA201; a first inter-stage matching circuit PA202; and a first output matching circuit PA203. The third power amplifier PA3 includes: a third GaAs MESFET PA301; a second inter-stage matching circuit PA302; and a second output matching circuit PA303.

The first, second and third GaAs MESFETs PA101, PA201 and PA301 included in the first, second and third power amplifiers PA1, PA2 and PA3 are of a depletion type and have gate widths (Wg) of 1 mm, 4 mm and 8 mm, respectively.

The first GaAs MESFETs PA101 having Wg of 1 mm and the first single-pole-dual-throw switch SW1 are integrated on a GaAs substrate (thereby forming a first switch-integrated power amplifier SWPA1). The second GaAs MESFETs PA201 having Wg of 4 mm, the first interstage matching circuit PA202 and the first output matching circuit PA203 are integrated on a GaAs substrate (thereby forming a first integrated power amplifier MMPA1). The third GaAs MESFETs PA301 having Wg of 8 mm, the second interstage matching circuit PA302 and the second output matching circuit PA303 are integrated on a GaAs substrate (thereby forming a second integrated power amplifier MMPA2). Then, the first, second and third power amplifiers SWPA1, MMPA1 and MMPA2 are sealed within resin-molded packages, respectively.

An integrated circuit including a GaAs MESFET is used as the first single-pole-dual-throw switch SW1 (as to an exemplary circuit configuration, see FIG. 15 in the second example).

The operating power supply voltages of the first, second and third GaAs MESFETs PA101, PA201 and PA301 are as follows. Specifically, the drain voltages thereof are 3.5 V and the gate voltages thereof are negative voltages in the range from about −2.0 V to about −3.0 V. The first GaAs MESFET PA101 is operated while paying much respect to the gain thereof and the second and the third GaAs MESFETs PA201 and PA301 are operated in a class AB (with an idle current corresponding to about 10% of Idss) while paying much respect to the linearity of the input/output characteristics and the digital distortion characteristics thereof. The first, second and third GaAs MESFETs PA101, PA201 and PA301 have Idss of about 250 mA, about 900 mA and about 1.7 A, respectively. On the other hand, the first single-pole-dual-throw switch SW1 is operated while applying control voltages of 0 V and −4.7 V thereto.

Figure 22:
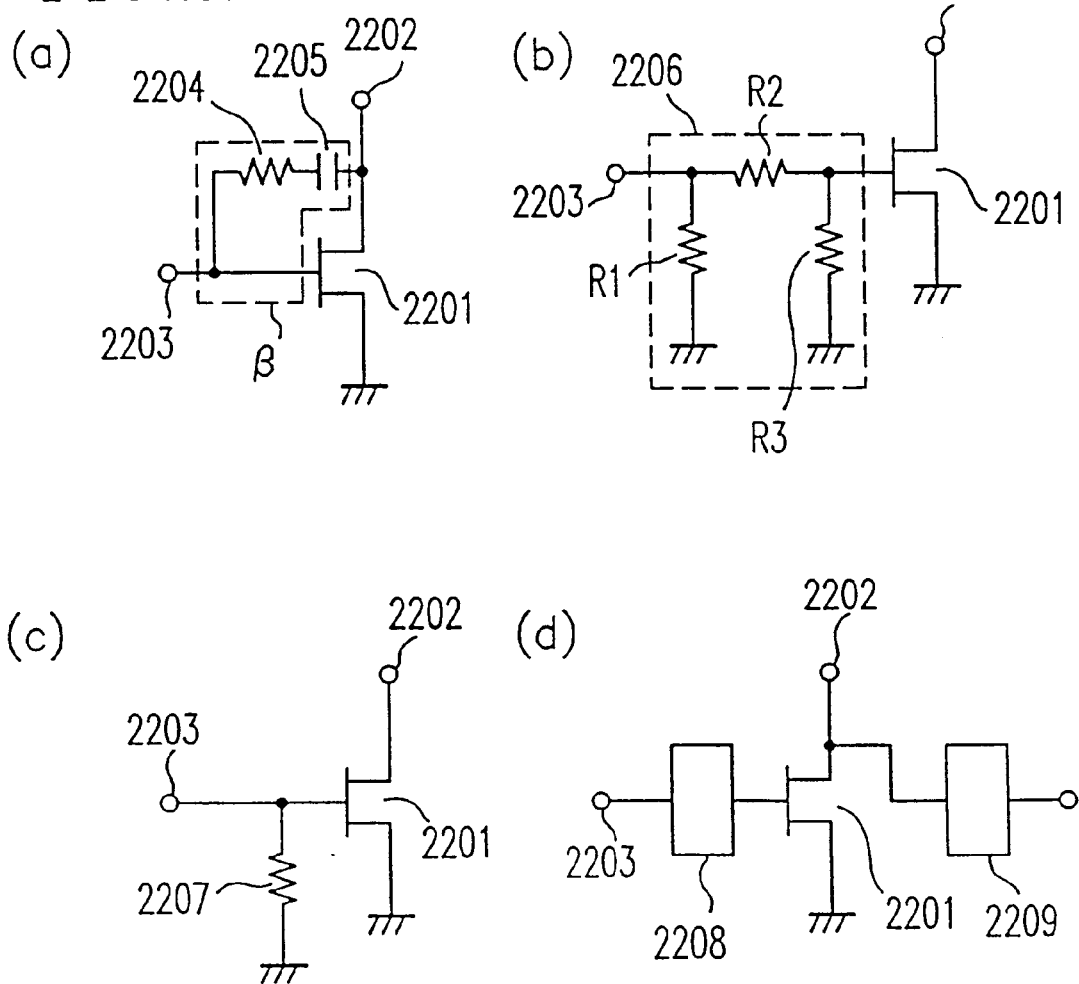
FIGS. 22a–c are a diagram illustrating the wide-band operation of a power amplifier.

In the switchable power amplifier of this example, by using a wide-band power amplifier as the first power amplifier PA1, an input matching circuit and a switch for switching the input matching circuit which is required in the first and the second examples can be eliminated. In general, the below-described method is mainly used for realizing a wide-band operation of such a power amplifier. FIGS. 22(a) to 22(d) are diagrams illustrating the wide-band operation of a power amplifier. In FIG. 22, the reference numeral 2201 denotes an active element (MESFET), 2202 denotes an output terminal and 2203 denotes an input terminal.

(1) Insert a serial circuit including a resistance 2204 and a capacitor 2205 as a negative feedback circuit β to between the output terminal (drain terminal) 2202 and the input terminal (gate terminal) 2203 of the active element FET 2201 (FIG. 22(a)).

(2) Insert an attenuator 2206 in a π-shape or a T-shape (formed by a first, a second and a third resistance R1, R2 and R3) to the input side of the active element 2201 (FIG. 22(b)).

(3) Insert a resistance 2207 (50Ω) in parallel to the input side of the active element 2201 (FIG. 22(c)).

(4) Insert a first and a second impedance converter 2208 and 2209 (or constant resistance circuits) enabling a matching in a wide band to the input side and the output side of the active element, respectively.

In this example, the wide-band power amplifier shown in FIG. 22(a) is used. The resistance 2204 and the capacitor 2205 of the negative feedback circuit of the first power amplifier PA1 are integrated with the first switch-integrated power amplifier SWPA1 and then sealed within a resin-molded package.

In determining the parameters of the matching circuits, those of the first and the second inter-stage matching circuits PA202 and PA302 are determined in view of a matching between the output impedances of the first GaAs MESFET PA101 and the input impedances of the second and the third GaAs MESFETs PA201 and PA301 at the frequencies f1 and f2. In conformity with the implementations of the matching circuits described in the first example, the parameters of the first and the second output matching circuits PA203 and PA303 are optimized. As a result, the distortion characteristics required for the π/4 shift DQPSK modulation type and the spread spectrum (SS) QPSK modulation type in this example are satisfied.

In each of the matching circuits, the equivalent circuit thereof is represented by a combination of lumped constant element components. Each of the first and the second inter-stage matching circuits PA202 and PA302 and the first and the second output matching circuits PA203 and PA303 is represented by a combination of a microstrip line, a spiral inductor, an MIM (metal-insulator-metal) capacitor, a comb capacitor, a thin-film resistance (such as NiCr) and the like on a GaAs substrate.

Figure 23:
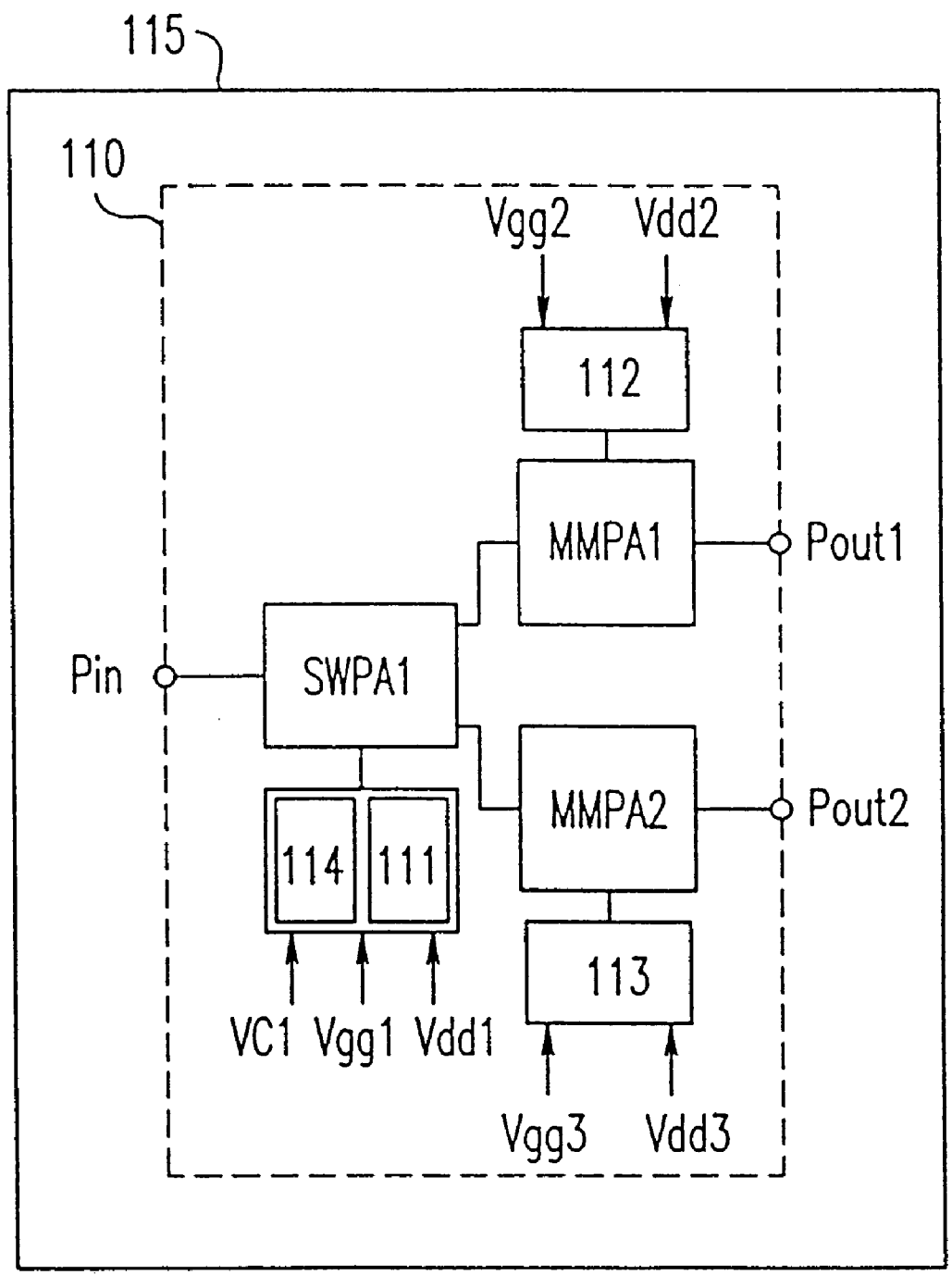
FIG. 23 is a configuration diagram of the switchable power amplifier in the third example.
Figure 24:
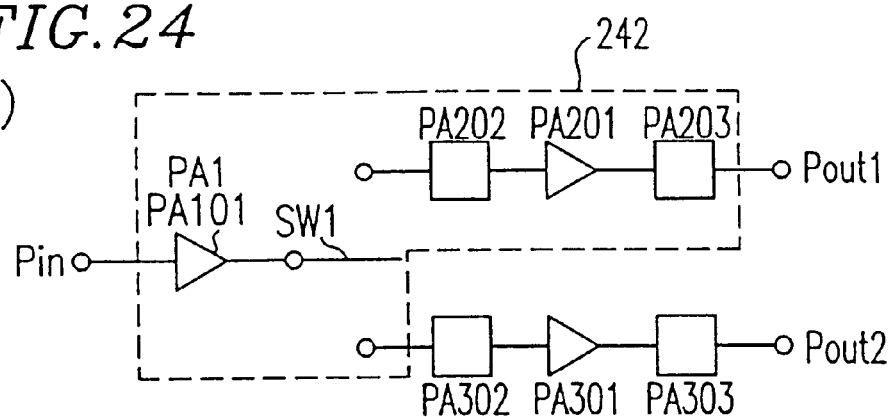
FIGS. 24a–d are a diagram showing parts implemented as MMICs in the third example.
Figure 24:
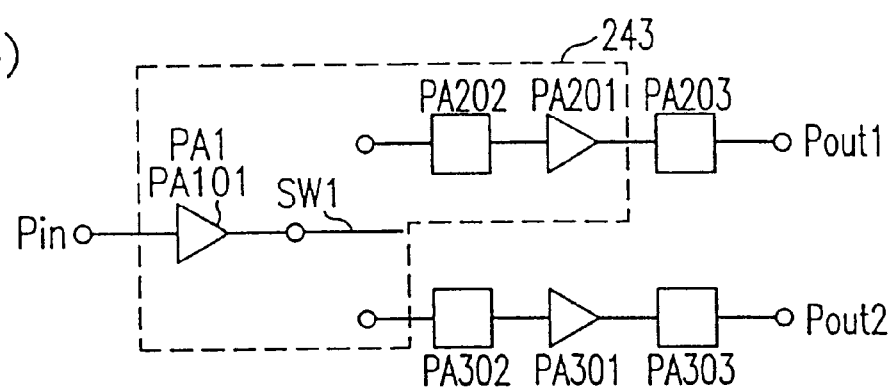
Figure 24:
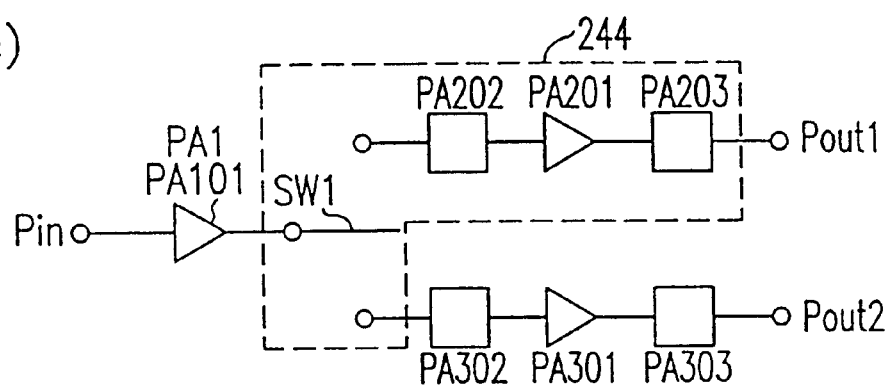
Figure 24:
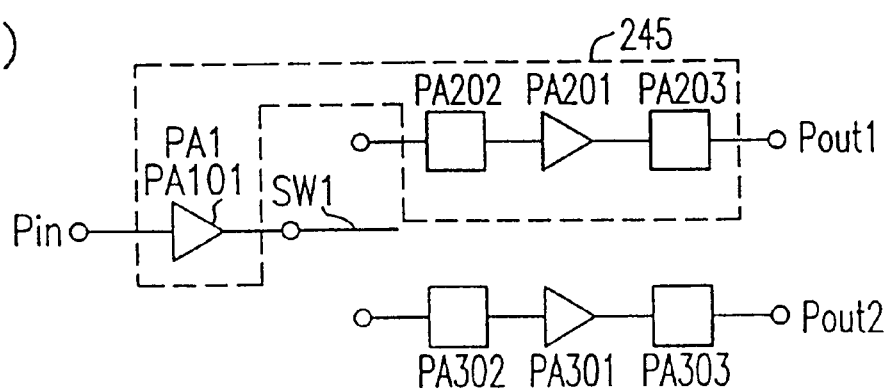

FIG. 23 is a configuration diagram of the switchable power amplifier in the third example. The respective components of the above-described switchable power amplifier 110 of this example, the drain voltage/gate voltage supply sections 111, 112 and 113 for the first, second and third GaAs MESFETs PA 01, PA201 and PA301 and control voltage supply section 114 for the first single-pole-dual-throw switch SW1 are mounted on a printed circuit board 115.

Vdd1/Vgg1, Vdd2/Vgg2 and Vdd3/Vgg3 denote the drain voltages/gate voltages to be supplied to the first, second and third GaAs MESFETs PA101, PA201 and PA301, respectively. VC1 denotes the control voltage to be supplied to the first single-pole-dual-throw switch SW1.

The power supply controls of the drain voltage/gate voltage supply sections (or power supply controllers) 111, 112 and 113 are performed in association with that of the control voltage supply section (or feeder) 114 for the first single-pole-dual-throw switch SW1. For example, when Pout1 is selected as the output, the feeder is controlled such that SW1 selects Pout1. The drain voltage/gate voltage supply section 113 is controlled such that the unused PA301 is deactivated for reducing the power consumption.

The drain voltage/gate voltage supply section is implemented by a chip inductor as a choke and a bypass capacitor or by a microstrip line for mounting a switchable power amplifier on a printed circuit board and a bypass capacitor.

It is noted that, when the output powers defined in Modes 1 and 2 are different as in this example or when the transmission/reception conditions of the RF signals are variable, it is necessary to vary or stabilize the output powers. Thus, since a gain control function for stabilizing an output power and holding a constant power is indispensable as a function of a transmission power amplifier, an attenuator or a power amplifier having an auto gain control (AGC) or an auto level control (ALC) function is integrated into the power amplifier, thereby feedbacking and controlling the monitored output power. The output power can be monitored by a capacitance coupling or a directional coupler (as to exemplary configurations, see FIGS. 5 and 6 in the first example).

By integrating the RF section 120, the IF signal processing section 121 and the base band section 122, which are shown in the block diagram of an information communication unit in FIG. 7 in the first example, on at least one printed circuit board (e.g., a dielectric substrate or the like) so as to include the switchable power amplifier 110 of this example and collectively mounting them into the case of an information communication unit, the unit can be downsized at lower costs as compared with a conventional example. As a result, a highly value-added information communication terminal unit commonly applicable to systems having different frequency bands, transmission output powers and modulation types can be obtained.

As specific exemplary implementations of the information communication unit, the implementations shown in FIGS. 8 to 10 in the first example (i.e, an implementation in which switches for switching transmission/reception for Modes 1 and 2 are connected to the switchable power amplifier and an implementation in which switches for performing diversity transmission/reception is connected thereto) are usable. By utilizing these implementations, the transmission and reception can be performed with respect to Modes 1 and 2.

Alternatively, as shown in FIG. 11 in the first example, by commonly using a single antenna section in Modes 1 and 2 and connecting the switch for switching the output powers of the switchable power amplifier for Modes 1 and 2 to the switch for switching transmission and reception, the transmission and reception can also be performed with respect to Modes 1 and 2.

It is noted that the switchable power amplifier of this example may also be implemented under the following specific configurations. FIGS. 24(a) to 24(d) are diagrams showing parts implemented as MMICs in the third example. The following descriptions (242) to (245) correspond to the reference numerals 242 to 245 attached to the broken line portions shown in FIG. 24. The following MMIC implementations described in (242) to (245) are representative practical ones in respects of the costs, the production yield of a chip and the like. However, the implementations are not limited thereto, but include the exemplary configurations and mounting methods of hybrid ICs and MMICs as described in the first example.

(241): Implement GaAs MESFETs, a single-pole-dual-throw switch, matching circuits and other peripheral circuits as hybrid ICs. The GaAs MESFETs having Wg of 1 mm and 4 mm are sealed within resin-molded packages, while the GaAs MESFET having Wg of 8 mm is mounted in a ceramic package (i.e., mounted on a ceramic carrier and then sealed with a resin). Various chip components such as a chip inductor, a chip capacitor and a chip resistor are used as the matching circuits.

(242): Integrate at least one of the first integrated power amplifier MMPA1 and the second integrated power amplifier MMPA2 into the first switch-integrated power amplifier SWPA1.

(243): Integrate at least one of the part of the second power amplifier PA2 excluding the first output matching circuit PA203 and the part of the third power amplifier PA3 excluding the second output matching circuit PA303 into the first switch-integrated power amplifier SWPA1.

(244): Integrate the first single-pole-dual-throw switch SW1 with at least one of the second power amplifier PA2 and the third power amplifier PA3 on a GaAs substrate.

(245): Integrate the first power amplifier PA1 with at least one of the second power amplifier PA2 and the third power amplifier PA3 on a GaAs substrate.

In (242) to (245), a chip implemented as an MMIC has been sealed within a resin-molded package or mounted in a bare chip manner, and a matching circuit implemented as an MMIC include a combination of a microstrip line, a spiral inductor, an MIM (metal-insulator-metal) capacitor, a comb capacitor, a thin-film resistance (such as NiCr) and the like on a GaAs substrate. On the other hand, the components not implemented within an MMIC are individually mounted on a printed circuit board.

It is noted that an MMIC implementation includes implementing the first, second or third power amplifier PA1, PA2 or PA3 as an MMIC and selectively implementing the components of each power amplifier (active elements, passive circuits and the like) as an MMIC (e.g., implementing all the components of the first or the second power amplifier PA1 or PA2 other than the output matching circuit thereof as an MMIC).

It is also noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

The first, second and third power amplifiers PA1, PA2 and PA3 in this example are single-stage amplifiers. Alternatively, multi-stage amplifiers may also be used instead. For example, a driver power amplifier may be additionally provided on the input side of the first power amplifier.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using a single-pole-dual-throw switch. However, a desired power amplifier and a desired information communication unit may be formed even by the use of a single-pole-multi-throw switch having multiple (three or more) throw terminals, a multi-pole-dual-throw switch having multiple (two or more) pole terminals or a multi-pole-multi-throw switch collectively as the selecting switch.

EXAMPLE 4

Figure 25:
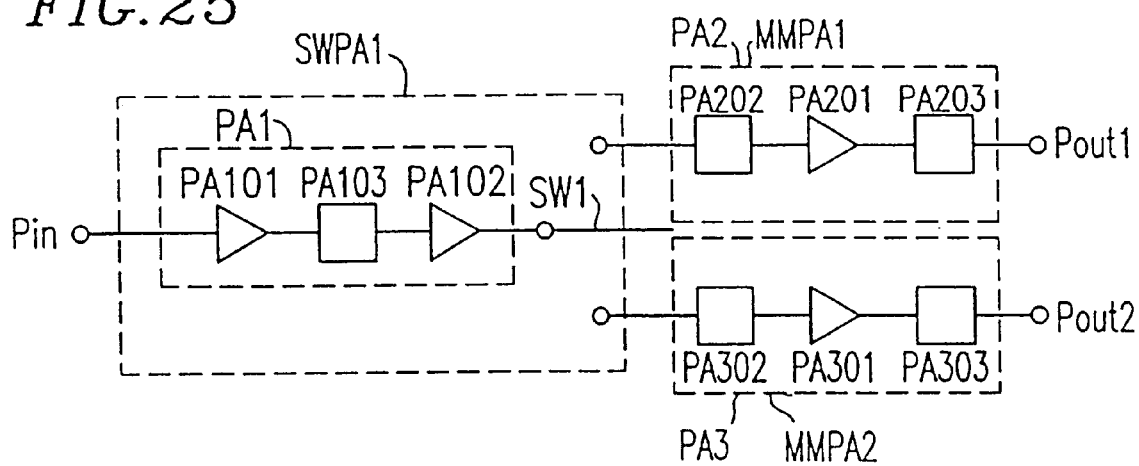
FIG. 25 is a configuration diagram of the fourth example of the switchable power amplifier according to the present invention.
Figure 26:
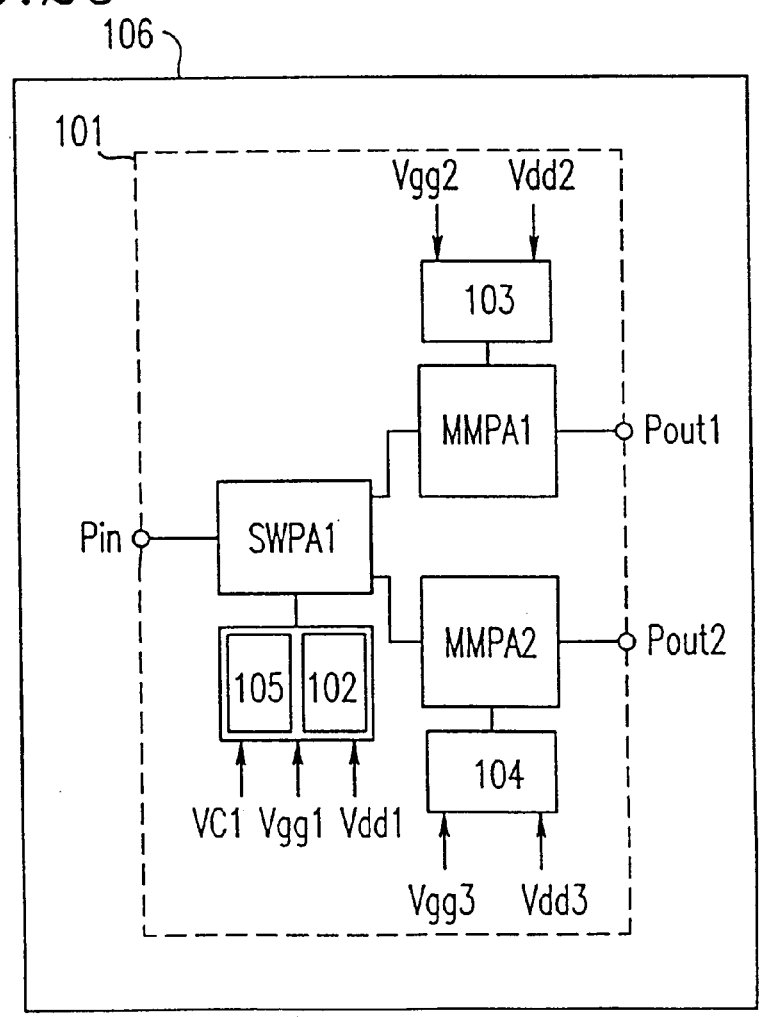
FIG. 26 is a configuration diagram of the switchable power amplifier in the fourth example.
Figure 27:
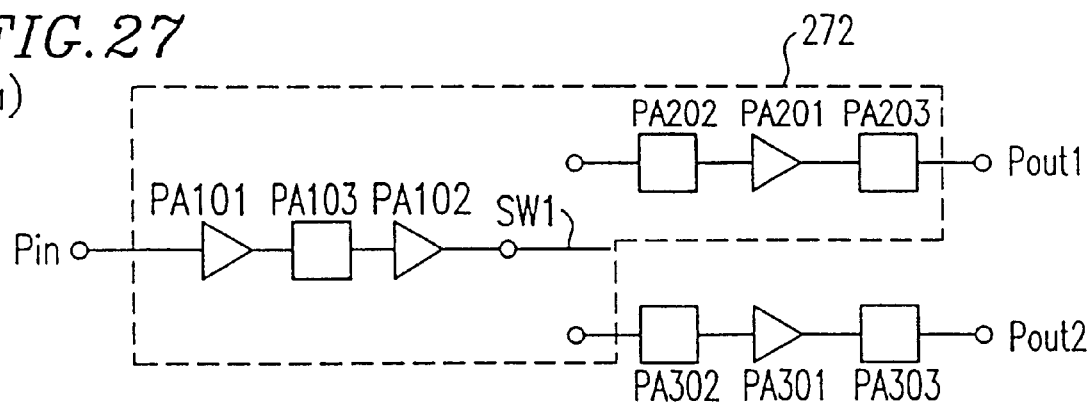
FIGS. 27a–d are a diagram showing parts implemented as MMICs in the fourth example.
Figure 27:
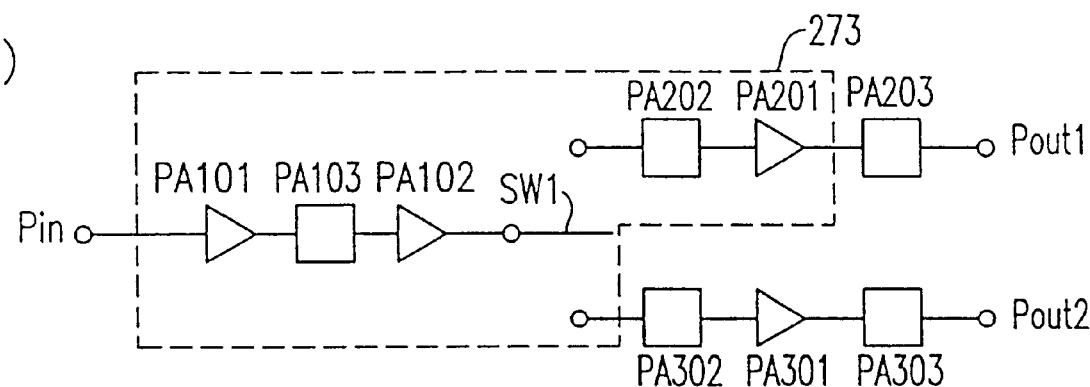
Figure 27:
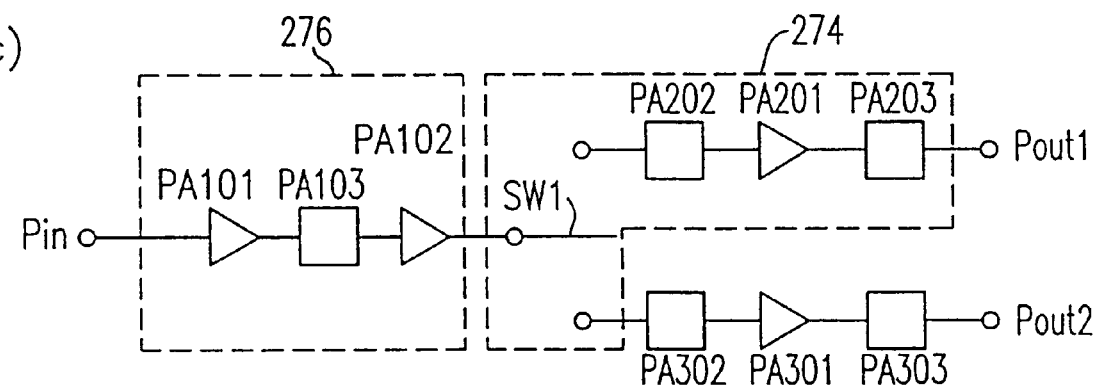
Figure 27:
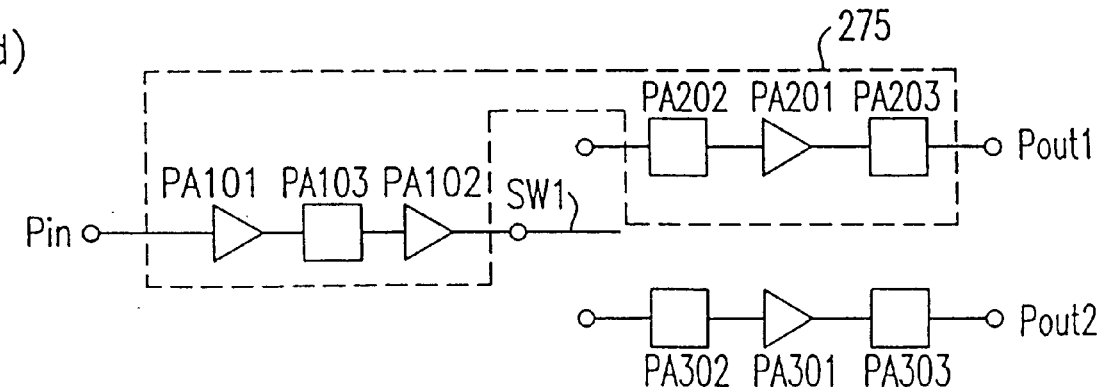

FIGS. 25 and 26 are diagrams illustrating the fourth example of the switchable power amplifier according to the present invention. This switchable power amplifier has a function of transmitting RF signals having two different frequencies and two different output powers by using wide-band power amplifiers as a driver power amplifier (or driver amp) of the power amplifier on the final output stage and a pre-driver power amplifier (or pre-driver amp) and temporally synchronizing the switching of the respective switches. The power amplifier defined with reference to FIGS. 19 and 20 in the third example is used as the wide-band power amplifier (including the above-described multi-frequency matching power amplifier). By using such a wide-band power amplifier, the input matching circuits and redundant switches which are required in the first and the second examples can be eliminated, thereby obtaining a smaller-sized higher-performance switchable power amplifier.

The power amplifier of this example transmits RF signals having the following frequencies f and the following output powers Pout as shown in the following table.

|  | f | Pout | Communication type |
|---|---|---|---|
| Mode 1 | f1 | 1.9 GHz | Pout1 | 22 dBm | Digital Modulation |
| Mode 2 | f2 | 2.4 GHz | Pout2 | 26 dBm | Digital Modulation |

Mode 1: π/4 shift DQPSK modulation type
Mode 2: spread spectrum (SS) QPSK modulation type FIG. 25 is a configuration diagram of the switchable power amplifier in the fourth example of the present invention. A second power amplifier PA2 for Mode 1 and a third power amplifier PA3 for Mode 2 are connected to the output side of a first power amplifier PA1 via a first single-pole-dual-throw switch SW1.

The first power amplifier PA1 includes: a first GaAs MESFET PA101; a first inter-stage matching circuit PA103; and a second GaAs MESFET PA102. The second power amplifier PA2 includes: a third GaAs MESFET PA201; a second inter-stage matching circuit PA202; and a first output matching circuit PA203. The third power amplifier PA3 includes: a fourth GaAs MESFET PA301; a third inter-stage matching circuit PA302; and a second output matching circuit PA303.

The first and the second GaAs MESFETs PA101 and PA102 of the first power amplifier PA1, the third GaAs MESFET PA201 of the second power amplifier PA2 and the fourth GaAs MESFET PA301 of the third power amplifier PA3 are of a depletion type and have gate widths (Wg) of 0.6 mm, 2 mm, 4 mm and 8 mm, respectively.

The first power amplifier PA1 and the first single-pole-dual-throw switch SW1 are integrated on a GaAs substrate (thereby forming a first switch-integrated power amplifier SWPA1). The components of the second power amplifier PA2 or the third GaAs MESFETs PA201, the second inter-stage matching circuit PA202 and the first output matching circuit PA203 are integrated on a GaAs substrate (thereby forming a first integrated power amplifier MMPA1). The components of the third power amplifier PA3 or the fourth GaAs MESFETs PA301, the third inter-stage matching circuit PA302 and the second output matching circuit PA303 are integrated on a GaAs substrate (thereby forming a second integrated power amplifier MMPA2). Then, the first, second and third power amplifiers SWPA1, MMPA1 and MMPA2 are sealed within resin-molded packages, respectively.

An integrated circuit including a GaAs MESFET is used as the first single-pole-dual-throw switch SW1 (as to an exemplary circuit configuration, see FIG. 15 in the second example).

The operating power supply voltages of the first, second, third and fourth GaAs MESFETs PA101, PA102, PA201 and PA301 are as follows. Specifically, the drain voltages thereof are about 3.5 V and the gate voltages thereof are negative voltages in the range from −2.0 V to −3.0 V. The first and the second GaAs MESFETs PA101 and PA102 are operated while paying much respect to the gain thereof and the third and the fourth GaAs MESFETs PA201 and PA301 are operated in a class AB (with an idle current corresponding to about 10% of Idss) while paying much respect to the linearity of the input/output characteristics and the digital distortion characteristics thereof. The GaAs MESFETs PA101, PA102, PA201 and PA301 have Idss of about 160 mA, about 550 mA, about 900 mA and about 1.7 A, respectively.

On the other hand, the first single-pole-dual-throw switch SW1 is operated while applying control voltages of 0 V and −4.7 V thereto.

In the switchable power amplifier of this example, by using wide-band power amplifiers as the first and the second power amplifiers PA1 and PA2, an input matching circuit and a switch for switching the input matching circuit which is required in the first and the second examples can be eliminated.

In general, the four types of methods shown in FIGS. 22(a) to 22(d) in the third example are used for realizing a wide-band operation of such a power amplifier. In this example, the method shown in FIG. 22(a) in which a negative feedback circuit or a serial circuit including a resistance and a capacitor is inserted to between the input and the output of the GaAs MESFET is used.

The resistance and the capacitor of the negative feedback circuit of each of the first and the second GaAs MESFETs PA101 and PA102 are integrated with the first switch-integrated power amplifier SWPA1 and then sealed within a resin-molded package.

In determining the parameters of the matching circuits, those of the second and the third inter-stage matching circuits PA202 and PA302 are determined in view of a matching between the output impedances of the second GaAs MESFET PA102 and the input impedances of the third and the fourth GaAs MESFETs PA201 and PA301 at the frequencies f1 and f2. The first inter-stage matching circuit PA103 within the first switch-integrated power amplifier SWPA1 is implemented by a coupling capacitor so as to perform a multi-stage RF coupling (or to block the DC components). The first inter-stage matching circuit PA103 may also be a passive circuit including lumped constant elements. In conformity with the implementations of the matching circuits described in the first example, the parameters of the first and the second output matching circuits PA203 and PA303 are determined. As a result, the distortion characteristics required for the π/4 shift DQPSK modulation type and the spread spectrum (SS) QPSK modulation type in this example are satisfied.

In each of the matching circuits, the equivalent circuit thereof is represented by a combination of lumped constant element components. Each of the second and the third inter-stage matching circuits PA202 and PA302 and the first and the second output matching circuits PA203 and PA303 is formed by a combination of a microstrip line, a spiral inductor, an MIM (metal-insulator-metal) capacitor, a comb capacitor, a thin-film resistance (such as NiCr) and the like on a GaAs substrate.

FIG. 26 is a configuration diagram of the switchable power amplifier in the fourth example. The respective components of the above-described switchable power amplifier 101 of this example, the drain voltage/gate voltage supply section 102 for the first and the second GaAs MESFETs PA101 and PA102, the drain voltage/gate voltage supply sections 103 and 104 for the third and the fourth GaAs MESFETs PA201 and PA301 and the control voltage supply section 105 for the first single-pole-dual-throw switch SW1 are mounted on a printed circuit board 106.

Vdd1/Vgg1 denote the drain voltage/gate voltage to be supplied to the first and the second GaAs MESFETs PA101 and PA102. Vdd2/Vgg2 and Vdd3/Vgg3 denote the drain voltages/gate voltages to be supplied to the third and the fourth GaAs MESFETs PA201 and PA301, respectively. VC1 denotes the control voltage to be supplied to the first single-pole-dual-throw switch SW1.

The power supply controls of the drain voltage/gate voltage supply sections (or power supply controllers) 102, 103 and 104 are performed in association with that of the control voltage supply section (or feeder) 105 for the first single-pole-dual-throw switch SW1. For example, when Pout1 is selected as the output, the feeder is controlled such that SW1 selects Pout1. The drain voltage/gate voltage supply section 104 is controlled such that the unused PA301 is deactivated for reducing the power consumption.

The drain voltage/gate voltage supply section is implemented by a chip inductor as a choke and a bypass capacitor or by a microstrip line for mounting a switchable power amplifier on a printed circuit board and a bypass capacitor.

It is noted that, when the output powers defined in Modes 1 and 2 are different as in this example or when the transmission/reception conditions of the RF signals are variable, it is necessary to vary or stabilize the output powers. Thus, since a gain control function for stabilizing an output power and holding a constant power is indispensable as a function of a transmission power amplifier, an attenuator or a power amplifier having an auto gain control (AGC) or an auto level control (ALC) function is integrated into the power amplifier, thereby feedbacking and controlling the monitored output power. The output power can be monitored by a capacitance coupling or a directional coupler (as to exemplary configurations, see FIGS. 5 and 6 in the first example).

By integrating the RF section 120, the IF signal processing section 121 and the base band section 122, which are shown in the block diagram of an information communication unit in FIG. 7 in the first example, on at least one printed circuit board (e.g., a dielectric substrate or the like) so as to include the switchable power amplifier 101 of this example and collectively mounting them into the case of an information communication unit, the unit can be downsized at lower costs as compared with a conventional example. As a result, a highly value-added information communication terminal unit commonly applicable to systems having different frequency bands, transmission output powers and modulation types can be obtained.

As specific exemplary implementations of the information communication unit, the implementations shown in FIGS. 8 to 10 in the first example (i.e, an implementation in which switches for switching transmission/reception for Modes 1 and 2 are connected to the switchable power amplifier and an implementation in which switches for performing diversity transmission/reception is connected thereto) are usable. By utilizing these implementations, the transmission and reception can be performed with respect to Modes 1 and 2.

Alternatively, as shown in FIG. 11 in the first example, by commonly using a single antenna section in Modes 1 and 2 and connecting the switch for switching the output powers of the switchable power amplifier for Modes 1 and 2 to the switch for switching transmission and reception, the transmission and reception can also be performed with respect to Modes 1 and 2.

It is noted that the switchable power amplifier of this example may also be implemented under the following specific configurations. The following MMIC implementations described in (272) to (276) are representative practical ones in respects of the costs, the production yield of a chip and the like. However, the implementations are not limited thereto, but include the exemplary configurations and mounting methods of hybrid ICs and MMICs as described in the first example. FIGS. 27(a) to 27(d) are diagrams showing parts to be implemented as MMICs in the fourth example. The following descriptions (272) to (276) correspond to the reference numerals attached to the broken line portions shown in FIG. 27.

(271): Implement GaAs MESFETs, switches, matching circuits and other peripheral circuits as hybrid ICs. The GaAs MESFETs having Wg of 1 mm and 4 mm are sealed within resin-molded packages, while the GaAs MESFET having wg of 8 mm is mounted in a ceramic package (i.e., mounted on a ceramic carrier and then sealed with a resin). Various chip components such as a chip inductor, a chip capacitor and a chip resistor are used as the matching circuits.

(272): Integrate at least one of the first integrated power amplifier MMPA1 and the second integrated power amplifier MMPA2 into the first switch-integrated power amplifier SWPA1.

(273): Integrate at least one of the part of the second power amplifier PA2 excluding the first output matching circuit PA203 and the part of the third power amplifier PA3 excluding the second output matching circuit PA303 into the first switch-integrated power amplifier SWPA1.

(274): Integrate the first single-pole-dual-throw switch SW1 with at least one of the second power amplifier PA2 and the third power amplifier PA3 on a GaAs substrate.

(275): Integrate the first power amplifier PA1 with at least one of the second power amplifier PA2 and the third power amplifier PA3 on a GaAs substrate.

(276): Form multiple chips including a chip formed by integrating the first single-pole-dual-throw switch SW1 with at least one of the second power amplifier PA2 and the third power amplifier PA3 on a GaAs substrate and a chip formed by integrating the first power amplifier PA1 on the GaAs substrate. Mounting is performed by introducing the multiple chips into a package or connecting the multiple chips onto a printed circuit board in a bare chip manner.

In (274) to (276), a chip implemented as an MMIC has been sealed within a resin-molded package or mounted in a bare chip manner, and each of the matching circuits implemented within an MMIC includes a combination of a microstrip line, a spiral inductor, an MIM (metal-insulator-metal) capacitor, a comb capacitor, a thin-film resistance (such as NiCr) and the like on a GaAs substrate. On the other hand, the components not implemented within the MMIC are individually mounted on a printed circuit board.

It is noted that an MMIC implementation includes implementing the first, second or third power amplifier PA1, PA2 or PA3 as an MMIC and selectively implementing the components of each power amplifier (active elements, passive circuits and the like) as an MMIC (e.g., implementing all the components of the second or the third power amplifier PA2 or PA3 other than the output matching circuit thereof as an MMIC). It is also noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

The second and the third power amplifiers PA2 and PA3 in this example are single-stage amplifiers. Alternatively, multi-stage amplifiers like the first power amplifier PA1 may also be used instead.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using a single-pole-dual-throw switch. However, a desired power amplifier and a desired information communication unit may be formed even by the use of a single-pole-multi-throw switch having multiple (three or more) throw terminals, a multi-pole-dual-throw switch having multiple (two or more) pole terminals or a multi-pole-multi-throw switch collectively as the selecting switch.

The power amplifier of this example can be implemented not only under the above-described specifications but also under the following specifications.

|  | f |  | Pout | Communication type |
|---|---|---|---|---|
| Mode 1 | f1 | 900 MHz | Pout1 31 dBm | Analog Modulation |
| Mode 2 | f2 | 1.5 GHz | Pout2 31 dBm | Digital Modulation |

Mode 1: FM modulation type
Mode 2: π/4 shift DQPSK modulation type

Moreover, RF signals having substantially equal Pout1 and Pout 2 and different f1 and f2 may be transmitted. For example, the following RF signals may be transmitted.

|  | f |  | Pout | Communication type |
|---|---|---|---|---|
| Mode 1 | f1 | 900 MHz | Pout1 31 dBm | Digital Modulation |
| Mode 2 | f2 | 1.5 GHz | Pout2 31 dBm | Digital Modulation |

Mode 1: π/4 shift DQPSK modulation type
Mode 2: π/4 shift DQPSK modulation type

EXAMPLE 5

Figure 28:
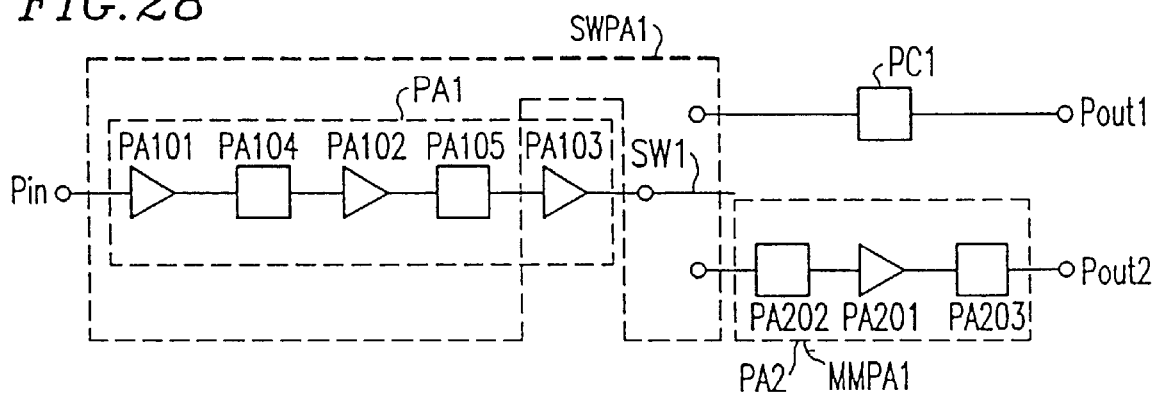
FIG. 28 is a configuration diagram of the fifth example of the switchable power amplifier according to the present invention.
Figure 29:
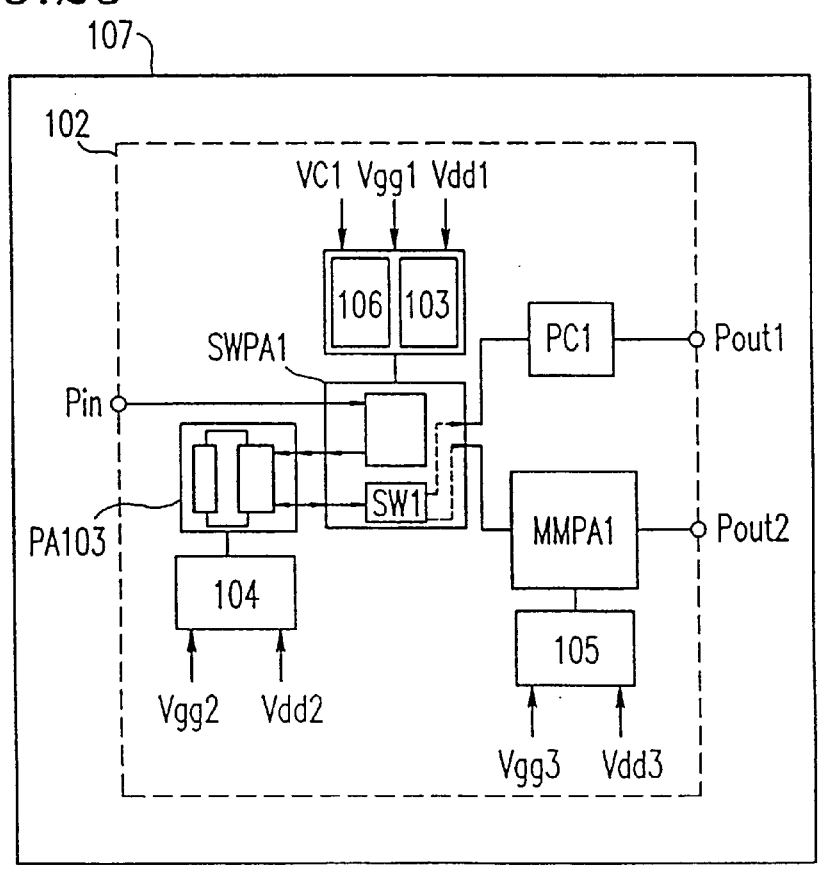
FIG. 29 is a configuration diagram of the switchable power amplifier in the fifth example.
Figure 30:
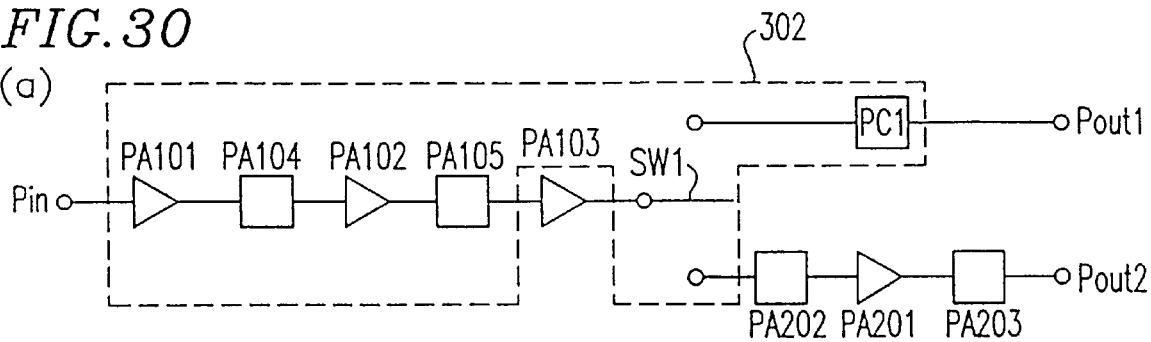
FIGS. 30a–c are a diagram showing parts implemented as MMICs in the fifth example.
Figure 30:
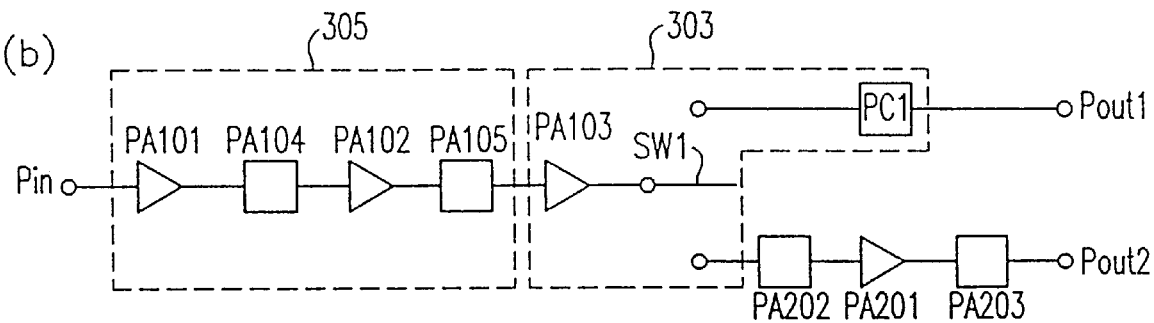
Figure 30:
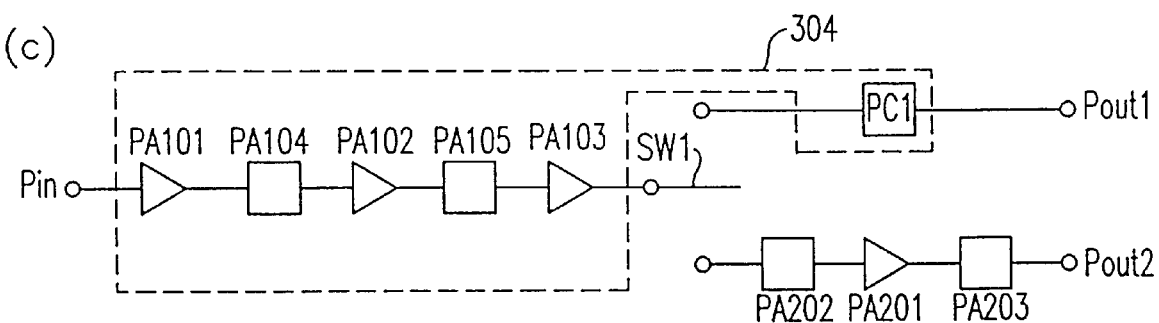

FIGS. 28 to 30 are diagrams illustrating the fifth example of the switchable power amplifier according to the present invention. This switchable power amplifier has a function of transmitting RF signals having two different frequencies and two different output powers by using wide-band power amplifiers as a driver power amplifier (or driver amp) of the power amplifier on the final output stage, a pre-driver power amplifier (or pre-driver amp) and a pre-driver power amplifier on an initial stage and by temporally synchronizing the switching of the respective switches. The power amplifier defined with reference to FIGS. 19 and 20 in the third example is used as the wide-band power amplifier (including the above-described multi-frequency matching power amplifier). By using such a wide-band power amplifier, the input matching circuit and redundant switches which are required in the first and the second examples can be eliminated, thereby obtaining a smaller-sized higher-performance switchable power amplifier.

In this example, RF signals having the following frequencies f and the following output powers Pout as shown in the following table are transmitted.

|  | f |  | Pout | Communication type |
|---|---|---|---|---|
| Mode 1 | f1 | 1.5 GHz | Pout1 31 dBm | Digital Modulation |
| Mode 2 | f2 | 1.9 GHz | Pout2 22 dBm | Digital Modulation |

Mode 1: π/4 shift DQPSK modulation type
Mode 2: π/4 shift DQPSK modulation type

FIG. 28 is a configuration diagram of the fifth example of the switchable power amplifier according to the present invention. A first single-pole-dual-throw switch SW1, a first output matching circuit PC1 for Mode 1 and a second power amplifier PA2 for Mode 2 are connected to the output side of a first power amplifier PA1. The first power amplifier PA1 includes: a first GaAs MESFET PA101; a first inter-stage matching circuit PA104; a second GaAs MESFET PA102; a second inter-stage matching circuit PA105; and a third GaAs MESFET PA103. The second power amplifier PA2 includes: a fourth GaAs MESFET PA201; a third inter-stage matching circuit PA202; and a second output matching circuit PA203.

The first, second and third GaAs MESFETs PA101, PA102 and PA103 of the first power amplifier PA1 and the fourth GaAs MESFET PA201 of the second power amplifier PA2 are of a depletion type and have gate widths (Wg) of 0.6 mm, 2.0 mm, 6.0 mm and 30 mm, respectively.

The first GaAs MESFET PA101, the first interstage matching circuit PA104, the second GaAs MESFET PA102 and the second inter-stage matching circuit PA105 among the components of the first power amplifier PA1 and the first single-pole-dual-throw switch SW1 are integrated on a GaAs substrate (thereby forming a first switch-integrated power amplifier SWPA1). The components of the second power amplifier PA2 or the fourth GaAs MESFETs PA201, the third inter-stage matching circuit PA202 and the second output matching circuit PA203 are integrated on a GaAs substrate (thereby forming a first integrated power amplifier MMPA1) and then sealed within a resin-molded package. The fourth GaAs MESFET PA201 having Wg of 30 mm is mounted in a ceramic package (mounted on a ceramic carrier and then sealed with a resin).

An integrated circuit including a GaAs MESFET is used as the first single-pole-dual-throw switch SW1 (as to an exemplary circuit configuration, see FIG. 15 in the second example).

The operating power supply voltages of the first, second, third and fourth GaAs MESFETs PA101, PA102, PA103 and PA201 are as follows. Specifically, the drain voltages thereof are about 3.5 V and the gate voltages thereof are negative voltages in the range from about −2.0 V to about −3.0 V. The first and the second GaAs MESFETs PA101 and PA102 are operated while paying much respect to the gain thereof and the third and the fourth GaAs MESFETs PA103 and PA201 are operated in a class AB (with an idle current corresponding to about 10% of Idss) while paying much respect to the linearity of the input/output characteristics and the digital distortion characteristics thereof. The GaAs MESFETs PA101, PA102, PA103 and PA201 have Idss of about 160 mA, 550 mA, 1.3 A and 7.0 A, respectively.

On the other hand, the first single-pole-dual-throw switch SW1 is operated while applying control voltages of 0 V and −4.7 V thereto.

In the switchable power amplifier of this example, by using wide-band power amplifiers as the first and the second power amplifiers PA1 and PA2, an input matching circuit and a switch for switching the input matching circuit which is required in the first and the second examples can be eliminated.

In general, the four types of methods shown in FIGS. 22(a) to 22(d) in the third example are used for realizing a wide-band operation of such a power amplifier. In this example, the method shown in FIG. 22(a) in which a negative feedback circuit or a serial circuit including a resistance and a capacitor is inserted to between the input and the output of the GaAs MESFET is used.

The resistance and the capacitor of the negative feedback circuit of each of the first and the second GaAs MESFETs PA101 and PA102 are integrated with the first switch-integrated power amplifier SWPA1 and then sealed within a resin-molded package. On the other hand, the resistance and the capacitor of the negative feedback circuit 101 of the third GaAs MESFET PA103 are implemented as external circuits by using chip components.

In determining the parameters of the matching circuits, those of the third inter-stage matching circuits PA202 are determined such that the output impedance of the third GaAs MESFET PA103 is matched with the input impedance of the fourth GaAs MESFETs PA201 at the frequency f2.

The first and the second inter-stage matching circuit PA104 and PA105 within the first switch-integrated power amplifier SWPA1 are implemented by coupling capacitors so as to perform an RF coupling on the respective stages (or to block the DC components). The first and the second inter-stage matching circuits PA104 and PA105 may also be passive circuits including lumped constant elements.

In conformity with the implementations of the matching circuits described in the first example, the parameters of the first and the second output matching circuits PC1 and PA203 are determined. As a result, the distortion characteristics required for the π/4 shift DQPSK modulation type in this example are satisfied.

In each of the matching circuits, the equivalent circuit thereof is represented by a combination of lumped constant element components. Each of the first and the second inter-stage matching circuits PA104 and PA105 is formed by a combination of a microstrip line, a spiral inductor, an MIM (metal-insulator-metal) capacitor, a comb capacitor, a thin-film resistance (such as NiCr) and the like on a GaAs substrate.

The first and the second output matching circuits PC1 and PA203 and the third inter-stage matching circuit PA202 are formed by using various chip components such as a chip inductor, a chip capacitor and a chip resistor.

FIG. 29 is a configuration diagram of the switchable power amplifier in the fifth example. The respective components of the above-described switchable power amplifier 102 of this example, the drain voltage/gate voltage supply section 103 for the first and the second GaAs MESFETs PA101 and PA102, the drain voltage/gate voltage supply sections 104 and 105 for the third and the fourth GaAs MESFETs PA103 and PA201 and the control voltage supply section 106 for the first single-pole-dual-throw switch SW1 are mounted on a printed circuit board 107.

Vdd1/Vgg1 denote the drain voltage/gate voltage to be supplied to the first and the second GaAs MESFETs PA101 and PA102. Vdd2/Vgg2 and Vdd3/Vgg3 denote the drain voltages/gate voltages to be supplied to the third and the fourth GaAs MESFETs PA103 and PA201, respectively. VC1 denotes the control voltage to be supplied to the first single-pole-dual-throw switch SW1.

The power supply controls of the drain voltage/gate voltage supply sections (or power supply controllers) 103, 104 and 105 are performed in association with that of the control voltage supply section (or feeder) 106 for the first single-pole-dual-throw switch SW1. For example, when Pout1 is selected as the output, the feeder is controlled such that SW1 selects Pout1. The drain voltage/gate voltage supply section 105 is controlled such that the unused PA201 is deactivated for reducing the power consumption.

The drain voltage/gate voltage supply section is implemented by a chip inductor as a choke and a bypass capacitor or by a microstrip line for mounting a switchable power amplifier on a printed circuit board and a bypass capacitor.

It is noted that, when the output powers defined in Modes 1 and 2 are different as in this example or when the transmission/reception conditions of the RF signals are variable, it is necessary to vary or stabilize the output powers. Thus, since a gain control function for stabilizing an output power and holding a constant power is indispensable as a function of a transmission power amplifier, an attenuator or a power amplifier having an auto gain control (AGC) or an auto level control (ALC) function is integrated into the power amplifier, thereby feedbacking and controlling the monitored output power. The output power can be monitored by a capacitance coupling or a directional coupler (as to exemplary configurations, see FIGS. 5 and 6 in the first example).

By integrating the RF section 120, the IF signal processing section 121 and the base band section 122, which are shown in the block diagram of an information communication unit in FIG. 7 in the first example, on at least one printed circuit board (e.g., a dielectric substrate or the like) so as to include the switchable power amplifier 102 of this example and collectively mounting them into the case of an information communication unit, the unit can be downsized at lower costs as compared with a conventional example. As a result, a highly value-added information communication terminal unit commonly applicable to systems having different frequency bands, transmission output powers and modulation types can be obtained.

As specific exemplary implementations of the information communication unit, the implementations shown in FIGS. 8 to 10 in the first example (i.e, an implementation in which switches for switching transmission/reception for Modes 1 and 2 are connected to the switchable power amplifier and an implementation in which switches for performing diversity transmission/reception is connected thereto) are usable. By utilizing these implementations, the transmission and reception can be performed with respect to Modes 1 and 2.

Alternatively, as shown in FIG. 11 in the first example, by commonly using a single antenna section in Modes 1 and 2 and connecting the switch for switching the output powers of the switchable power amplifier for Modes 1 and 2 to the switch for switching transmission and reception, the transmission and reception can also be performed with respect to Modes 1 and 2.

It is noted that the switchable power amplifier of this example may also be implemented under the following specific configurations. The following MMIC implementations described in (302) to (305) are representative practical ones in respects of the costs, the production yield of a chip and the like. However, the implementations are not limited thereto, but include the exemplary configurations and mounting methods of hybrid ICs and MMICs as described in the first example. FIGS. 30(a) to 30(c) are diagrams showing parts to be implemented as MMICs in the fifth example. The following descriptions (302) to (305) correspond to the reference numerals attached to the broken line portions shown in FIG. 30.

(301): Implement GaAs MESFETs, a switch, matching circuits and other peripheral circuits as hybrid ICs. The GaAs MESFETs having Wg of 0.6 mm, 2 mm and 6 mm are sealed within resin-molded packages, while the GaAs MESFET having Wg of 30 mm is mounted in a ceramic package (i.e., mounted on a ceramic carrier and then sealed with a resin). Various chip components such as a chip inductor, a chip capacitor and a chip resistor are used as the matching circuits and the negative feedback circuit.

(302): Integrate the first output matching circuit PC1 or the second output matching circuit PA203 into the first switch-integrated power amplifier SWPA1 and mold them with a resin.

(303): Integrate the third GaAs MESFET PA103 with the first single-pole-dual-throw switch SW1 on a GaAs substrate (thereby forming a second switch-integrated power amplifier SWPA2), integrate the first output matching circuit PC1 or the second output matching circuit PA202 thereto and then mold them with a resin. It is noted that the negative feedback circuit 101 of the third GaAs MESFET PA103 may be implemented as an integrated circuit component or an external circuit component.

(304): Integrate the components of the first power amplifier PA1 with at least one of the first output matching circuit PC1 and the second output matching circuit PA203 on a GaAs substrate and then mold them with a resin.

(305): Form multiple chips including a chip formed by integrating the third GaAs MESFET PA103 with the first single-pole-dual-throw switch SW1 on a GaAs substrate (the second switch-integrated power amplifier SWPA2) and a chip formed by integrating the first and the second GaAs MESFETs PA101 and PA102 and the first and the second inter-stage matching circuits PA104 and PA105 on a GaAs substrate (the first integrated power amplifier MMPA1). Mounting is performed by introducing the multiple chips into a package or connecting the multiple chips onto a printed circuit board in a bare chip manner.

In these implementations (302), (303), (304) and (305), a chip implemented as an MMIC has been sealed within a resin-molded package or mounted in a bare chip manner, and each of the matching circuits included within an MMIC includes a combination of a microstrip line, a spiral inductor, an MIM (metal-insulator-metal) capacitor, a comb capacitor, a thin-film resistance (such as NiCr) and the like on a GaAs substrate. On the other hand, the components not included within the MMIC are individually mounted on a printed circuit board.

It is noted that an MMIC implementation includes implementing the first or the second power amplifier PA1 or PA2 as an MMIC and selectively implementing the components of each power amplifier (active elements, passive circuits and the like) as an MMIC (e.g., implementing all the components of the second power amplifier PA2 other than the output matching circuit thereof as an MMIC).

It is also noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

The second power amplifier PA2 in this example is a single-stage amplifier. Alternatively, a multi-stage amplifier like the first power amplifier PA1 may also be used instead.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using a single-pole-dual-throw switch. However, a desired power amplifier and a desired information communication unit may be formed even by the use of a single-pole-multi-throw switch having multiple (three or more) throw terminals, a multi-pole-dual-throw switch having multiple (two or more) pole terminals or a multi-pole-multi-throw switch collectively as the selecting switch.

The power amplifier of this example can be implemented not only under the above-described specifications but also under the following specifications.

| | f | Pout | Communication type |
|---|---|---|---|
| Mode 1 | f1 | 900 MHz | Pout1 | 31 dBm | Digital Modulation |
| Mode 2 | f2 | 1.9 GHz | Pout2 | 22 dBm | Digital Modulation |

Mode 1: π/4 shift DQPSK modulation type
Mode 2: π/4 shift DQPSK modulation type

| | f | Pout | Communication type |
|---|---|---|---|
| Mode 1 | f1 | 1.9 GHz | Pout1 | 22 dBm | Digital Modulation |
| Mode 2 | f2 | 900 MHz | Pout2 | 31 dBm | Analog Modulation |

Mode 1: π/4 shift DQPSK modulation type
Mode 2: FM modulation type

In the latter specifications, in the analog FM modulation type in Mode 2, a nonlinear saturation power amplifier may also be used as a power amplifier and matching is performed with respect to the second output matching circuit PA203 such that a high power added efficiency and a high harmonics suppression ratio are obtained at the defined output power of 31 dBm. On the other hand, matching is performed with respect to the first output matching circuit PC1 such that an adjacent channel leakage power is suppressed to minimal levels and a high power added efficiency can be attained at the defined output power of 22 dBm.

EXAMPLE 6

FIGS. 31 to 34 are diagrams illustrating the sixth example of the switchable power amplifier according to the present invention. This switchable power amplifier has a function of transmitting RF signals having two different frequencies and two different output powers by using wide-band power amplifiers as a driver power amplifier (or driver amp) of the power amplifier on the final output stage, a pre-driver power amplifier (or pre-driver amp) and a pre-driver power amplifier on an initial stage and by temporally synchronizing the switching of the respective switches. The power amplifier defined with reference to FIGS. 19 and 20 in the third example is used as the wide-band power amplifier (including the above-described multi-frequency matching power amplifier). By using such a wide-band power amplifier, the input matching circuits and redundant switches which are required in the first and the second examples can be eliminated, thereby obtaining a smaller-sized higher-performance switchable power amplifier.

In the sixth example, RF signals having the following frequencies f and the following output powers Pout as shown in the following table are transmitted.

|  | f | Pout |  | Communication type |
|---|---|---|---|---|
| Mode 1 | f1 | 900 MHz | Pout1 | 31 dBm | Digital Modulation |
| Mode 2 | f2 | 1.5 GHZ | Pout2 | 31 dBm | Digital Modulation |

Mode 1: π/4 shift DQPSK modulation type
Mode 2: π/4 shift DQPSK modulation type

Figure 31:
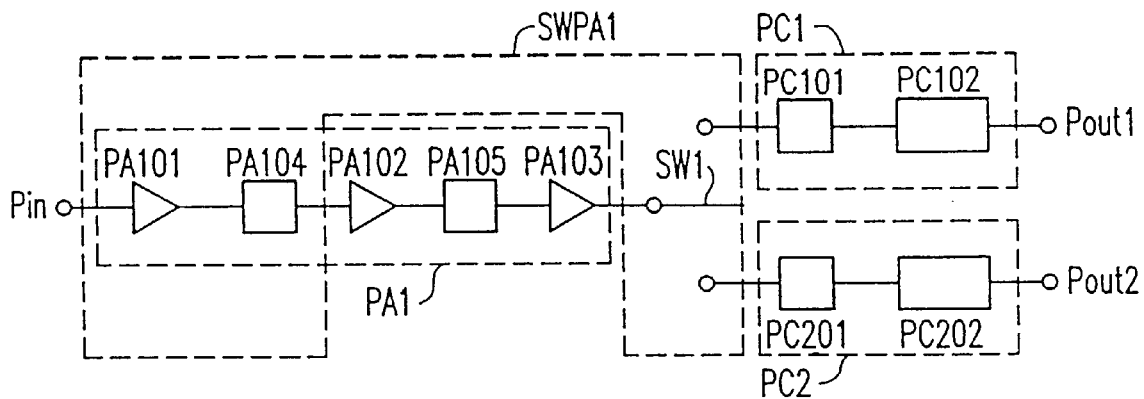
FIG. 31 is a configuration diagram of the sixth examples of the switchable power amplifier according to the present invention.

FIG. 31 is a configuration diagram of the sixth example of the switchable power amplifier according to the present invention. A first single-pole-dual-throw switch SW1, a first passive circuit PC1 for Mode 1 and a second passive circuit PC2 for Mode 2 are connected to the output side of a first power amplifier PA1. The first power amplifier PA1 includes: a first GaAs MESFET PA101; a first inter-stage matching circuit PA104; a second GaAs MESFET PA102; a second inter-stage matching circuit PA105; and a third GaAs MESFET PA103. The first passive circuit PC1 includes a first output matching circuit PC101 and a first filter PC102. The second passive circuit PC2 includes a second output matching circuit PC201 and a second filter PC202.

The first, second and third GaAs MESFETs PA101, PA102 and PA103 as the components of the first power amplifier PA1 are of a depletion type and have gate widths (Wg) of 1 mm, 6 mm and 30 mm, respectively.

The first GaAs MESFET PA101 and the first interstage matching circuit PA104 among the components of the first power amplifier PA1 and the first single-pole-dual-throw switch SW1 are integrated on a GaAs substrate (thereby forming a first switch-integrated power amplifier SWPA1) and then sealed within a resin-molded package. The second GaAs MESFET PA102 having Wg of 6 mm is mounted within a resin-molded package and the third GaAs MESFET PA103 having Wg of 30 mm is mounted in a ceramic package (mounted on a ceramic carrier and then sealed with a resin).

An integrated circuit including a GaAs MESFET is used as the first single-pole-dual-throw switch SW1 (as to an exemplary circuit configuration, see FIG. 15 in the second example).

The operating power supply voltages of the first, second and third GaAs MESFETs PA101, PA102 and PA103 are as follows. Specifically, the drain voltages thereof are 3.5 V and the gate voltages thereof are negative voltages in the range from −2.0 V to −3.0 V. The first GaAs MESFET PA101 is operated while paying much respect to- the gain thereof and the second and the third GaAs MESFETs PA102 and PA103 are operated in a class AB (with an idle current corresponding to about 10% of Idss) while paying much respect to the linearity of the input/output characteristics and the digital distortion characteristics thereof. The GaAs MESFETs PA101, PA102 and PA103 have Idss of about 250 mA, about 1.3 A and about 7.0 A, respectively.

On the other hand, the first single-pole-dual-throw switch SW1 is operated while applying control voltages of 0 V and −4.7 V thereto. In the switchable power amplifier of this example, by using a wide-band power amplifier as the first power amplifier PA1, an input matching circuit and a switch for switching the input matching circuit which is required in the first and the second examples can be eliminated.

In general, the four types of methods shown in FIGS. 22(*a*) to 22(*d*) in the third example are used for realizing a wide-band operation of such a power amplifier. In this example, the method shown in FIG. 22(*a*) in which a negative feedback circuit implemented as a serial circuit including a resistance and a capacitor is inserted to between the input and the output of the GaAs MESFET is used.

The resistance and the capacitor of the negative feedback circuit of the first GaAs MESFETs PA101 are integrated with the first switch-integrated power amplifier SWPA1 and then sealed within a resin-molded package. On the other hand, the resistance and the capacitor of the first negative feedback circuit 101 of the second GaAs MESFET PA102 are formed as external circuits by using chip components. As for the third GaAs MESFET PA103, a second negative feedback circuit is integrated therewith or implemented as an external circuit or as an impedance converter enabling a wide-band matching (i.e., matching the output impedances of the second GaAs MESFET PA102 with the input impedances of the third GaAs MESFET PA103 at the frequencies f1 and f2 or in a frequency band including f1 and f2) is used therefor.

In determining the parameters of the matching circuits, those of the third inter-stage matching circuits PA202 are determined such that the output impedance of the third GaAs MESFET PA103 is matched with the input impedance of the fourth GaAs MESFETs PA201 at the frequency f2.

The first inter-stage matching circuit PA104 is implemented by coupling capacitors so as to perform an RF coupling on the respective stages (or to block the DC components). The first and the second inter-stage matching circuits PA104 and PA105 may also be passive circuits including lumped constant elements.

In conformity with the implementations of the matching circuits described in the first example, the parameters of the first and the second output matching circuits PC101 and PC201 are determined. As a result, the distortion characteristics required for the π/4 shift DQPSK modulation type in this example are satisfied.

In each of the matching circuits, the equivalent circuit thereof is represented by a combination of lumped constant element components. When the first and the second inter-stage matching circuits PA104 and PA105 and the first and the second output matching circuits PC101 and PC201 are integrated on a GaAs substrate or the like, each of the matching circuits is formed by a combination of a microstrip line, a spiral inductor, an MIM (metal-insulator-metal) capacitor, a comb capacitor, a thin-film resistance (such as NiCr) and the like on a GaAs substrate.

The first and the second output matching circuits PC101 and PC201 and the second inter-stage matching circuit PA105 are formed by using various chip components such as a chip inductor, a chip capacitor and a chip resistor.

Each of the first and the second filters PC102 and PC202 is implemented as a band pass filter having a predetermined pass band width with respect to the frequencies f1 and f2 or as a combination of such a band pass filter and a low pass filter or a high pass filter including f1 and f2 in the pass band thereof. In general, a dielectric filter as a chip component, a surface acoustic wave filter (SAW filter) or the like is used as a filter.

Figure 32:
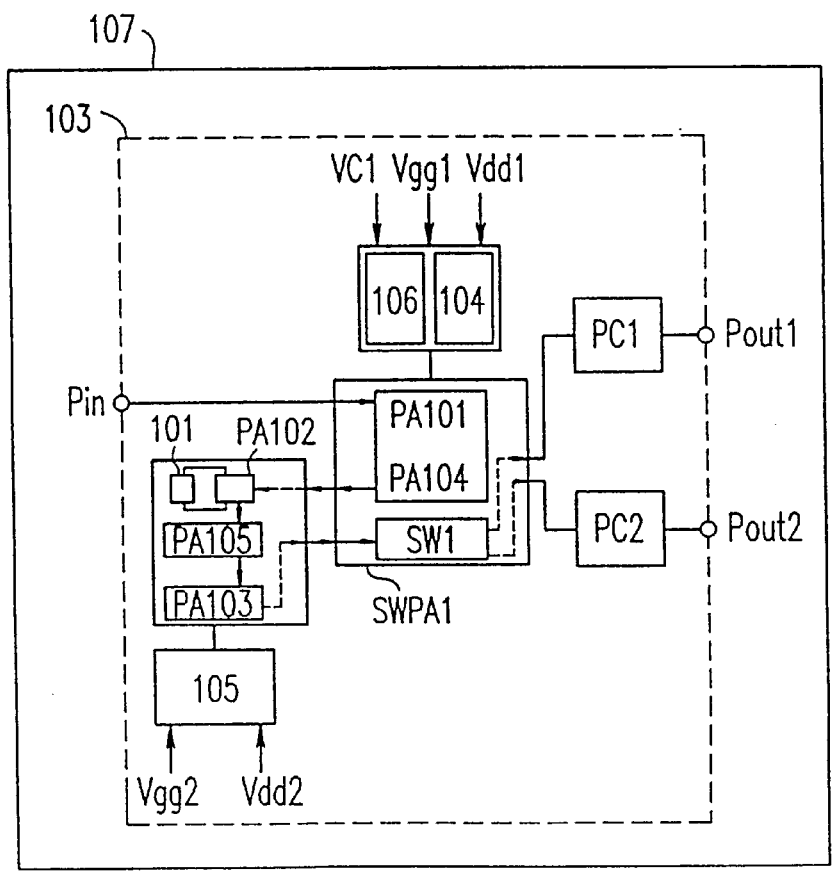
FIG. 32 is a configuration diagram of the switchable power amplifier in the sixth example.

FIG. 32 is a configuration diagram of the switchable power amplifier in the sixth example. The respective components of the above-described switchable power amplifier 103 of this example, the drain voltage/gate voltage supply section 104 for the first GaAs MESFET PA101, the drain voltage/gate voltage supply section 105 for the second and the third GaAs MESFETs PA102 and PA103 and the control voltage supply section 106 for the first single-pole-dual-throw switch SW1 are mounted on a printed circuit board 107.

Vdd1/Vgg1 denote the drain voltage/gate voltage to be supplied to the first GaAs MESFETs PA101. Vdd2/Vgg2 denote the drain voltage/gate voltage to be supplied to the second and the third GaAs MESFETs PA102 and PA103. VC1 denotes the control voltage to be supplied to the first single-pole-dual-throw switch SW1.

The power supply controls of the drain voltage/gate voltage supply sections (or power supply controllers) 104 and 105 are performed in association with that of the control voltage supply section (or feeders) 106 for the first single-pole-dual-throw switch SW1. For example, when Pout1 is selected as the output, the feeder is controlled such that SW1 selects Pout1.

The drain voltage/gate voltage supply section is implemented by a chip inductor as a choke and a bypass capacitor or by a microstrip line for mounting a switchable power amplifier on a printed circuit board and a bypass capacitor.

By integrating the RF section 120, the IF signal processing section 121 and the base band section 122, which are shown in the block diagram of an information communication unit in FIG. 7 in the first example, on at least one printed circuit board (e.g., a dielectric substrate or the like) so as to include the switchable power amplifier 103 of this example and collectively mounting them into the case of an information communication unit, the unit can be downsized at lower costs as compared with a conventional example. As a result, a highly value-added information communication terminal unit commonly applicable to systems having different frequency bands, transmission output powers and modulation types can be obtained.

As specific exemplary implementations of the information communication unit, the implementations shown in FIGS. 8 to 10 in the first example (i.e, an implementation in which switches for switching transmission/reception for Modes 1 and 2 are connected to the switchable power amplifier and an implementation in which switches for performing diversity transmission/reception is connected thereto) are usable. By utilizing these implementations, the transmission and reception can be performed with respect to Modes 1 and 2.

Alternatively, as shown in FIG. 11 in the first example, by commonly using a single antenna section in Modes 1 and 2 and connecting the switch for switching the output powers of the switchable power amplifier for Modes 1 and 2 to the switch for switching transmission and reception, the transmission and reception can also be performed with respect to Modes 1 and 2.

Figure 33:
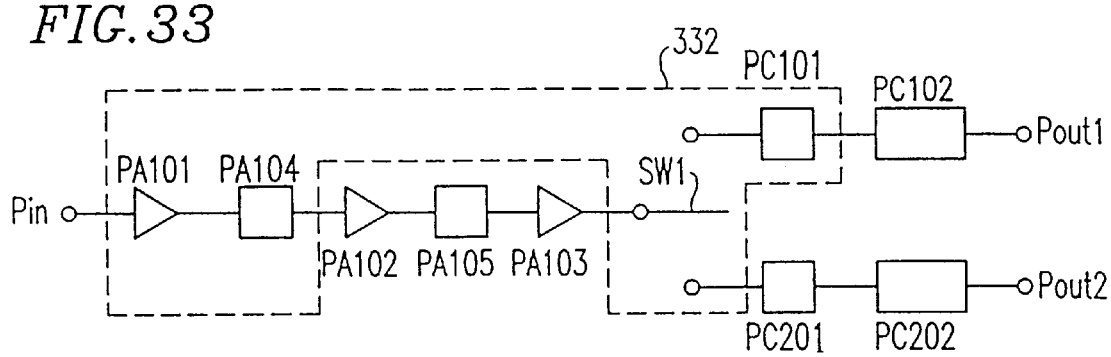
FIG. 33 is a diagram showing a part implemented as an MMIC in the sixth example.

It is noted that the switchable power amplifier of this example may also be implemented under the following specific configurations. (1) and (2) are practical in respects of the costs, the production yield of a chip and the like. As for (3), (4) and (5), the third GaAs MESFET PA103 having Wg of 30 mm is preferably mounted in a ceramic package in view of the thermal environment during the actual operation thereof, and thus is not suitable for being integrated with the other chips. Nevertheless, such a case will also be presented as an exemplary implementation. Furthermore, the exemplary configurations and mounting methods of hybrid ICs as described in the first example may also be used. FIG. 33 is a diagram showing a part to be implemented as an MMIC in the sixth example and corresponding to the description (2). In FIG. 33, the broken lines indicate a portion to be implemented as an MMIC.

(1): Implement GaAs MESFETs, a switch, matching circuits and other peripheral circuits as hybrid ICs. The GaAs MESFETs having Wg of 1 mm and 6 mm are sealed within resin-molded packages, while the GaAs MESFET having Wg of 30 mm is mounted in a ceramic package (i.e., mounted on a ceramic carrier and then sealed with a resin). Various chip components such as a chip inductor, a chip capacitor and a chip resistor are used as the matching circuits and the negative feedback circuit. A dielectric filter as a chip component, a surface acoustic wave filter (SAW filter) or the like is used as the filter.

(2): Integrate the first output matching circuit PC101 or the second output matching circuit PC201 into the first switch-integrated power amplifier SWPA1 and mold them with a resin.

(3): Integrate the third GaAs MESFET PA103 and the first single-pole-dual-throw switch SW1 on a GaAs substrate (thereby forming a second switch-integrated power amplifier SWPA2), integrate the first output matching circuit PC101 or the second output matching circuit PC201 thereto and then mold them with a resin. It is noted that the negative feedback circuit 101 of the third GaAs MESFET PA103 may be formed as an integrated circuit component or an external circuit component.

(4): Integrate the components of the first power amplifier PA1 with at least one of the first output matching circuit PC101 and the second output matching circuit PC201 on a GaAs substrate and then mold them with a resin.

(5): Form multiple chips including a chip formed by integrating the third GaAs MESFET PA103 and the first single-pole-dual-throw switch SW1 on a GaAs substrate (the second switch-integrated power amplifier SWPA2) and a chip formed by integrating the first and the second GaAs MESFETs PA101 and PA102 with the first and the second inter-stage matching circuits PA104 and PA105 on a GaAs substrate (the first integrated power amplifier MMPA1). Mounting is performed by introducing the multiple chips into a package or connecting the multiple chips onto a printed circuit board in a bare chip manner.

In the descriptions (2) to (5), a chip implemented as an MMIC has been sealed within a resin-molded package or mounted in a bare chip manner, and a matching circuit included within the MMIC includes a combination of a microstrip line, a spiral inductor, an MIM (metal-insulator-metal) capacitor, a comb capacitor, a thin-film resistance (such as NiCr) and the like on a GaAs substrate. On the other hand, the components not included within the MMIC are individually mounted on a printed circuit board.

It is noted that an MMIC implementation includes implementing the first power amplifier PA1 as an MMIC and selectively implementing the components of the power amplifier (active elements, passive circuits and the like) as an MMIC (e.g., implementing all the components of the first power amplifier PA1 other than the output matching circuit thereof as an MMIC).

It is also noted that not only the GaAs MESFETs used as the active elements for the above-described power amplifier but also other active elements such as enhanced GaAs MESFETs and transistors (e.g., MOSFETs, HBTs, HEMTs, etc.) formed on another semiconductor substrate may be used.

Moreover, a portable unit is currently supposed to satisfy the operational requirements about an operating voltage of 3.0 V to 3.4 V corresponding to that of three NiCd cells or a single Li ion cell. Though the operating power supply voltage of the GaAs MESFET of this example is 3.5 V, the operating voltage of any other logic IC may be used. Alternatively, depending upon the type of an information communication unit in question, the power supply voltage may be set at other values. If optimum active elements operating within the defined voltage range are used, the present example may be implemented at an operating voltage other than 3.5 V.

Furthermore, in this example, a negative voltage generated by a DC-DC converter is used as the gate voltage of the GaAs MESFET. The present example may also be implemented by selecting active elements operating by a single positive power supply so as to eliminate a negative power supply.

In this example, matching circuits used as passive circuit components of a power amplifier have been particularly described. Applicable matching circuits are not limited to passive components having a matching function, but include various kinds of passive circuits such as a choke inductor on a power supply line, a bypass capacitor, divided resistances for applying a bias, a filter, a harmonic trap circuit and an attenuator. For example, a choke inductor on a power supply line, a bypass capacitor and divided resistances for applying a bias may be included within a power amplifier implemented as an MMIC. As for a filter, if the transmission frequency and the reception frequency of an RF signal are different from each other, a band-pass filter having a predetermined pass band width may be inserted subsequent to an output matching circuit or a harmonic trap circuit may be inserted into the output matching circuit.

In this example, RF signals corresponding to two types are transmitted by using a single-pole-dual-throw switch. However, a desired power amplifier and a desired information communication unit may be formed even by the use of a single-pole-multi-throw switch having multiple (three or more) throw terminals, a multi-pole-dual-throw switch having multiple (two or more) pole terminals or a multi-pole-multi-throw switch collectively as the selecting switch.

The power amplifier of this example can be implemented not only under the above-described specifications but also under the following specifications.

|  | f |  | Pout |  | Communication type |
|---|---|---|---|---|---|
| Mode 1 | f1 | 900 MHz | Pout1 | 31 dBm | Analog Modulation |
| Mode 2 | f2 | 1.5 GHz | Pout2 | 31 dBm | Digital Modulation |

Mode 1: FM modulation type
Mode 2: π/4 shift DQPSK modulation type

In the analog FM modulation type in Mode 1, a nonlinear saturation power amplifier may also be used as a power amplifier and matching is performed with respect to the first output matching circuit PC101 such that a high power added efficiency and a high harmonics suppression ratio are obtained at the defined output power of 31 dBm. On the other hand, matching is performed with respect to the second output matching circuit PC201 such that an adjacent channel leakage power is suppressed to minimal levels and a high power added efficiency can be attained at the defined output power of 22 dBm.

Though this example uses the specifications in which the output powers are equal, the present example is also applicable to a case where the defined output powers are different in Modes 1 and 2 shown in the following table by providing a gain control function such as those shown in FIGS. 5 and 6 in the first example.

|  | f |  | Pout |  | Communication type |
|---|---|---|---|---|---|
| Mode 1 | f1 | 900 MHz | Pout1 | 31 dBm | Analog Modulation |
| Mode 2 | f2 | 2.4 GHz | Pout2 | 26 dBm | Digital Modulation |

Figure 34:
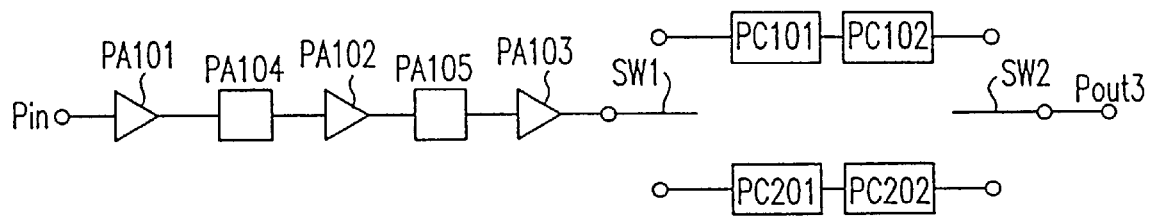
FIG. 34 is a configuration diagram in which a second single-pole-dual-throw switch SW2 is connected to the respective output terminals of a first passive circuit PC1 and a second passive circuit PC2 connected to the dual-throw terminals of a first single-pole-dual-throw switch SW1 in the power amplifier shown in FIG. 31.
Figure 35:
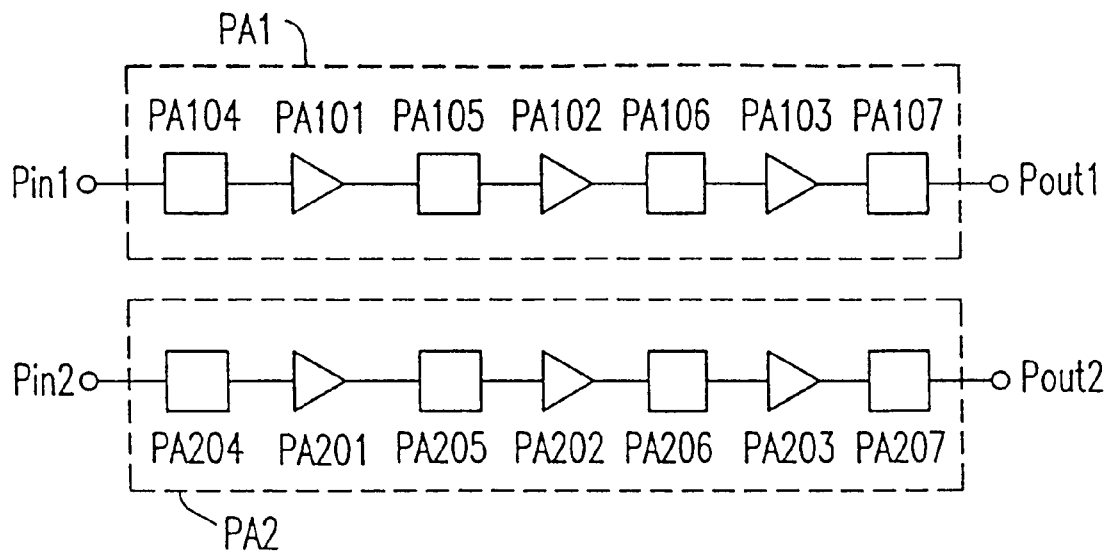
FIG. 35 is a block diagram of a conventional example.
Figure 36:
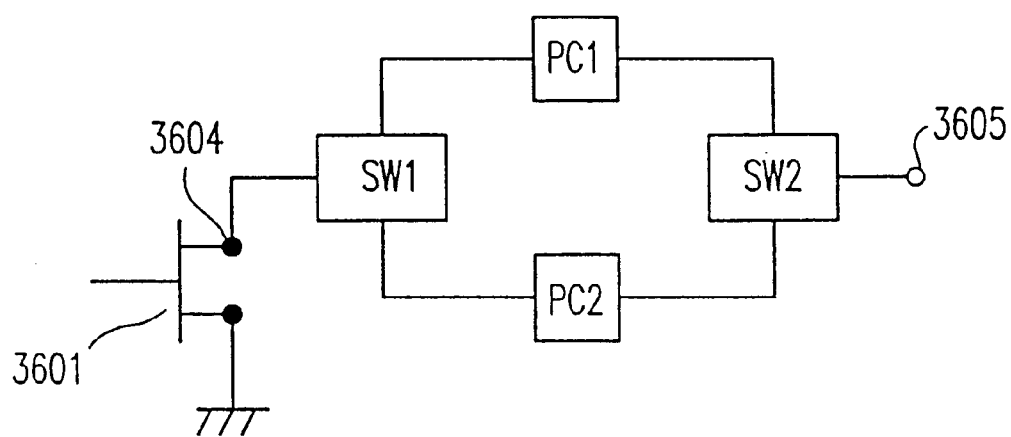
FIG. 36 is a simplified circuit diagram of a radio frequency (RF) integrated circuit described in Japanese Laid-Open Patent Publication No. 8-88524.
Figure 37:
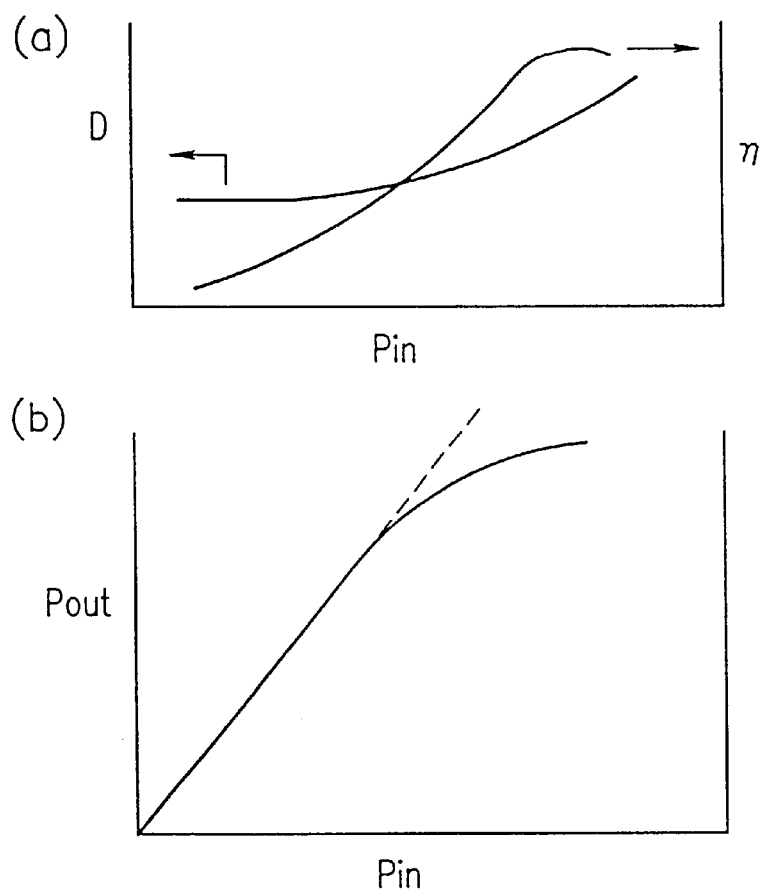
FIGS. 37a and b show a graph showing the variations in distortion and power added efficiency with respect to an input power and a graph showing the variation in output power with respect to the input power in the circuit shown in FIG. 36.
Figure 38:
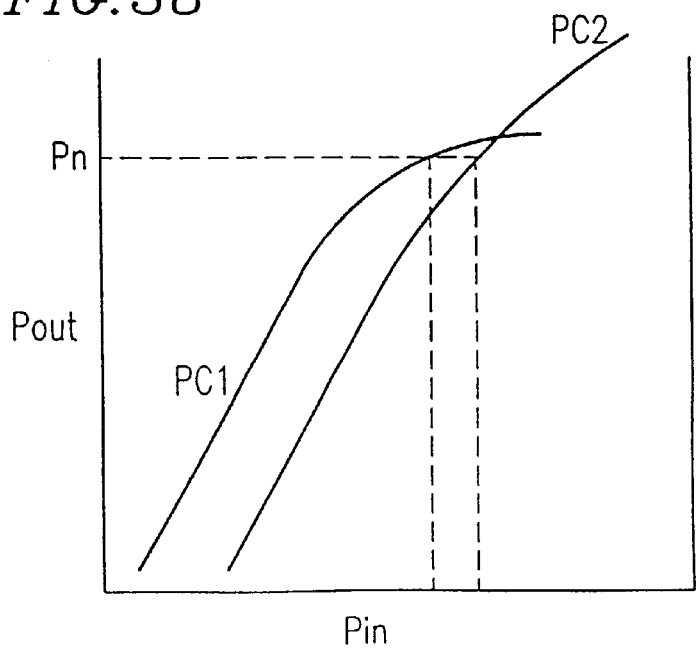
FIG. 38 is a graph showing the input power dependences of the output matching circuits PC1 and PC2.

Mode 1: π/4 shift DQPSK modulation type
Mode 2: spread spectrum (SS) QPSK modulation type FIG. 34 is a configuration diagram in which a second single-pole-dual-throw switch SW2 is connected to the respective output terminals of the first passive circuit PC1 and the second passive circuit PC2 connected to the dual-throw terminals of the first single-pole-dual-throw switch SW1 in the power amplifier shown in FIG. 31. By switching the second single-pole-dual-throw switch SW2 in synchronization with the first single-pole-dual-throw switch SW1, two types of RF signals can be transmitted. That is to say, the connection to an antenna is realized either under the configuration shown in FIG. 21 in which the outputs of the first passive circuit PC1 and the second passive circuit PC2 connected to the dual-throw terminals of the first single-pole-dual-throw switch SW1 reach respective antennas via an antenna duplexer or a switch or under the configuration shown in FIG. 34 in which the outputs reach a single antenna via an antenna duplexer, a switch or the like. In this example, other components such as a filter may be interposed into the path extending to the antenna.

It is noted that the configuration shown in FIG. 34 is similarly applicable to the first to the fifth examples, too.

Figure 39:
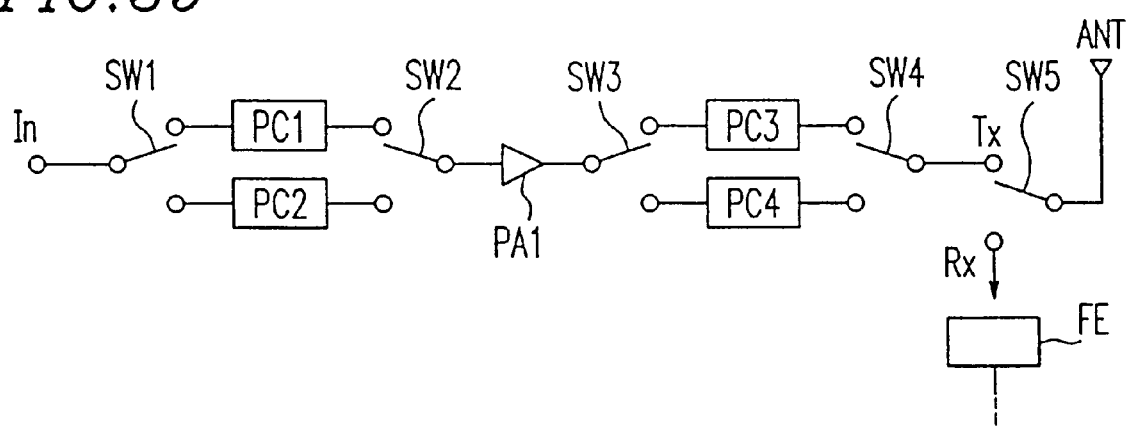
FIG. 39 is a block diagram of a power amplifier and a communication unit according to the present invention.

Furthermore, some of the configurations described in the first to the sixth examples may be combined. FIG. 39 is a block diagram of a power amplifier and a communication unit according to the present invention. An RF signal input through an input terminal In is selectively input to one of the input matching circuits PC1 and PC2 via a switch SW1. Either the output of PC1 or the output of PC2 is selected by a switch SW2 and input to an amplifier PA1. The output of PA1 is selectively input to one of the output matching circuits PC3 and PC4 via a switch SW3. Either the output of PC3 or the output of PC4 is selected by a switch SW4 and then supplied to the terminal TX of a switch SW5. At the time of transmission, the switch SW5 connects the terminal TX to an antenna ANT. On the other hand, at the time of reception, the switch SW5 connects a terminal RX to the antenna ANT and an input signal received through the antenna ANT is supplied to a front-end circuit FE via the switch SW5.

For example, if the switch SW5, the antenna ANT and the front-end circuit FE are omitted from the communication unit shown in FIG. 39, a switchable power amplifier may also be implemented.

INDUSTRIAL APPLICABILITY

As is apparent from the foregoing description, according to the present invention, two amplifiers for amplifying signals having different frequency bands are switched by a single-pole-dual-throw switch. As a result, a power amplifier and a communication unit which can amplify RF signals having different frequency bands can be provided.

In addition, according to the present invention, two amplifiers for amplifying signals having different output powers are switched by a single-pole-dual-throw switch. As a result, a power amplifier and a communication unit which can amplify RF signals having different output powers can be provided.

Moreover, according to the present invention, by switching a passive circuit and an amplifier instead of the two amplifiers or by combining some of the above-described configurations, a power amplifier and a communication unit which can amplify RF signals having different frequencies and/or different output powers can be provided.

Furthermore, according to the present invention, by providing a switch for switching transmission and reception for the output terminal of a power amplifier, a communication unit which can receive rf signals having frequencies can be provided.

What is claimed is:

1. A power amplifier comprising:
    a first amplifier;
    a first switch having a single-pole node and two or more multi-throw nodes, the single-pole node being connected to an output side of the first amplifier,
    a second amplifier which is connected to at least one of the multi-throw nodes of the first switch; and
    an output matching circuit which is connected to at least another multi-throw node of the first switch,
    wherein the second amplifier receives and outputs a signal having a first frequency and the output matching circuit receives and outputs a signal having a second frequency, the first frequency and the second frequency being different from each other.

2. A power amplifier according to claim 1, further comprising a second switch having a single-pole node and two or more multi-throw nodes,
    wherein an output side of the second amplifier is connected to one of the multi-throw nodes of the second switch and an output side of the output matching circuit is connected to another multi-throw node of the second switch.

3. A power amplifier according to claim 1, wherein the second amplifier is comprised of discrete components.

4. A power amplifier according to claim 1, wherein a 3 dB band width of the first amplifier includes a range from about 800 MHz to about 2.5 GHz.

5. A power amplifier according to claim 1, wherein gain characteristics of the first amplifier include at least two peaks.

6. A power amplifier according to claim 5, wherein, a first band which is a frequency range corresponding to a range from a first gain at a first peak of the gain characteristics of the first amplifier to −3 dB of the first gain, includes 1.5 GHz and, a second band which is a frequency range corresponding to a range from a second gain at a second peak of the gain characteristics of the first amplifier to −3 dB of the second gain, includes 1.9 GHz.

7. A power amplifier according to claim 5, wherein, a first band which is a frequency range corresponding to a range from a first gain at a first peak of the gain characteristics of the first amplifier to −3 dB of the first gain, includes 900 MHz and, a second band which is a frequency range corresponding to a range from a second gain at a second peak of the gain characteristics of the first amplifier to −3 dB of the second gain, includes 1.9 GHz.

8. A power amplifier according to claim 1, wherein the first switch and the first amplifier are formed on one and the same semiconductor substrate.

9. A power amplifier according to claim 8, wherein the output matching circuit is formed on the semiconductor substrate.

10. A power amplifier according to claim 1, further comprising a power supply controller for controlling a power to be supplied to the second amplifier in response to switching of the first switch.

11. A power amplifier according to claim 1, wherein the second amplifier receives, amplifies and then outputs an analog signal and the output matching circuit receives and outputs a digital signal.

12. A power amplifier according to claim 1, wherein the second amplifier receives and outputs a first digital signal and the output matching circuit receives and outputs a second digital signal.

13. A power amplifier according to claim 1, wherein the first frequency is higher than the second frequency.

14. A power amplifier according to claim 1, wherein the second amplifier outputs a signal having a first output power, the output matching circuit outputs a signal having a second output power and a ratio of the first output power to the second output power is equal to larger than 5.

15. A power amplifier comprising:
    a first amplifier;
    a first switch having a single-pole node and two or more multi-throw nodes, the single-pole node being connected to an output side of the first amplifier;
    a second amplifier which is connected to at least one of the multi-throw nodes of the first switch; and
    a third amplifier which is connected to at least another multi-throw node of the first switch,
    wherein the second amplifier receives and outputs a signal having a first frequency and the third amplifier receives and outputs a signal having a second frequency, the first frequency and the second frequency being different from each other.

16. A power amplifier according to claim 15, further comprising a second switch having a single-pole node and two or more multi-throw nodes,
    wherein an output side of the second amplifier is connected to one of the multi-throw nodes of the second switch and an output side of the third amplifier is connected to another multi-throw node of the second switch.

17. A power amplifier according to claim 15, wherein the second amplifier and the third amplifier are comprised of discrete components.

18. A power amplifier according to claim 15, wherein a 3 dB band width of the first amplifier includes a range from about 800 MHz to about 2.5 GHz.

19. A power amplifier according to claim 15, wherein gain characteristics of the first amplifier include at least two peaks.

20. A power amplifier according to claim 19, wherein, a first band which is a frequency range corresponding to a range from a first gain at a first peak of the gain characteristics of the first amplifier to −3 dB of the first gain, includes 1.5 GHz and, a second band which is a frequency range corresponding to a range from a second gain at a second peak of the gain characteristics of the first amplifier to −3 dB of the second gain, includes 1.9 GHz.

21. A power amplifier according to claim 19, wherein, a first band which is a frequency range corresponding to a range from a first gain at a first peak of the gain characteristics of the first amplifier to −3 dB of the first gain, includes 900 MHz and, a second band which is a frequency range corresponding to a range from a second gain at a second peak of the gain characteristics of the first amplifier to −3 dB of the second gain, includes 1.9 GHz.

22. A power amplifier according to claim 15, wherein at least two of the first switch, the second switch, the first amplifier, the second amplifier and the third amplifier are formed on one and the same semiconductor substrate.

23. A power amplifier according to claim 22, wherein the third amplifier is formed on the semiconductor substrate.

24. A power amplifier according to claim 15, further comprising a power supply controller for controlling a power to be supplied to at least one of the second amplifier and the third amplifier in response to switching of the first switch.

25. A power amplifier according to claim 15, wherein the second amplifier receives, amplifies and then outputs an analog signal and the third amplifier receives, amplifies and then outputs a digital signal.

26. A power amplifier according to claim 15, wherein the second amplifier receives and outputs a first digital signal and the third amplifier receives and outputs a second digital signal.

27. A power amplifier according to claim 15, wherein the first frequency is higher than the second frequency.

28. A power amplifier according to claim 15, wherein the second amplifier outputs a signal having a first output power, the third amplifier outputs a signal having a second output power and a ratio of the first output power to the second output power is equal to larger than 5.

29. A power amplifier comprising:
   an amplifier;
   a first switch having a single-pole node and two or more multi-throw nodes, the single-pole node being connected to an output side of the amplifier; and
   a first output matching circuit which is connected to at least one of the multi-throw nodes of the first switch; and
   a second output matching circuit which is connected to at least another multi-throw node of the first switch,
   wherein the first output matching circuit receives and outputs a signal having a first frequency and the second output matching circuit receives and outputs a signal having a second frequency, the first frequency and the second frequency being different from each other.

30. A power amplifier according to claim 29, further comprising a second switch having a single-pole node and two or more multi-throw nodes,
   wherein an output side of the first output matching circuit is connected to one of the multi-throw nodes of the second switch and an output side of the second output matching circuit is connected to another multi-throw node of the second switch.

31. A power amplifier according to claim 29, wherein the amplifier is comprised of discrete components.

32. A power amplifier according to claim 29, wherein a 3 dB band width of the amplifier includes a range from about 800 MHz to about 2.5 GHz.

33. A power amplifier according to claim 29, wherein gain characteristics of the amplifier include at least two peaks.

34. A power amplifier according to claim 33, wherein, a first band which is a frequency range corresponding to a range from a first gain at a first peak of the gain characteristics of the amplifier to −3 dB of the first gain, includes 1.5 GHz and, a second band which is a frequency range corresponding to a range from a second gain at a second peak of the gain characteristics of the amplifier to −3 dB of the second gain, includes 1.9 GHz.

35. A power amplifier according to claim 33, wherein, a first band which is a frequency range corresponding to a range from a first gain at a first peak of the gain characteristics of the amplifier to −3 dB of the first gain, includes 900 MHz and, a second band which is a frequency range corresponding to a range from a second gain at a second peak of the gain characteristics of the amplifier to −3 dB of the second gain, includes 1.9 GHz.

36. A power amplifier according to claim 29, wherein the first switch and the amplifier are formed on one and the same semiconductor substrate.

37. A power amplifier according to claim 36, wherein at least one of the first output matching circuit and the second output matching circuit is formed on the semiconductor substrate.

38. A power amplifier according to claim 29, wherein the first output matching circuit receives and outputs an analog signal and the second output matching circuit receives and outputs a digital signal.

39. A power amplifier according to claim 29, wherein the first output matching circuit receives and outputs a first digital signal and the second output matching circuit receives and outputs a second digital signal.

40. A power amplifier according to claim 29, wherein the first frequency is higher than the second frequency.

41. A power amplifier according to claim 29, further comprising:
   a third output matching circuit having an input node and an output node;
   a fourth output matching circuit having an input node and an output node;
   a second switch having a single-pole node and two or more multi-throw nodes; and
   a third switch having a single-pole node and two or more multi-throw nodes,
   wherein at least one of the multi-throw nodes of the second switch is connected to the input node of the third output matching circuit and at least another multi-throw node of the second switch is connected to the input node of the fourth output matching circuit,
   and wherein one of the multi-throw nodes of the third switch is connected to the output node of the third output matching circuit and another multi-throw node of the third switch is connected to the output node of the fourth output matching circuit.

42. A power amplifier according to claim 41, further comprising a fourth switch having a single-pole node and two or more multi-throw nodes,
   wherein at least one of the multi-throw nodes of the fourth switch is connected to the output node of the first output matching circuit and at least another multi-throw node of the fourth switch is connected to the output node of the second output matching circuit.

43. A power amplifier comprising:

a first amplifier;

a first switch having a single-pole node and two or more multi-throw nodes, the single-pole node being connected to an output side of the first amplifier, a second amplifier which is connected to at least one of the multi-throw nodes of the first switch;

an output matching circuit which is connected to at least another multi-throw node of the first switch;

a second switch having a single-pole node and two or more multi-throw nodes, wherein an output side of the second amplifier is connected to one of the multi-throw nodes of the second switch and an output side of the output matching circuit is connected to another multi-throw node of the second switch; and a power supply controller for controlling a power to be supplied to the second amplifier in response to switching of the first switch.

44. A power amplifier comprising:

a first amplifier;

a first switch having a single-pole node and two or more multi-throw nodes, the single-pole node being connected to an output side of the first amplifier;

a second amplifier which is connected to at least one of the multi-throw nodes of the first switch;

a third amplifier which is connected to at least another multi-throw node of the first switch;

a second switch having a single-pole node and two or more multi-throw nodes, wherein an output side of the second amplifier is connected to one of the multi-throw nodes of the second switch and an output side of the third amplifier is connected to another multi-throw node of the second switch; and a power supply controller for controlling a power to be supplied to at least one of the second amplifier and the third amplifier in response to switching of the first switch.

* * * * *